US012100454B2

(12) United States Patent
Fujiki et al.

(10) Patent No.: US 12,100,454 B2
(45) Date of Patent: Sep. 24, 2024

(54) MEMORY DEVICE INCLUDING IN-TIER DRIVER CIRCUIT

(71) Applicant: Micron Technology, Inc., Boise, ID (US)

(72) Inventors: Jun Fujiki, Tokyo (JP); Yoshiaki Fukuzumi, Yokohama (JP); Akira Goda, Setagaya (JP)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 17/734,623

(22) Filed: May 2, 2022

(65) Prior Publication Data

US 2023/0352091 A1 Nov. 2, 2023

(51) Int. Cl.

| | |
|---|---|
| ***G11C 16/08*** | (2006.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.

CPC .......... *G11C 16/08* (2013.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search

CPC .... G11C 16/08; G11C 16/0483; H10B 41/10; H10B 41/27; H10B 41/35; H10B 43/10; H10B 43/27; H10B 43/35

See application file for complete search history.

(56) References Cited

U.S. PATENT DOCUMENTS

| | | | | |
|---|---|---|---|---|
| 11,145,371 | B2 * | 10/2021 | Bushnaq | H10B 43/27 |
| 2019/0198109 | A1 * | 6/2019 | Li | H10B 41/60 |
| 2019/0295653 | A1 * | 9/2019 | Yip | H10B 43/40 |

* cited by examiner

*Primary Examiner* — Mohammed A Bashar
(74) *Attorney, Agent, or Firm* — Schwegman Lundberg & Woessner, P.A.

(57) ABSTRACT

Some embodiments include apparatuses and methods of forming the apparatuses. One of the apparatuses includes tiers located one over another, each of the tiers including memory cells and a control gate for the memory cells, each of the tiers including first transistors connected in series between the control gate in a respective tier and a conductive line, and second transistors connected in series between the control gate in the respective tier and the conductive line, the second transistors connected in parallel with the first transistors between the control gate and the conductive line, conductive joints coupled to channel regions of the first and second transistors, and gates for the first transistors and second transistors, each of the gates shared by one of the first transistors and one of the second transistors.

35 Claims, 43 Drawing Sheets

100

200

| | $G_5$ | $G_4$ | $G_3$ | $G_2$ | $G_1$ |
|---|---|---|---|---|---|
| SELECTED BLOCK | $V1_5$ | $V1_4$ | $V1_3$ | $V1_2$ | $V1_1$ |
| UNSELECTED BLOCK | $V2_5$ | $V2_4$ | $V2_3$ | $V2_2$ | $V2_1$ |

15B
366
($WL_1$)
364
($WL_0$)
$340_1$
$340_0$
SUBSTRATE 399
421
422

2500

| | $G_{5A}$ | $G_{4A}$ | $G_{3A}$ | $G_{2A}$ | $G_{1A}$ | $G_{5B}$ | $G_{4B}$ | $G_{3B}$ | $G_{2B}$ | $G_{1B}$ |
|---|---|---|---|---|---|---|---|---|---|---|
| SELECTED BLOCK | $V3_{5A}$ | $V3_{4A}$ | $V3_{3A}$ | $V3_{2A}$ | $V3_{1A}$ | $V3_{5B}$ | $V3_{4B}$ | $V3_{3B}$ | $V3_{2B}$ | $V3_{1B}$ |
| UNSELECTED BLOCK | $V4_{5A}$ | $V4_{4A}$ | $V4_{3A}$ | $V4_{2A}$ | $V4_{1A}$ | $V4_{5B}$ | $V4_{4B}$ | $V4_{3B}$ | $V4_{2B}$ | $V4_{1B}$ |

FIG. 26

| | $G_{4A}$ | $G_{3A}$ | $G_{2A}$ | $G_{1A}$ | $G_{4B}$ | $G_{3B}$ | $G_{2B}$ | $G_{1B}$ | $G_{4C}$ | $G_{3C}$ | $G_{2C}$ | $G_{1C}$ |
|---|---|---|---|---|---|---|---|---|---|---|---|---|
| SELECTED BLOCK | $V5_{4A}$ | $V5_{3A}$ | $V5_{2A}$ | $V5_{1A}$ | $V5_{4B}$ | $V5_{3B}$ | $V5_{2B}$ | $V5_{1B}$ | $V5_{4C}$ | $V5_{3C}$ | $V5_{2C}$ | $V5_{1C}$ |
| UNSELECTED BLOCK | $V6_{4A}$ | $V6_{3A}$ | $V6_{2A}$ | $V6_{1A}$ | $V6_{4B}$ | $V6_{3B}$ | $V6_{2B}$ | $V6_{1B}$ | $V6_{4C}$ | $V6_{3C}$ | $V6_{2C}$ | $V6_{1C}$ |

FIG. 27

MEMORY DEVICE INCLUDING IN-TIER DRIVER CIRCUIT

FIELD

Embodiments described herein relate to memory devices including driver circuits for word lines.

BACKGROUND

Most memory devices have memory cells, control gates to access the memory cells, and a driver circuit having transistors to drive (e.g., apply voltages to) the control gates. In some memory devices (e.g., 3-D NAND memory devices), the memory cells and the control gates are located on tiers that are stacked one over another over a silicon substrate of the memory device. Such transistors in most of these memory devices are located in the substrate. Some of these memory devices have a structure separate from the substrate for the transistors of the driver circuit. However, as the number of tiers increase to achieve a higher memory cell density, such a structure can be a limiting factor in memory array efficiency. Further, transistors in such a structure are difficult to make scalable due to their poor conductivity and cutoff performance; therefore, forming a driver circuit to accommodate the tier increase can pose a challenge.

BRIEF DESCRIPTION OF THE DRAWINGS

FIG. 2F shows example voltages provided to signals on respective gates of the driver circuit of FIG. 2A, FIG. 2B, and FIG. 2C, according to some embodiments described herein.

FIG. 26 shows example voltages provided to signals on respective gates of the driver circuit of FIG. 23, according to some embodiments described herein.

FIG. 27 shows example voltages provided to signals on respective gates of the driver circuit of FIG. 24, according to some embodiments described herein.

DETAILED DESCRIPTION

The techniques described herein relate to a memory device that includes a driver circuit having transistors embedded in (formed in) tiers of the memory device. Thus, the driver circuit described herein can be called an in-tier driver circuit. The structure of the described driver circuit improves memory array efficiency and the scalability of the transistors, thereby enhancing the tier increase option for the memory device. The described driver circuit includes gates that can be shared by respective transistors from the same tier and transistors from different tiers. Therefore, improvement in wire routing (e.g., reduced wiring) in the described memory device can be achieved. Further, transistors in a tier can be connected in series and in parallel between a respective control gate and a respective access line (e.g., global word line). This kind of connection can improve (e.g., increase) the drive capability of the described driver circuit. Moreover, the gates of the transistors can be biased with a graded (e.g., unequal voltages) biasing technique. This technique allows uniform distribution of voltages from global word lines to the transistors of the driver circuit. Such a distribution can relax breakdown voltages and leakage current associated with the transistors of the driver circuit. This allows safe operation and improved performance of the driver circuit. Other improvements and benefits of the described processes and memory devices are further discussed below with reference to FIG. 1 through FIG. 28.

Figure 1:
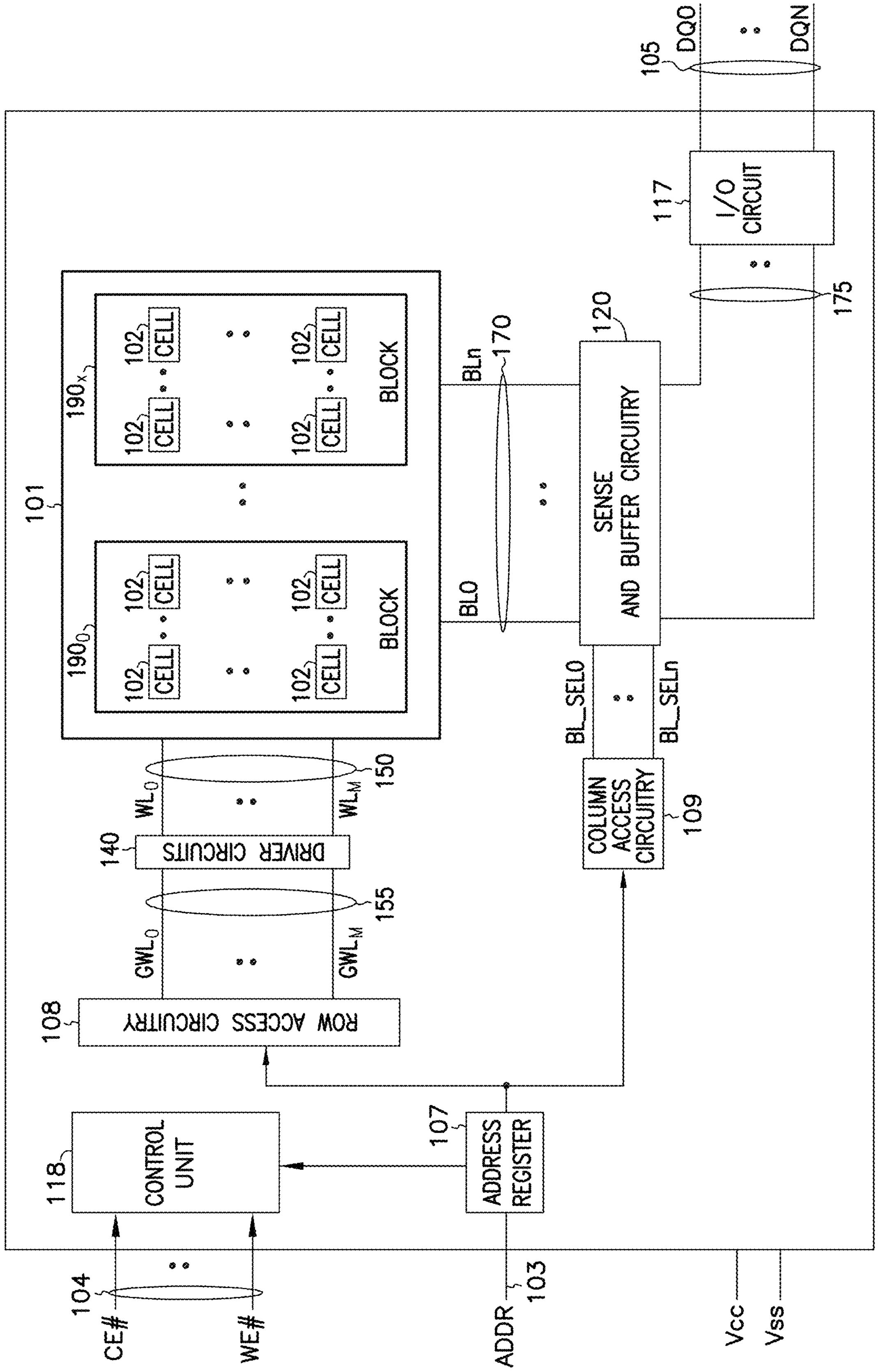
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks $190_0$ through $190_X$ (e.g., there are X+1 blocks in memory device 100). In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines 150 and 155 and data lines 170. Access lines 150 can include local word lines (e.g., control gates in memory array 101) that can carry signals (e.g., word line signals) $WL_0$ through $WL_M$. Access lines 155 can include global word lines that can carry signals (e.g., global word line signals) $GWL_0$ through $GWL_M$. Data lines 170 can include bit lines (e.g., local bit lines). Data lines 170 can carry signals (e.g., bit line signals) BL0 through BLn. Access lines 150 and 155 can form part of conductive paths that provide voltages to selectively access (e.g., activate) memory cells 102 of blocks $\mathbf{190}_0$ through $\mathbf{190}_X$ during a memory operation of memory device 100. Memory device 100 can use data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which blocks $\mathbf{190}_0$ through $\mathbf{190}_X$ are to be accessed during a memory operation.

Memory device 100 can include driver circuits 140, which can be part of row access circuitry 108. Drivers 140 can operate (e.g., operate as switches) to form (or not to form) conductive paths (e.g., current paths) between access lines 150 and respective access lines 155 during operations of memory device 100.

Memory device 100 can perform a read operation to read (e.g., sense) information (e.g., previously stored information) from memory cells 102 of blocks $\mathbf{190}_0$ through $\mathbf{190}_X$, or a write (e.g., programming) operation to store (e.g., program) information in memory cells 102 of blocks $\mathbf{190}_0$ through $\mathbf{190}_X$. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks $\mathbf{190}_0$ through $\mathbf{190}_X$.

Memory device 100 can include a control unit 118 that can be configured to control memory operations of memory device 100 based on control signals on lines 104. Examples of the control signals on lines 104 include one or more clock signals and other signals (e.g., a chip-enable signal CE#, a write-enable signal WE#) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks $\mathbf{190}_0$ through $\mathbf{190}_X$ and provide the value of the information to lines 175, which can include global data lines (e.g., global bit lines). Sense and buffer circuitry 120 can also be configured to use signals on lines 175 to determine the value of information to be stored (e.g., programmed) in memory cells 102 of blocks $\mathbf{190}_0$ through $\mathbf{190}_X$ (e.g., during a write operation) based on the values (e.g., voltage values) of signals on lines 175 (e.g., during a write operation).

Memory device 100 can include input/output (I/O) circuitry 117 to exchange information between memory cells 102 of blocks $\mathbf{190}_0$ through $\mathbf{190}_X$ and lines (e.g., I/O lines) 105. Signals DQ0 through DQN on lines 105 can represent information read from or stored in memory cells 102 of blocks $\mathbf{190}_0$ through $\mathbf{190}_X$. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value “0” or “1” of a single bit. The single bit per cell is sometimes called a single-level cell. In another example, each of memory cells 102 can be programmed to store information representing a value for multiple bits, such as one of four possible values “00”, “01”, “10”, and “11” of two bits, one of eight possible values “000”, “001”, “010”, “011”, “100”, “101”, “110”, and “111” of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random-Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2A through FIG. 27.

Figure 2A:
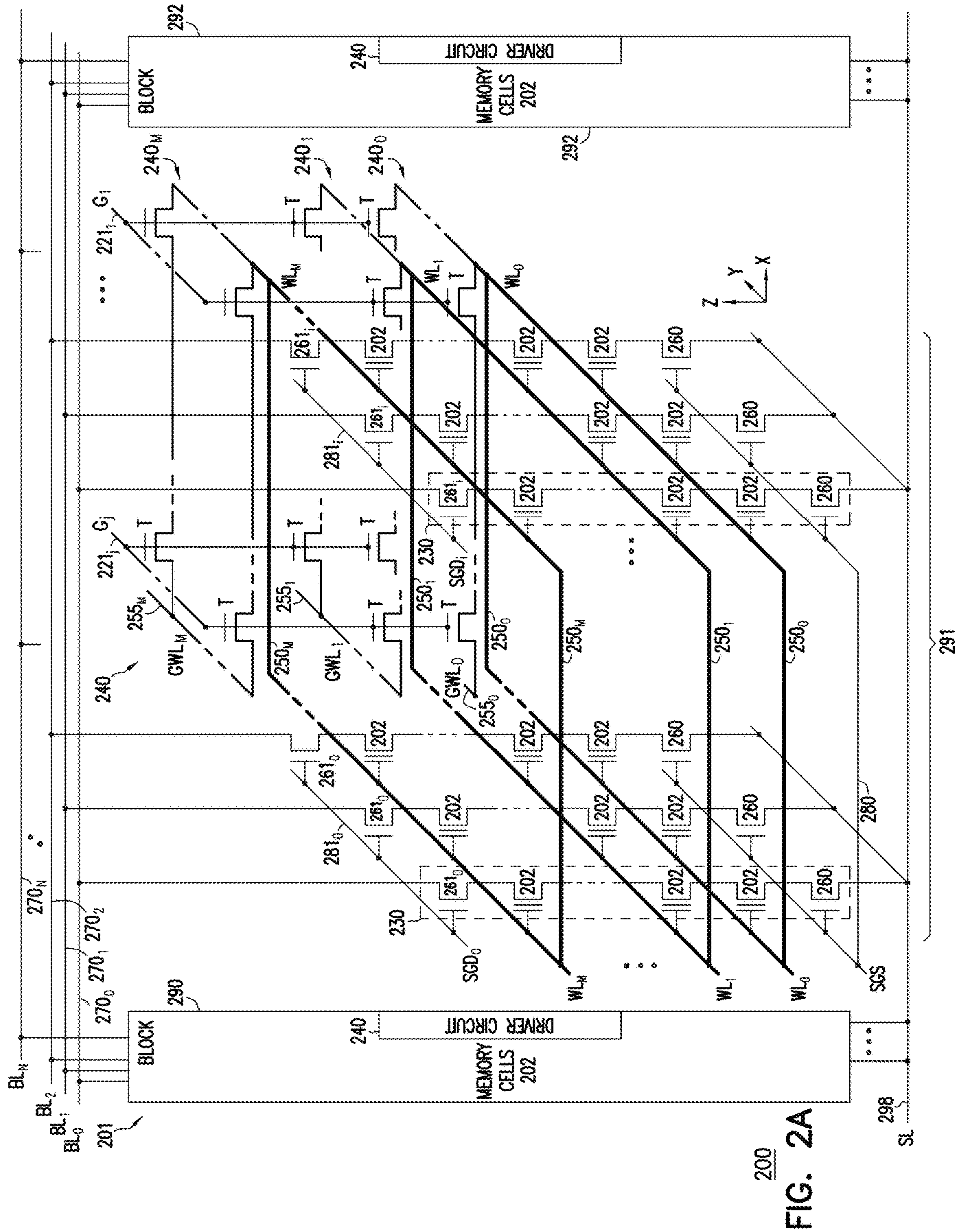
FIG. 2A shows a memory device including a memory array having memory cell blocks, and a driver circuit for each of the blocks, according to some embodiments described herein.

FIG. 2A shows a schematic of a memory device 200 having a memory array 201, blocks (e.g., memory cell blocks) 290, 291, and 292, and a driver circuit 240 for each block, according to some embodiments described herein. For simplicity, only detail for elements of block 291 is shown in FIG. 2A. Blocks 290 and 292 have similar elements as block 291.

Memory device 200 can include a non-volatile (e.g., NAND flash memory device) or other types of memory devices. Memory device 200 can correspond to memory device 100. For example, memory array (or multiple memory arrays) 201 and blocks 290, 291, and 292 can correspond to memory array 101 and blocks $\mathbf{190}_0$ through $\mathbf{190}_X$, respectively, of memory device 100 of FIG. 1.

As shown in FIG. 2A, memory device 200 can include memory cells 202, data lines $\mathbf{270}_0$ through $\mathbf{270}_N$ ($\mathbf{270}_0$-$\mathbf{270}_N$), control gates $\mathbf{250}_0$ through $\mathbf{250}_M$ in block 291, and access lines (e.g., global word lines) $\mathbf{255}_0$-$\mathbf{255}_M$. Data lines $\mathbf{270}_0$-$\mathbf{270}_N$ can correspond to part of data lines 170 of memory device 100 of FIG. 1. In FIG. 2A, label "N" (index N) next to a number (e.g., $\mathbf{270}_N$) represents the number of data lines of memory device 200. For example, if memory device 200 includes 16 data lines, then N is 15 (data lines $\mathbf{270}_0$ through $\mathbf{270}_{15}$). In FIG. 2A, label "M" (index M) next to a number (e.g., $\mathbf{250}_M$) represents the number of control gates of memory device 200. For example, if memory device 200 includes 128 control gates, then M is 127 (control gates $\mathbf{250}_0$ through $\mathbf{250}_{127}$). Memory device 200 can have the same number of control gates (e.g., M−1 control gates) among the blocks (e.g., blocks 290, 291, and 292) of memory device 200.

In FIG. 2A, data lines $\mathbf{270}_0$-$\mathbf{270}_N$ can include (or can be part of) bit lines (e.g., local bit lines) of memory device 200. As shown in FIG. 2A, data lines $\mathbf{270}_0$-$\mathbf{270}_N$ can carry signals (e.g., bit line signals) $BL_0$ through $BL_N$, respectively. In the physical structure of memory device 200, data lines $\mathbf{270}_0$-$\mathbf{270}_N$ can be structured as conductive lines and have respective lengths extending in the Y-direction (e.g., a direction from one memory block to another).

FIG. 2A shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 399 shown in FIG. 3F). The Z-direction is perpendicular to the X-direction and Y-direction (e.g., the Z-direction is perpendicular to an X-Y plane of memory device 200).

As shown in FIG. 2A, memory cells 202 can be organized into separate blocks (memory blocks or blocks of memory cells) such as blocks 290, 291, and 292. FIG. 2A shows memory device 200 including three blocks 290, 291, and 292 as an example. However, memory device 200 can include numerous blocks. The blocks (e.g., blocks 290, 291, and 292) of memory device 200 can share data lines (e.g., data lines $\mathbf{270}_0$-$\mathbf{270}_N$) to carry information (in the form of signals) read from or to be stored in memory cells of selected memory cells (e.g., selected memory cells in block 290, 291, or 292) of memory device 200.

Control gates $\mathbf{250}_0$-$\mathbf{250}_M$ in block 291 can be part of access lines (e.g., local word lines). Control gates $\mathbf{250}_0$-$\mathbf{250}_M$ can be coupled to respective access lines (e.g., global word lines) $\mathbf{255}_0$-255M by driver circuit 240. The access lines (that include control gates $\mathbf{250}_0$-$\mathbf{250}_M$) of memory device 200 can correspond to access lines 150 of memory device 100 of FIG. 1. Access lines (e.g., global word lines) $\mathbf{255}_0$-$\mathbf{255}_M$ of memory device 200 can correspond to access lines 155 of memory device 100 of FIG. 1.

Other blocks (e.g., blocks 290 and 292) of memory device 200 can have control gates similar to (or the same as) control gates $\mathbf{250}_0$-$\mathbf{250}_M$ of block 291. Blocks 290, 291, and 292 can be accessed separately (e.g., accessed one block at a time). For example, block 291 can be accessed at one time using control gates $\mathbf{250}_0$-$\mathbf{250}_M$, and block 290 or 291 can be accessed at another time using control gates in the respective block.

In the physical structure of memory device 200, control gates $\mathbf{250}_0$-$\mathbf{250}_M$, can be formed on different levels (e.g., layers) of memory device 200 in the Z-direction. In this example, the levels (e.g., layers) of control gates $\mathbf{250}_0$-$\mathbf{250}_M$ can be formed (e.g., stacked) one level (one layer of material) over another (another layer of material) in the Z-direction.

As shown in FIG. 2A, memory cells 202 can be included in respective memory cell strings 230. For simplicity, only two memory cell strings 230 are labeled in FIG. 2A. Each of memory cell strings 230 can have series-connected memory cells (e.g., M+1 (e.g., 128) series-connected memory cells) in the Z-direction. In a physical structure of memory device 200, memory cells 202 in each of memory cell strings 230 can be formed (e.g., stacked vertically one over another) in different levels (physical portions) of memory device 200. The levels of memory device 200 can be included in (or can correspond to) respective tiers (stacked one over another in the Z-direction) of memory device 200. In the example of FIG. 2A, memory device 200 can include M+1 tiers (e.g., 128 tiers, where M=127). The number of memory cells in each of memory cell strings 230 can be equal to the number of levels (e.g., the number of tiers). Thus, in the example of FIG. 2A, there can be 128 levels (layers) of memory cells 202 in the Z-direction.

The number of memory cells 202 in each of memory cell strings 230 can also be equal to the number of levels (e.g., the number of tiers) of control gates (e.g., control gates $\mathbf{250}_0$-$\mathbf{250}_M$) of memory device 200. For example, if each memory cell string 230 has 128 (e.g., M=127) memory cells 202, then there are 128 corresponding levels (e.g., 128 tiers) of control gates $\mathbf{250}_0$-$\mathbf{250}_M$ for the 128 memory cells.

As shown in FIG. 2A, control gates $\mathbf{250}_0$-$\mathbf{250}_M$ can carry corresponding signals $WL_0$-$WL_M$. As mentioned above, control gates $\mathbf{250}_0$-$\mathbf{250}_M$ can include (or can be parts of) access lines (e.g., local word lines) of memory device 200. Each of control gates $\mathbf{250}_0$-$\mathbf{250}_M$ can be part of a structure (e.g., a level) of a conductive material (e.g., a layer of conductive material) located in a level of memory device 200. Memory device 200 can use signals $WL_0$-$WL_M$ to selectively control access to memory cells 202 of block 291 during an operation (e.g., read, write, or erase operation). For example, during a read operation, memory device 200 can use signals $WL_0$-$WL_M$ to control access to memory cells 202 of block 291 to read (e.g., sense) information (e.g., previously stored information) from memory cells 202 of block 291. In another example, during a write operation, memory device 200 can use signals $WL_0$-$WL_M$ to control access to memory cells 202 of block 291 to store information in memory cells 202 of block 291.

As shown in FIG. 2A, memory cells in different memory cell strings in block 291 can share (e.g., can be controlled by) the same control gate in block 291. For example, memory cells 202 (of different memory cell strings 230) coupled to control gate $\mathbf{250}_0$ can share (can be controlled by) control gate $\mathbf{250}_0$. In another example, memory cells 202 (of different memory cell strings 230) coupled to control gate $\mathbf{250}_1$ can share (can be controlled by) control gate $\mathbf{250}_1$.

Memory device 200 can include a source (e.g., a source line, a source plate, or a source region) 298 that can carry a signal (e.g., a source line signal) SL. Source 298 can include (e.g., can be formed from) a conductive structure (e.g., conductive region) of memory device 200. The conductive structure of source 298 can include multiple levels (e.g., layers) of conductive materials stacked one over another over a substrate of memory device 200. Source 298 can be common conductive structure (e.g., common source plate or common source region) of block 290, 291, and 292. Source 298 can be coupled to a ground connection (e.g., ground plate) of memory device 200. Alternatively, source 298 can be coupled to a connection (e.g., a conductive region) that is different from a ground connection.

As shown in FIG. 2A, memory device 200 can include select transistors (e.g., drain select transistors) $261_0$ through $261_i$ ($261_0$-$261_i$) and select gates (e.g., drain select gates) $281_0$ through $281_i$ in block 291. Transistors $261_0$ can share the same select gate $281_0$. Transistors $261_i$ can share the same select gate $281_i$. Select gates $281_0$-$281_i$ can carry signals $SGD_0$ through $SGD_i$ ($SGD_0$-$SGD_i$), respectively.

Transistors $261_0$-$261_i$ can be controlled (e.g., turned on or turned off) by signals $SGD_0$-$SGD_i$, respectively. During a memory operation (e.g., a read or write operation) of memory device 200, transistors $261_0$ and transistors $261_i$ can be turned on one group at a time (e.g., either the group of transistors $261_0$ or the group of transistors $261_i$ can be turned on at a particular time). Transistors $261_0$ can be turned on (e.g., by activating signal $SGD_0$) to couple memory cell strings 230 of block 291 to respective data lines $270_0$-$270_N$. Transistors $261_i$ can be turned on (e.g., by activating signal $SGD_i$) to couple memory cell strings 230 of block 291 to respective data lines $270_0$-$270_N$. Transistors $261_0$-$261_i$ can be turned off (e.g., by deactivating signals SGD0-SGDi) to decouple the memory cell strings 230 of block 291 from respective data lines $270_0$-$270_N$.

Memory device 200 can include transistors (e.g., source select transistors) 260 in block 291, each of which can be coupled between source 298 and memory cells 202 in a respective memory cell string (one of memory cell strings 230) of block 291. Memory device 200 can include a select gate (e.g., source select gate) 280. Transistors 260 in block 291 can share select gate 280. Transistors 260 in block 291 can be controlled (e.g., turned on or turned off) by the same signal, such as SGS signal (e.g., source select gate signal) provided on select gate 280. During a memory operation (e.g., a read or write operation) of memory device 200, transistors 260 in block 291 can be turned on (e.g., by activating an SGS signal) to couple the memory cell strings of block 291 to source 298. Transistors 260 in block 291 can be turned off (e.g., by deactivating the SGS signal) to decouple the memory cell strings of block 291 from source 298.

Driver circuits 240 of memory device 200 can correspond to driver circuits 140 of memory device 200 of FIG. 1. As shown in FIG. 2A, driver circuit 240 of block 291 can include transistor groups $240_0$ through $240_M$ ($240_0$-$240_M$). Transistor groups $240_0$-$240_M$ can be called groups of transistors $240_0$-$240_M$. Each of transistor groups $240_0$-$240_M$ include transistors T coupled between a respective global access line and a respective control gate (e.g., local access line) to provide (e.g., to form) a circuit path (e.g., current path) between the respective global access line and the respective control gate. For example, as shown in FIG. 2A, transistor group $240_M$ can include transistors T coupled between access line $255_M$ and control gate $250_M$ (associated with signal $WL_M$). Transistor group $240_1$ can include transistors T coupled between access line $255_1$ and control gate $250_1$ (associated with signal $WL_1$). Transistor group $240_0$ can include transistors T coupled between access line $255_0$ and control gate $250_0$ (associated with signal $WL_0$). Driver circuit 240 can include gates (e.g., driver gate) $221_1$ through $221_j$ associated with signals $G_1$ through $G_j$. Each of gates $221_1$ through $221_j$ can be shared by (e.g., is common to) respective transistors T (in the Y-direction) of the same transistor group. Each of gates $221_1$ through $221_j$ can also be shared by (e.g., is common to) respective transistors (in the Z-direction) among different transistor groups.

In the physical structure of memory device 200, transistor groups $240_0$-$250_M$ can be located on respective tiers (e.g., stacked one over another in the Z-direction) where control gates $250_0$-$250_M$ and memory cells 202 are located. For example, transistor group $240_M$ can be located on the same tier where control gate $250_M$ is located. Transistor group $240_1$ can be located on the same tier where control gate $250_1$ is located. Transistor group $240_0$ can be located on the same tier where control gate $250_0$ is located.

Figure 2B:
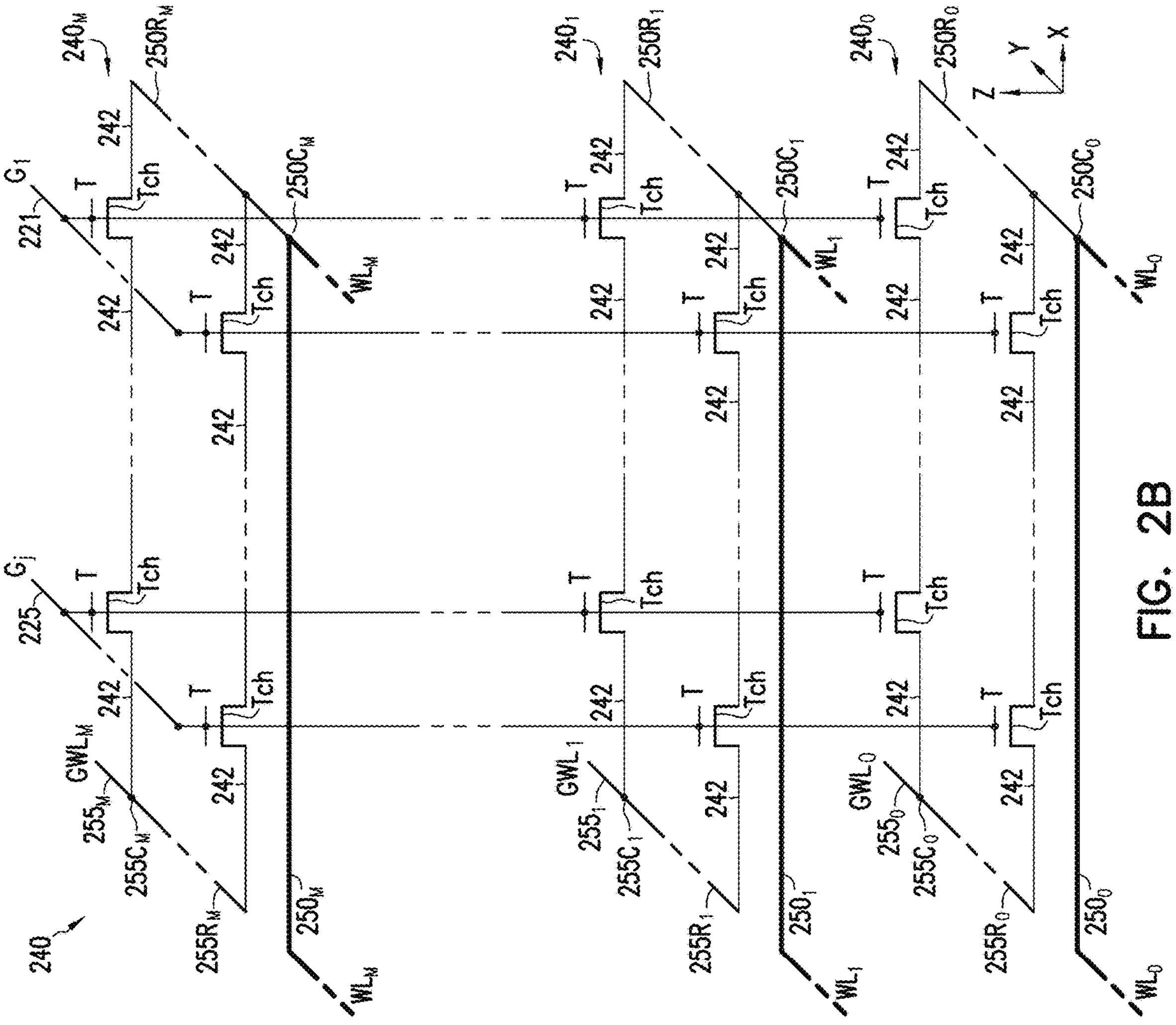
FIG. 2B shows more detail of the driver circuit of the memory device of FIG. 2A, according to some embodiments described herein.

FIG. 2B shows driver circuit 240 of FIG. 2A in more detail, according to some embodiments described herein. As shown in FIG. 2B, transistor group $240_M$ can be coupled to control gate $250_M$ through a conductive region $250R_M$ at a contact location $250C_M$ and to access line $255_M$ through a conductive region $255R_M$ at a contact location $255C_M$. Transistor group $240_1$ can be coupled to control gate $250_1$ through a conductive region $250R_1$ at a contact location $250C_1$ and to access line $255_1$ through a conductive region $255R_1$ at a contact location $255C_1$. Transistor group $240_0$ can be coupled to control gate $250_0$ through a conductive region $250R_0$ and a contact location $250C_0$ and to access line $255_0$ through a conductive region $255R_0$ at a contact location $255C_0$.

As shown in FIG. 2B, each transistor group $240_0$-$240_M$ can have transistors T coupled in series (e.g., in the X-direction) between the conductive regions coupled to a respective control gate and a respective access line. For example, transistors T in the X-direction of transistor groups $240_M$ can be coupled in series with each other in the X-direction between conductive region $250R_M$ and $255R_M$.

Each transistor group $240_0$-$240_M$ can have transistors T coupled in parallel between the conductive region coupled to a respective control gate and the conductive region coupled to a respective access line. For example, series-connected transistors T in the X-direction between conductive regions $250R_M$ and $255R_M$ in transistor groups $240_M$ can be coupled in parallel with other series-connected transistors T in the X-direction between conductive regions $250R_M$ and $255R_M$.

The number of transistors T can be the same from one transistor group to another transistor group. For simplicity, FIG. 2B shows four transistors T in each of transistor groups $240_0$-$240_M$ (e.g., four transistors T in a tier of memory device 200). However, the number of transistors in each transistor group can be different from four. FIG. 2B shows four transistors T in each of transistor groups $240_0$-$240_M$ arranged in a matrix-like pattern (e.g., 2×2 transistors in the X-Y plane). However, the number of transistors in the X-direction can be unequal to the number of transistors in the Y-direction.

As shown in FIG. 2B, each transistor T can include a channel region Tch. Driver circuit 240 can include conductive joints 242 that couple channel region Tch of one transistor to channel region Tch of another transistor. Channel region Tch can operate to carry current during operations of driver circuit 240.

Figure 2C:
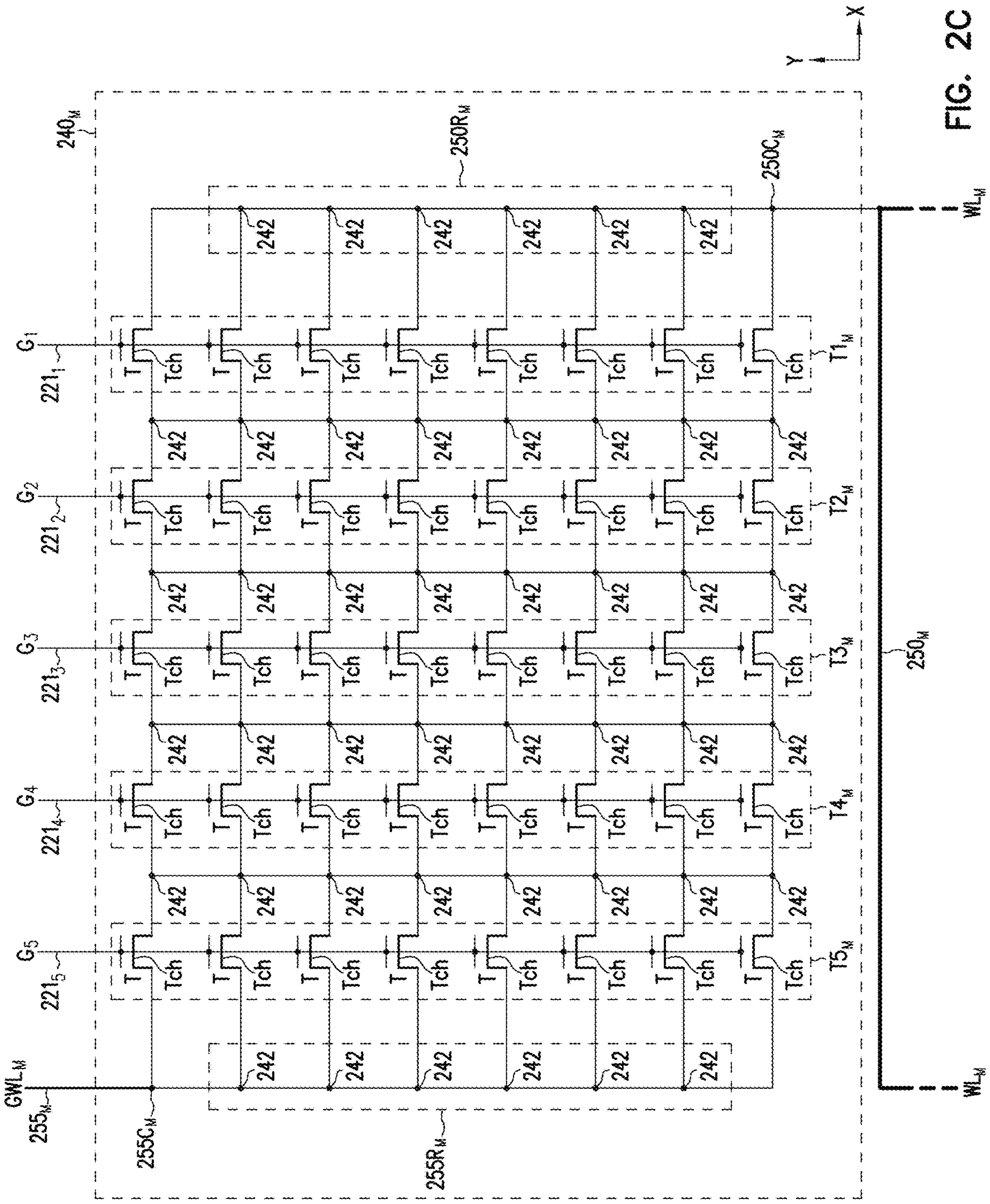
FIG. 2C, FIG. 2D, and FIG. 2E show examples of respective transistor groups in respective tiers of the driver circuit of FIG. 2A and FIG. 2B, according to some embodiments described herein.
Figure 2D:
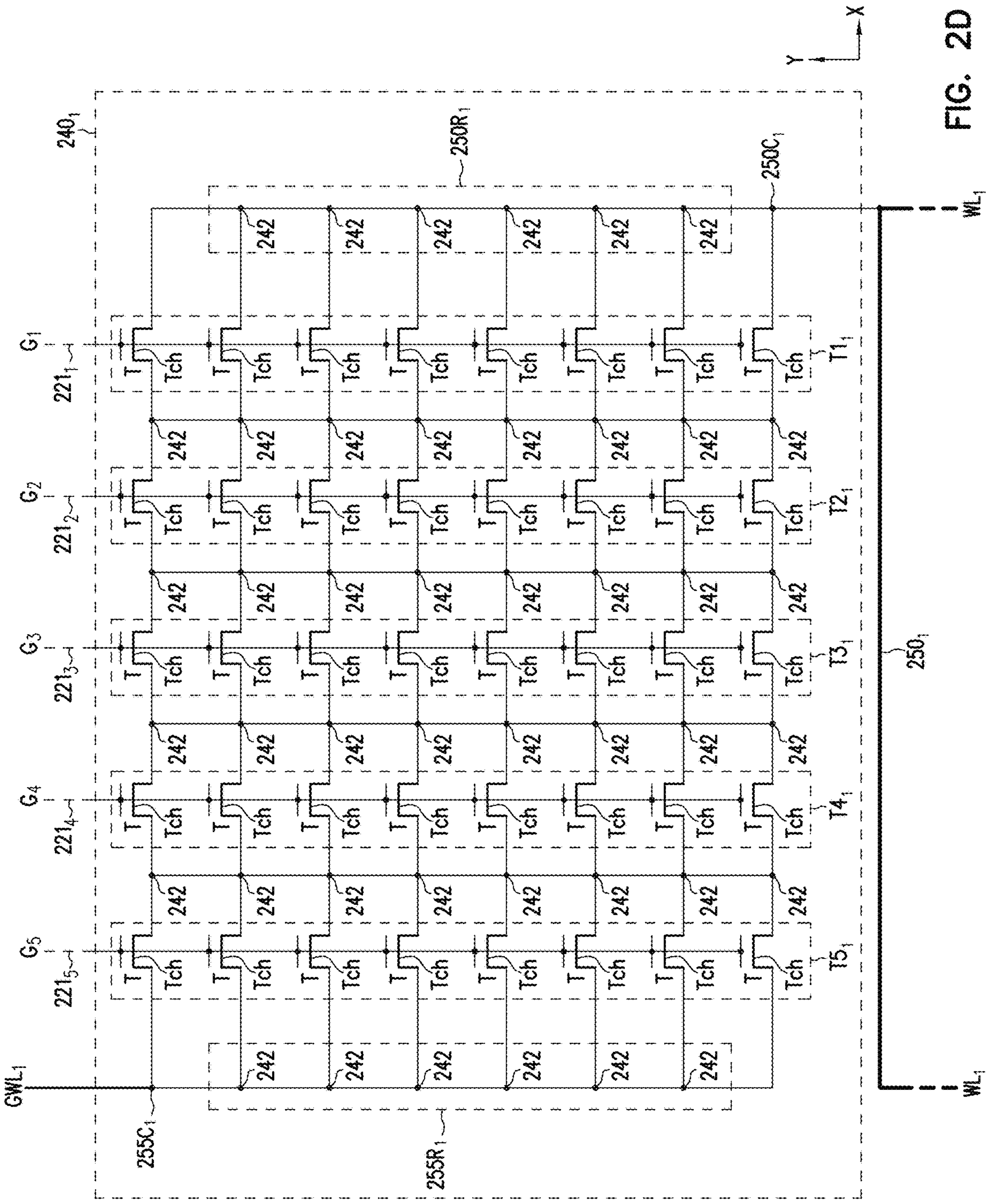
Figure 2E:
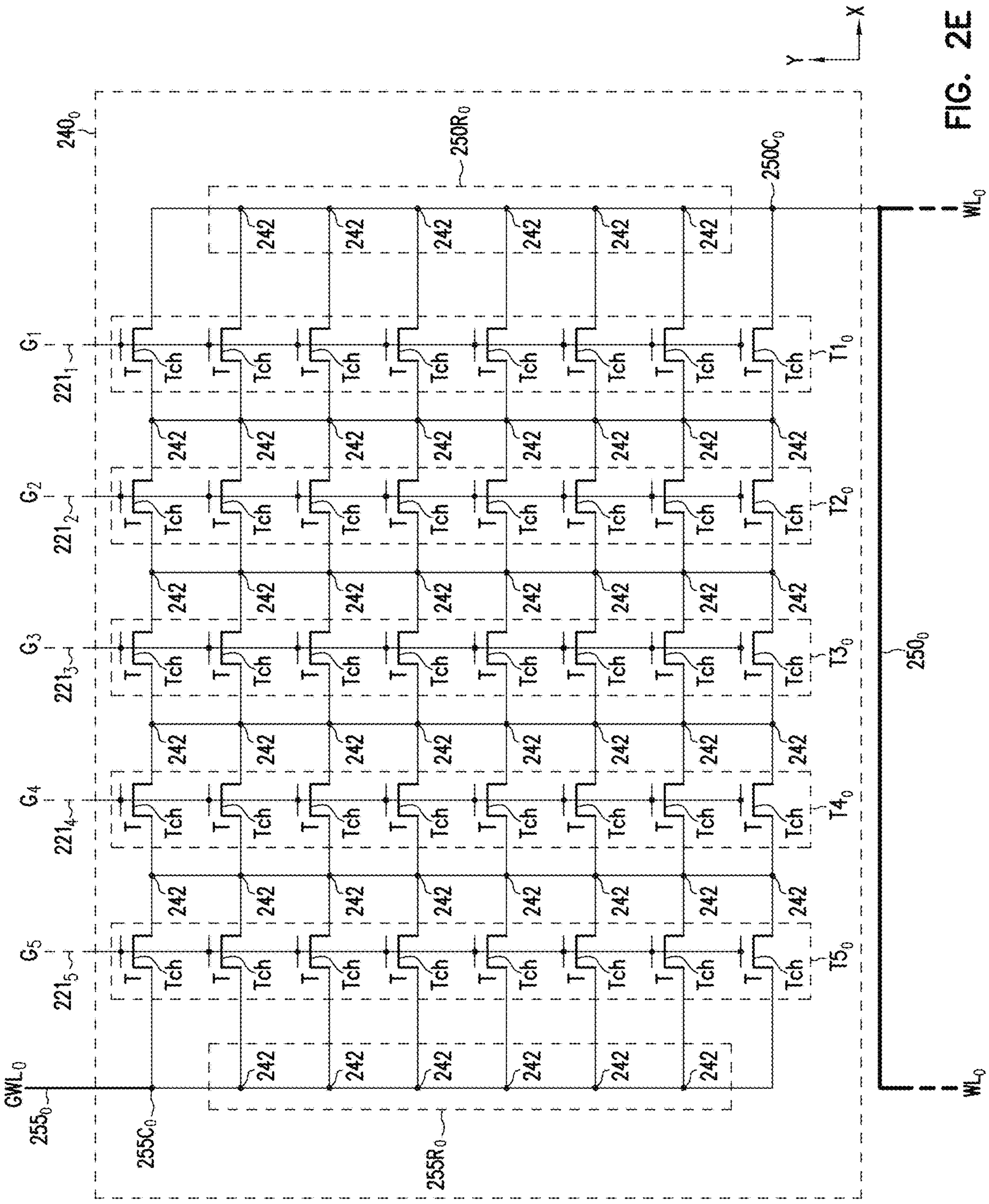

FIG. 2C, FIG. 2D, and FIG. 2E show examples of driver circuit 240 of FIG. 2B where each of transistor groups $240_M$, $240_1$, and $240_0$, respectively, in respective tiers includes 40 transistors arranged in a 5×8 matrix pattern in the X and Y directions, respectively. The following description describes transistor group $240_M$ of FIG. 2C. Other transistor groups (transistor groups $240_1$ in FIG. 2D and transistor group $240_0$ in FIG. 2E) of memory device 200 have similar structures and connections. Thus, for simplicity, transistor groups $240_1$ (FIG. 2D) and transistor group $240_0$ (FIG. 2E) are not described in detail.

As shown in FIG. 2C, transistor group $240_M$ can include five transistor sets $T1_M$, $T2_M$, $T3_M$, $T4_M$, and $T5_M$ and five gates $221_1$, $221_2$, $221_3$, $221_4$, and $221_5$. Transistor sets $T1_M$, $T2_M$, $T3_M$, $T4_M$, and $T5_M$ can be called sub-groups of transistor group $240_M$. Driver circuit 240 can include gates $221_1$, $221_2$, $221_3$, $221_4$, and $221_5$ that can be provided with signals (e.g., voltage signals) $G_1$, $G_2$, $G_3$, $G_4$, and $G_5$, respectively.

Gates $221_1$, $221_2$, $221_3$, $221_4$, and $221_5$ (and similar gates of the driver circuits described herein) can be called driver gates to distinguish them from the control gates (e.g., control gates $250_0$ through $250_M$) for memory cells 202 of memory device 200.

Each of transistor sets $T1_M$, $T2_M$, $T3_M$, $T4_M$, and $T5_M$ can include eight transistors T in the Y-direction. Transistors T in the same transistor set can share (e.g., can be controlled by) the same gate. As shown in FIG. 2C, transistor set $T1_M$ can share gate $221_1$. Transistor sets $T2_M$, $T3_M$, $T4_M$, and $T5_M$ can share gates $221_2$, $221_3$, $221_4$, $221_5$, respectively.

As shown in FIG. 2C, each of conductive region $250R_M$ (coupled to control gate $250_M$) and conductive region $255R_M$ (coupled to access line $255_M$) can include a number of conductive joints 242 that are coupled to each other. Conductive region $250R_M$ is part of conductive path between control gate $250_M$ and transistor sets $T1_M$, $T2_M$, $T3_M$, $T4_M$, and $T5_M$. Conductive region $255R_M$ is part of a conductive path between access line $255_M$ and transistor sets $T1_M$, $T2_M$, $T3_M$, $T4_M$, and $T5_M$. During an operation of memory device 200, current can flow between access line $255_M$ and control gate $250_M$ through conductive region $255R_M$, channel region Tch of respective transistor T of transistor sets $T1_M$, $T2_M$, $T3_M$, $T4_M$, and $T5_M$, and conductive region $250R_M$.

FIG. 2D and FIG. 2E show transistor groups $240_1$ and $240_0$ that include elements similar to that of FIG. 2C. As shown in FIG. 2D, transistor group $240_1$ can include transistor sets $T1_1$, $T2_1$, $T3_1$, $T4_1$, and $T5_1$ coupled to gates $221_1$, $221_2$, $221_3$, $221_4$, and $221_5$, respectively. During an operation of memory device 200, current can flow between access line $255_1$ and control gate $250_1$ through conductive region $255_1$, channel region Tch of respective transistor T of transistor sets $T1_1$, $T2_1$, $T3_1$, $T4_1$, and $T5_1$, and conductive region $250_1$.

As shown in FIG. 2E, transistor group $240_0$ can include transistor sets $T1_1$, $T2_1$, $T3_1$, $T4_1$, and $T5_1$ coupled to gates $221_1$, $221_2$, $221_3$, $221_4$, and $221_5$, respectively. During an operation of memory device 200, current can flow between access line $255_0$ and control gate $250_0$ through conductive region $255_0$, channel region Tch of respective transistor T of transistor sets $T0_0$, $T2_0$, $T3_0$, $T4_0$, and $T5_0$, and conductive region $250_0$.

FIG. 2F shows example voltages that can be provided (e.g., applied) to signals $G_1$, $G_2$, $G_3$, $G_4$, and $G_5$ (FIG. 2C, FIG. 2D, and FIG. 2E) respectively, on gates $221_1$, $221_2$, $221_3$, $221_4$, and $221_5$ (FIG. 2C, FIG. 2D, and FIG. 2E), respectively. As shown in FIG. 2F, different voltages can be applied to signals $G_1$, $G_2$, $G_3$, $G_4$, and $G_5$ for a particular block of memory device depending on whether that particular block is a selected block or an unselected (deselected) block. A selected block is a block (e.g., one of block 290, 291, and 292 of FIG. 2A) that is selected to be accessed during an operation (e.g., read, write, or erase operation) of memory device 200. An unselected block (a deselected block) is a block (e.g., block 290 or block 292 in FIG. 2A) that is not selected to be accessed during an operation (e.g., read, write, or erase operation) of memory device 200 while another block (e.g., block 291 in FIG. 2A) is selected to be accessed during the operation.

As shown in FIG. 2F, voltages $V1_1$, $V1_2$, $V1_3$, $V1_4$, and $V1_5$ can be provided to signals $G_1$, $G_2$, $G_3$, $G_4$, and $G_5$, respectively, associated with a selected block. Voltages $V2_1$, $V2_2$, $V2_3$, $V2_4$, and $V2_5$ can be provided to signals $G_1$, $G_2$, $G_3$, $G_4$, and $G_5$, respectively, associated with an unselected block.

Voltages $V1_1$, $V1_2$, $V1_3$, $V1_4$, and $V1_5$ in FIG. 2F can have values such that the transistors of driver circuit 240 of the selected block can turn on driver circuit 240 to drive control gates $250_0$-$250_M$ (FIG. 2A) based on voltages on corresponding access lines $255_0$-$255_M$. The values of voltages $V1_1$, $V1_2$, $V1_3$, $V1_4$, and $V1_5$ can be the same (e.g., $V1_1=V1_2=V1_3=V1_4=V1_5$). Alternatively, the values of voltages $V1_1$, $V1_2$, $V1_3$, $V1_4$, and $V1_5$ can be different from each other as long as driver circuit 240 can appropriately apply voltages from access lines $255_0$-$255_M$ to respective control gates $250_0$-$250_M$ of the selected block.

Voltages $V2_1$, $V2_2$, $V2_3$, $V2_4$, and $V2_5$ can be different from voltages and $V1_1$, $V1_2$, $V1_3$, $V1_4$, and $V1_5$, respectively. Voltages $V2_1$, $V2_2$, $V2_3$, $V2_4$, and $V2_5$ can have values such that voltages (e.g., relatively high voltages) on respective access lines $255_0$-$255_M$ can be appropriately distributed (e.g., uniformly distributed) to series-connected transistors of driver circuit 240. This allows safe operation (e.g., safe cutoff) of transistors T of driver circuit 240 of the unselected block. For example, driver circuit 240 can be configured to provide a graded biasing technique, such that the values of the voltages $V2_1$, $V2_2$, $V2_3$, $V2_4$, and $V2_5$ applied to the gates can be gradually decreased starting from the voltage applied to the gate of the transistors T that is closest to a respective global access line on a circuit path between the global access line and a respective control gate. Thus, based on FIG. 3C where transistors T controlled by gate $221_5$ (associated with signal $G_5$) are closest to access line $255_M$, a voltage having a highest value (relative to voltages applied to other gates) can be applied to signal $G_5$. Therefore, the relationship among the values of $V2_1$, $V2_2$, $V2_3$, $V2_4$, and $V2_5$ can be expressed as $V2_5 \geq V2_4 \geq V2_3 \geq V2_2 \geq V2_1$ (where voltage $V2_5$ has the highest value and voltage $V2_1$ has the lowest value).

Gates $221_1$, $221_2$, $221_3$, $221_4$, and $221_5$ (associated with signals $G_1$, $G_2$, $G_3$, $G_4$, and $G_5$, respectively) of an unselected block can be biased with different schemes. For example, in one scheme, signals $G_1$, $G_2$, $G_3$, $G_4$, and $G_5$ can be provided with voltages $V2_1$, $V2_2$, $V2_3$, $V2_4$, and $V2_5$, respectively, for a duration (e.g., the entire duration) of an operation (e.g., read, write, or erase operation) performed on a selected block.

In another scheme, gates $221_1$, $221_2$, $221_3$, $221_4$, and $221_5$ of an unselected block can be biased such that signals $G_1$, $G_2$, $G_3$, $G_4$, and $G_5$ on gates $221_1$, $221_2$, $221_3$, $221_4$, and $221_5$, respectively, can be provided with voltages $V2_1$, $V2_2$, $V2_3$, $V2_4$, and $V2_5$, respectively, for only a portion of a duration (e.g., an initial duration) of an operation (e.g., read, write, or erase operation) performed on a selected block. Then, signals $G_1$, $G_2$, $G_3$, $G_4$, and $G_5$ can be released from voltages $V2_1$, $V2_2$, $V2_3$, $V2_4$, and $V2_5$, respectively, responsive to gates $221_1$, $221_2$, $221_3$, $221_4$, and $221_5$ reaching certain selected voltages (e.g., reaching some predetermined voltages).

In another scheme, gates $221_1$, $221_2$, $221_3$, $221_4$, and $221_5$ of an unselected block can be floating (e.g., can be placed in a floating state (e.g., not connected to voltage)) during an initial duration (e.g., at the beginning) of an operation (e.g., read, write, or erase operation) performed on a selected block responsive to (e.g., if memory device 200 determines that) gates $\mathbf{221}_1$, $\mathbf{221}_2$, $\mathbf{221}_3$, $\mathbf{221}_4$, and $\mathbf{221}_5$ are at certain selected voltages (e.g., at some predetermined voltages) during such an initial duration.

Figure 3A:
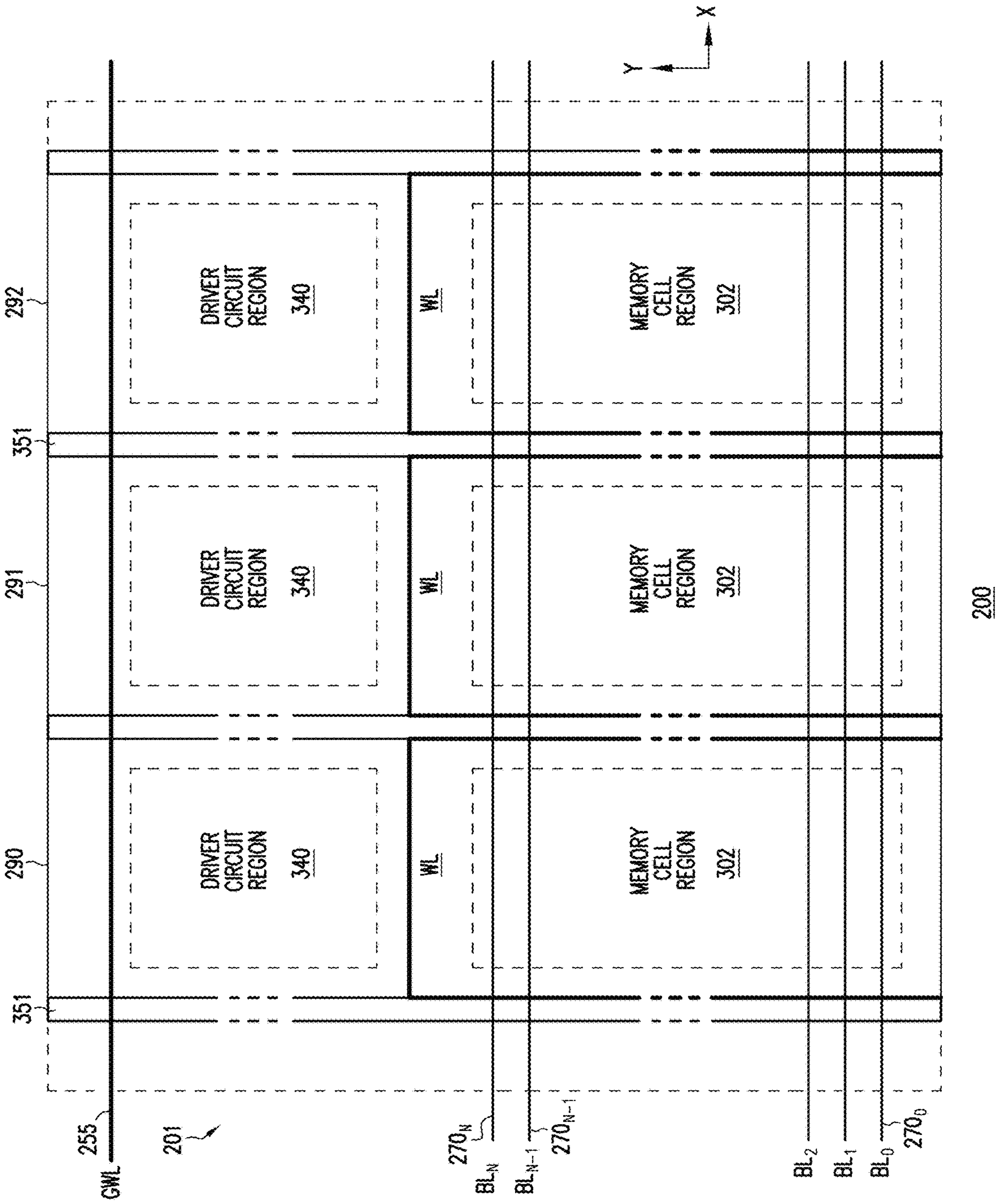
FIG. 3A shows a top view of a structure of the memory device of FIG. 2A including a memory array having blocks, and a memory cell location and a driver circuit location in each of the blocks, according to some embodiments described herein.
Figure 3B:
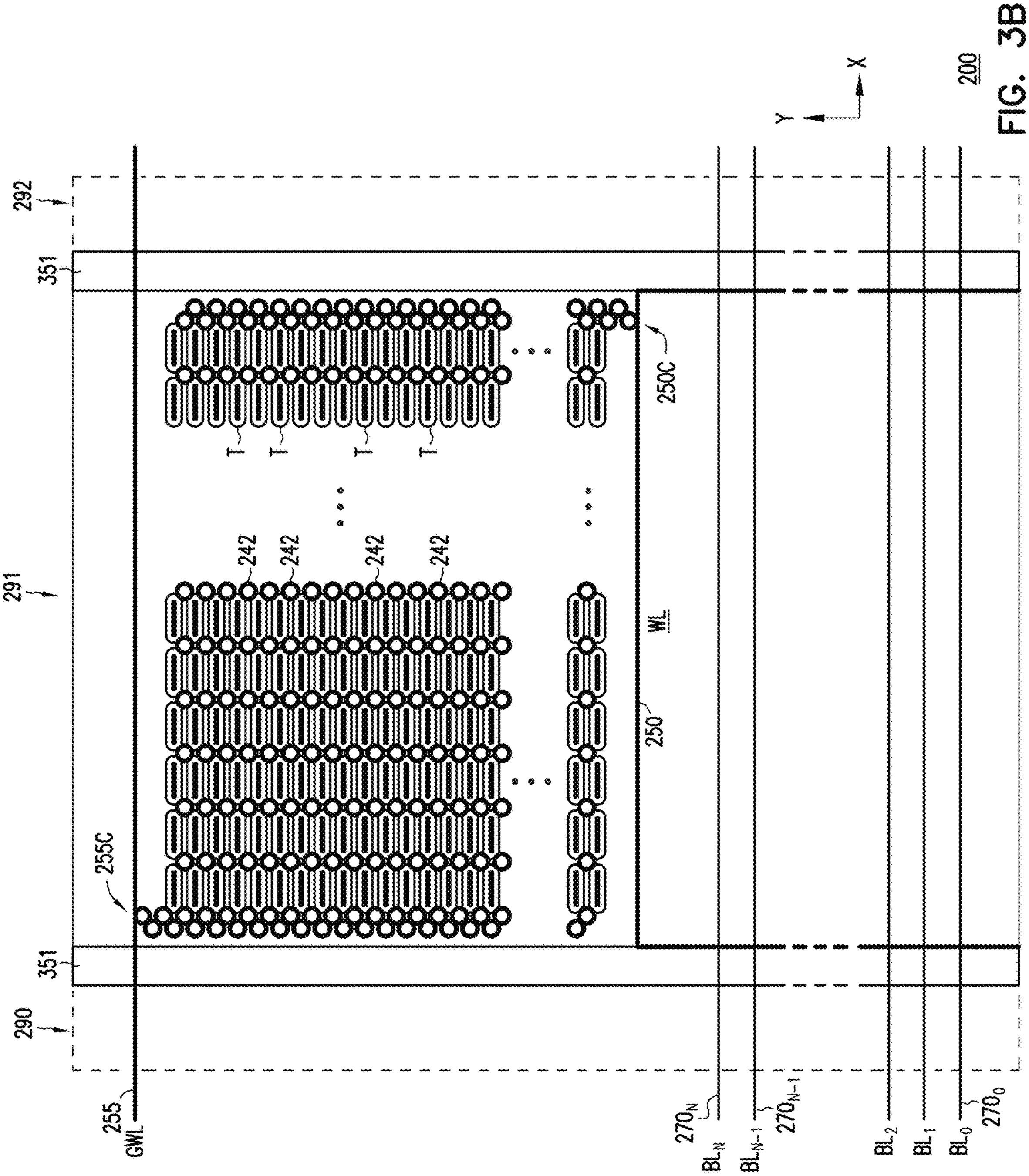
FIG. 3B shows a top view of a structure of the memory device of FIG. 3A including a portion of a structure of a driver circuit, according to some embodiments described herein.
Figure 3C:
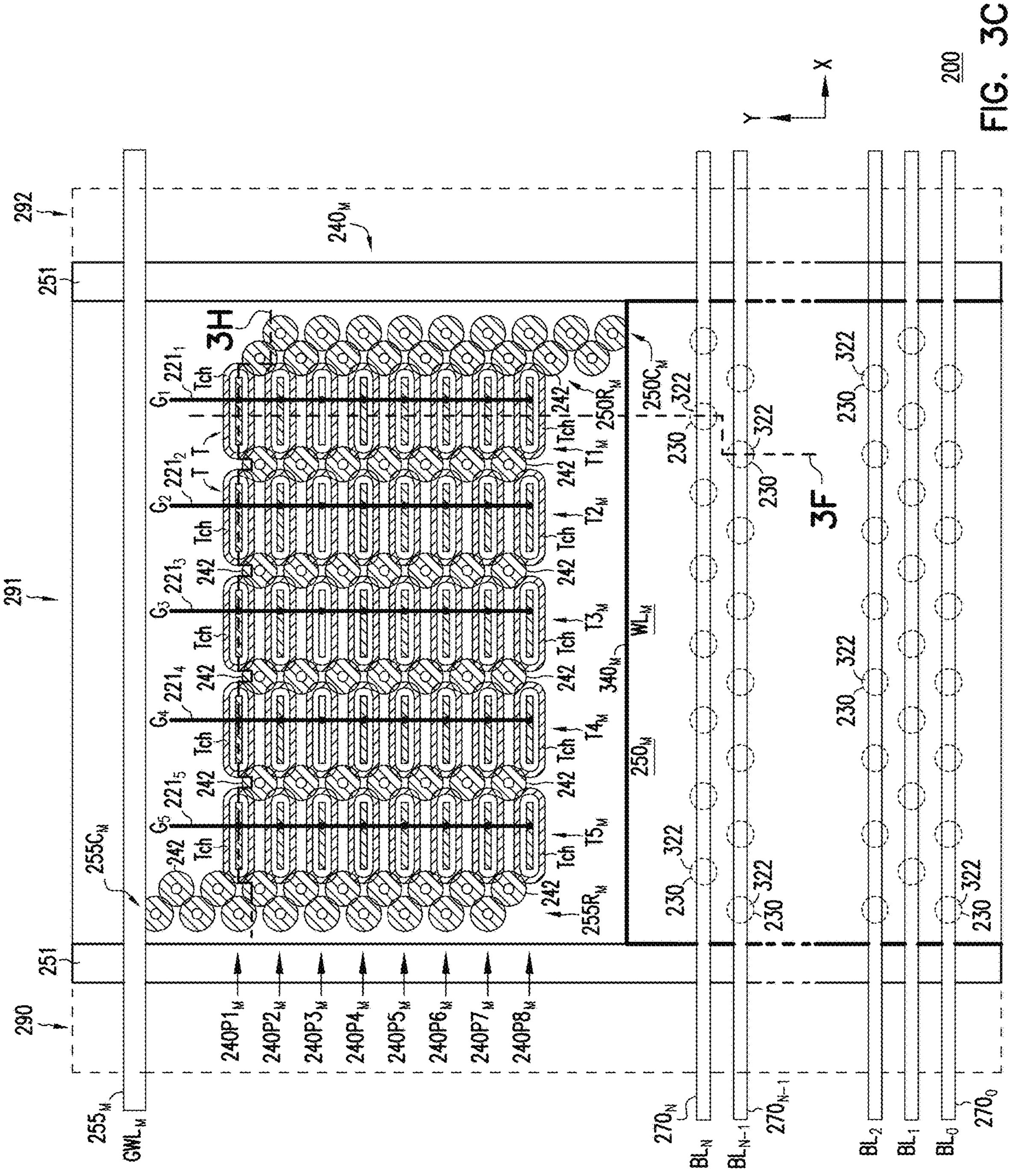
FIG. 3C, FIG. 3D, and FIG. 3E show respective top views of different tiers including structures of respective portions of the driver circuit schematically shown in FIG. 2C, FIG. 2D, and FIG. 2E, respectively, according to some embodiments described herein.
Figure 3D:
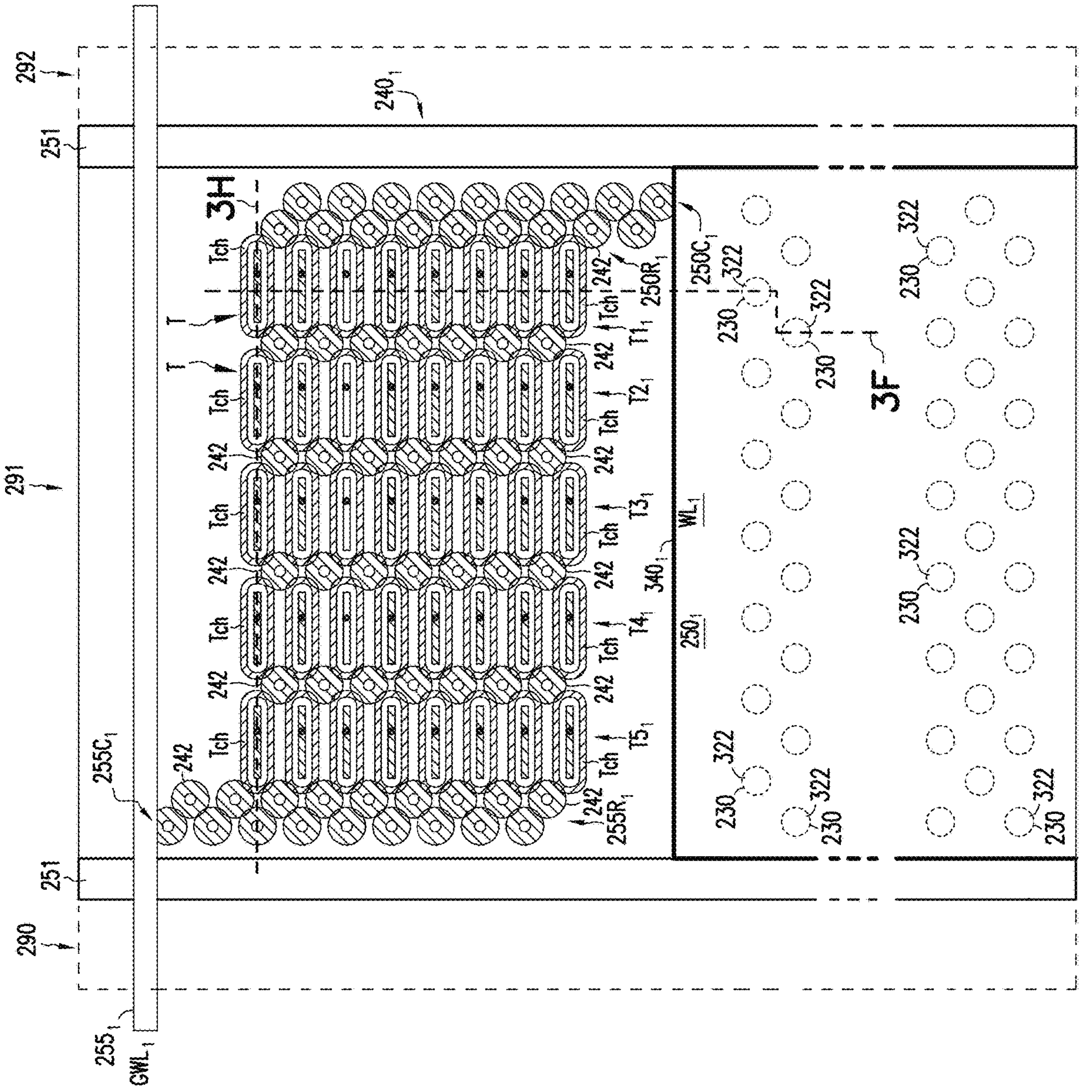
Figure 3E:
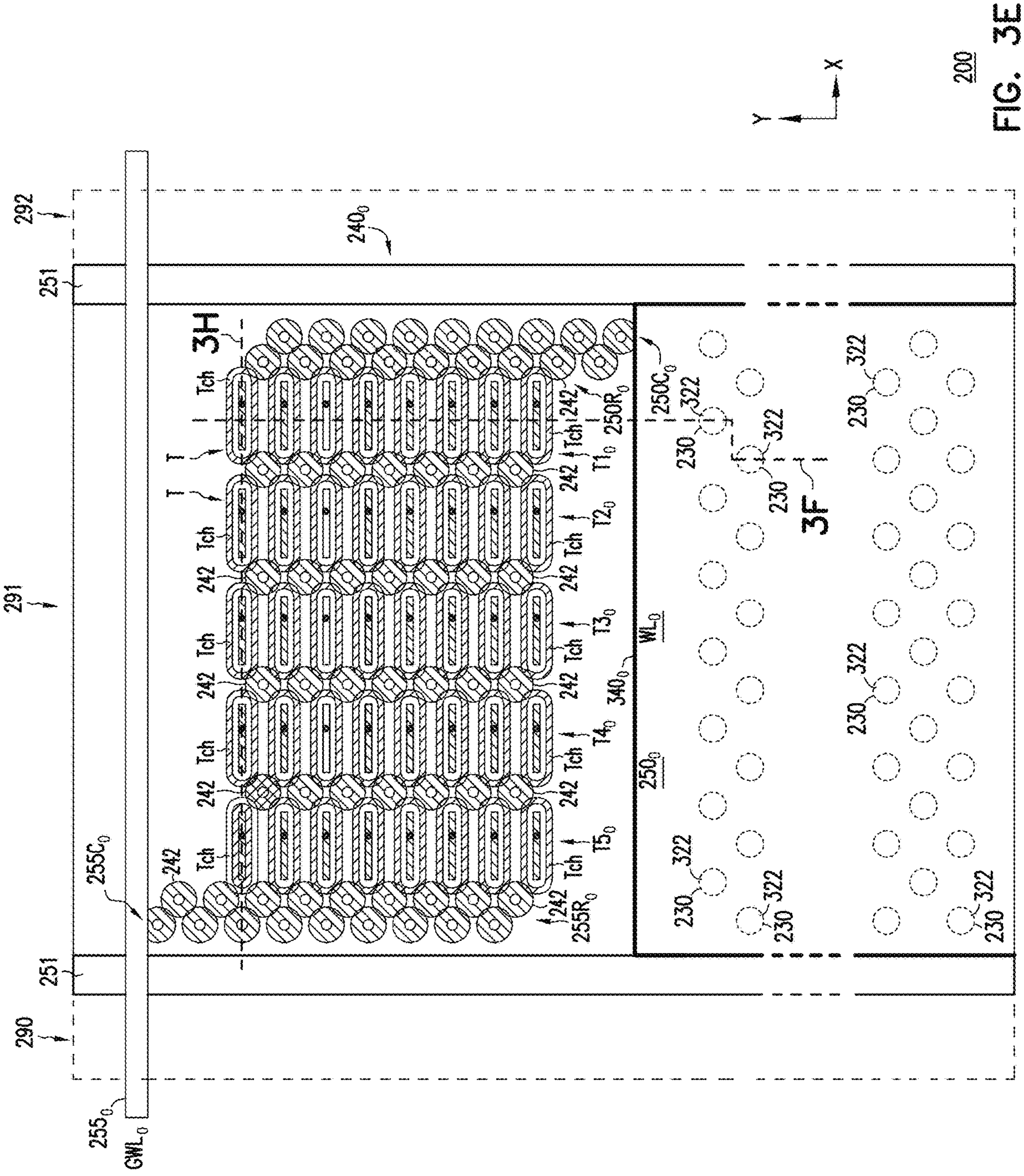

FIG. 2F shows examples of five voltages (e.g., $V1_1$, $V1_2$, $V1_3$, $V1_4$, and $V1_5$ or $V2_1$, $V2_2$, $V2_3$, $V2_4$, and $V2_5$) for five corresponding driver gates (e.g., gates $\mathbf{221}_1$, $\mathbf{221}_2$, $\mathbf{221}_3$, $\mathbf{221}_4$, and $\mathbf{221}_5$) in the example shown in FIG. 3C, FIG. 3D, and FIG. 3E. However, the number of voltages can be different from five depending on the number of driver gates of driver circuit 240.

Memory device 200 as described above with reference to FIG. 2A through FIG. 2F includes other components, which are not shown so as not to obscure the example embodiments described herein. Some of the structures of memory device 200 are described below with reference to FIG. 3A through FIG. 3H. For simplicity, detailed description of the same element among the drawings described herein is not repeated.

FIG. 3A shows a top view of a structure of memory device 200 including a memory array 201 having blocks 290, 291, and 292, and a memory cell region 302 and a driver circuit region 340 in each of blocks 290, 291, and 292, according to some embodiments described herein. In the figures (drawings) herein, similar or the same elements of memory device 200 (FIG. 2A through FIG. 27) are given the same labels. Detailed descriptions of similar or the same elements may not be repeated from one figure to another figure. For simplicity, cross-sectional lines (e.g., hatch lines) are omitted from some or all of the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3A, blocks (blocks of memory cells) 290, 291, and 292 of memory device 200 can be located side-by-side from one block to another in the X-direction. Memory device 200 can include dielectric structures (e.g., block dividers) 351 between respective blocks 290, 291, and 292. Dielectric structures 351 can be formed to divide (e.g., organize) memory device 200 into physical blocks (e.g., blocks 290, 291, and 292). Dielectric structures 351 can have lengths extending in the Y-direction. Each of dielectric structures 351 can include (or can be formed in) a trench (not labeled) that has a depth between two adjacent blocks.

Each of the blocks can have a length in the Y-direction and a width in the X-direction (between two adjacent dielectric structures 351). Three blocks 290, 291, and 292 are shown as an example. Memory device 200 can include numerous blocks.

As shown in FIG. 3A, data lines $\mathbf{270}_0$ through $\mathbf{270}_N$ (associated with signals $BL_0$ through $BL_N$) of memory device 200 can be located over blocks 290, 291, and 292 (with respect to the Z-direction). Data lines $\mathbf{270}_0$ through $\mathbf{270}_N$ can have respective lengths extending in the X-direction. Data lines $\mathbf{270}_0$ through $\mathbf{270}_N$ can extend over (e.g., on top of) and across (in the X-direction) blocks 290, 291, and 292 and can be shared by blocks 290, 291, and 292.

As shown in FIG. 3A, memory cell region 302 and driver circuit region 340 can be located near each other. Memory cell region 302 is where memory cells 202 (FIG. 2A) of a respective block are located. Driver circuit region 340 is where driver circuit 240 (FIG. 2A) of a respective block is located.

FIG. 3A shows a top view of blocks 290, 291, and 292 where a control gate (e.g., local word line) associated with signal WL in a respective block (e.g., block 291) can represent one of the control gates (e.g., control gates $\mathbf{250}_0$-$\mathbf{250}_M$) in FIG. 2A) of a block (e.g., block 291) of memory device 200. Signal WL in a respective block (e.g., block 291) can represent one of the signals (e.g., signals $WL_0$-$WL_M$ in FIG. 2A) of a block (e.g., block 291) of memory device 200. In FIG. 3A, an access line (e.g., global word line) 255 associated with signal GWL can represent one of access lines $\mathbf{255}_0$-$\mathbf{255}_M$ in FIG. 2A of memory device 200.

FIG. 3B shows a top view of a structure of memory device 200 including a portion of a structure of driver circuit 240 of block 291, according to some embodiments described herein. Each of the blocks (e.g., blocks 290 and 292) of memory device 200 can also include a driver circuit similar to (or the same) as driver circuit 240 of block 291. For simplicity, the description herein describes driver circuit 240 of block 291.

As shown in FIG. 3B, driver circuit 240 can include transistors T (only two transistors T are labeled) and conductive joints 242 (only two conductive joints are labeled). Transistors T can be arranged in a matrix (e.g., rows and columns of transistors T in the X-Y directions). Transistors T and conductive joints 242 can form a conductive structure to provide a conductive path (e.g., one or more current paths) between a control gate 250 and an access line 255. Control gate 250 can be one of control gates $\mathbf{250}_0$-$\mathbf{250}_M$ in FIG. 2A. Access line 255 can be one of access lines $\mathbf{255}_0$-$\mathbf{255}_M$ in FIG. 2A of memory device 200. As shown in FIG. 3B, transistors T and conductive joints 242 can contact control gate 250 and access line $\mathbf{255}_M$ at contact locations 250C and 255C, respective.

Transistors T shown in FIG. 3B correspond to one of transistor groups $\mathbf{240}_0$-$\mathbf{240}_M$ of memory device 200 described above with referenced to FIG. 2A through FIG. 2E. Each of transistor groups $\mathbf{240}_0$-$\mathbf{240}_M$ (FIG. 2A through FIG. 2E) can have similar (or the same) structure of the portion of driver circuit 240 of FIG. 3B.

Figure 3F:
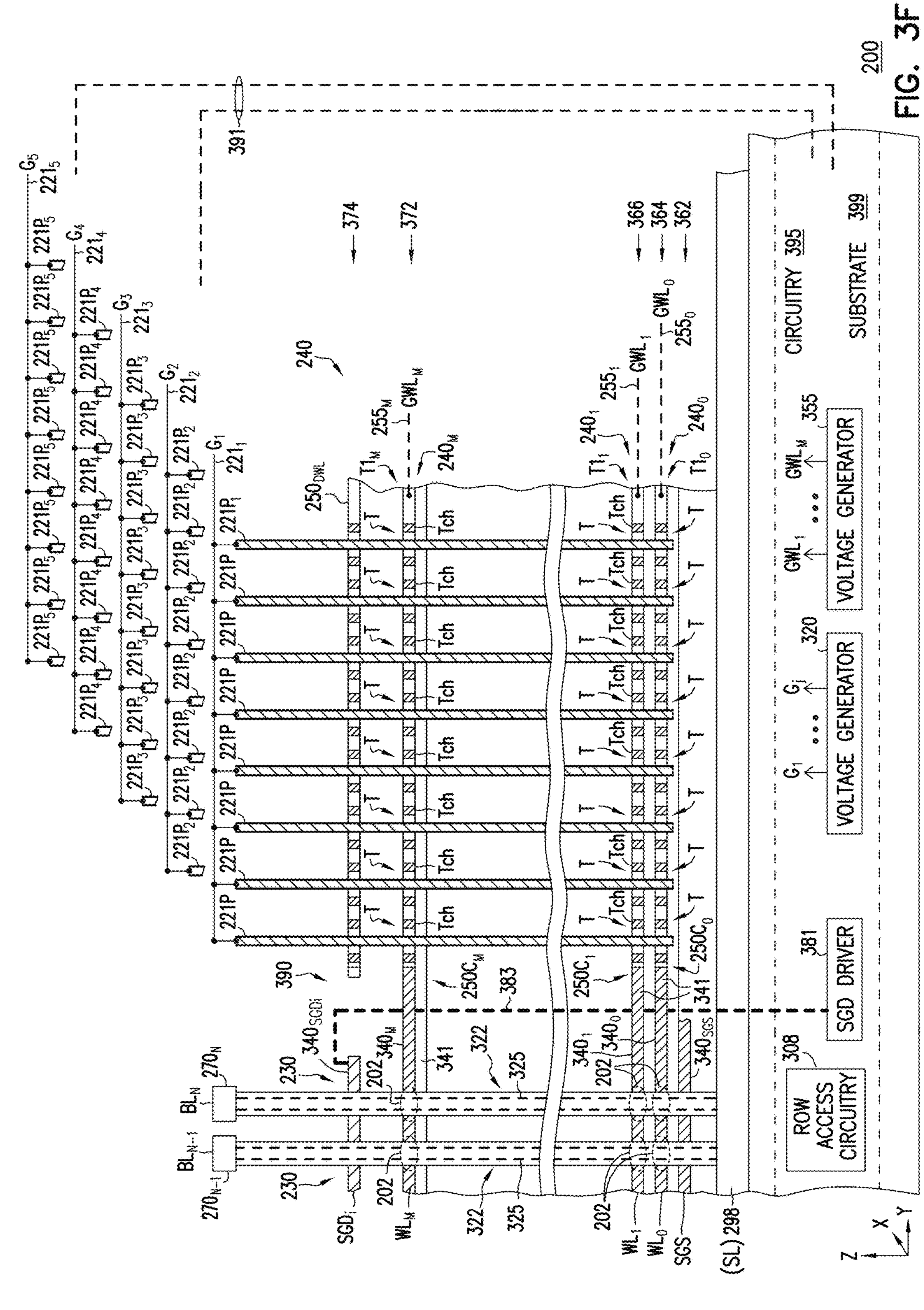
FIG. 3F shows a cross-section of the memory device of FIG. 3C parallel to a length (e.g., in the Y-direction) of a block of the memory device, according to some embodiments described herein.

FIG. 3C, FIG. 3D, and FIG. 3E show top views of a structure of memory device 200 that are schematically shown in FIG. 2C, FIG. 2D, and FIG. 2E, respectively, according to some embodiments described herein. As shown in FIG. 3C, FIG. 3D, and FIG. 3E, memory device 200 can include memory cell strings 230 (shown in FIG. 2A) and transistor groups $\mathbf{240}_M$, $\mathbf{240}_1$, and $\mathbf{240}_0$, respectively, of driver circuit 240 of FIG. 2C, FIG. 2D, and FIG. 2E. Lines 3F and 3H (parallel to the Y-direction and the X-direction, respectively) in FIG. 3C, FIG. 3D and FIG. 3E are locations from which other views (e.g., cross-sectional views) of memory device 200 are shown in FIG. 3F and FIG. 3H, respectively.

As shown in FIG. 3C, memory device 200 can include pillars 322 (shown in top view). Pillars 322 are memory cell pillars that are part of respective memory cell strings 230 (also schematically shown in FIG. 2A) of memory device 200. Pillars 322 can be located under (below) and coupled to respective data lines (only data lines $\mathbf{270}_{N-1}$ and $\mathbf{270}_N$ are shown). Memory cells 202 of a memory cell string can be located (e.g., can be formed vertically) long the length (shown in FIG. 3F) of a corresponding pillar 322. As shown in FIG. 3C, data lines $\mathbf{270}_0$ through $\mathbf{270}_N$ (associated with signals $BL_0$ through $BL_N$) of memory device 200 can be located over (above) and coupled to respective pillars 322.

FIG. 3C also shows the structures of transistor group $240_M$ including transistor sets $T1_M$, $T2_M$, $T3_M$, $T4_M$, and $T5_M$; gates $221_k$, $221_2$, $221_3$, $221_4$, and $221_5$; and associated signals $G_1$, $G_2$, $G_3$, $G_4$, and $G_5$, respectively; and conductive joints 242 that are formed in respective regions to couple adjacent channel regions Tch of respective transistors T. Each of conductive regions $250R_M$ and $255R_M$ can also include conductive joints 242 that are coupled to each other as shown in FIG. 3C.

FIG. 3C also shows different portions $240P1_M$ through $240P8_M$ (eight portions) of transistor group $240_M$. Each of portions $240P1_M$ through $240P8_M$ can include a number of (e.g., five) transistors T having their respective channel regions Tch coupled in series between conductive regions $250R_M$ and $255R_M$ through conductive joints 242. Thus, each of portions $240P1_M$ through $240P8_M$ can include a circuit path formed by a number (e.g., five) of series-connected transistors T. Thus, as shown in FIG. 3C, transistor group $240_M$ can include eight circuit paths (included in respective portions $240P1_M$ through $240P8_M$ in FIG. 3C) coupled in parallel between conductive regions $250R_M$ and $255R_M$.

Each of the transistor sets $T1_M$, $T2_M$, $T3_M$, $T4_M$, and $T5_M$ includes a number of (e.g., eight) transistors T arranged in the Y-direction and having their respective channel regions Tch coupled in parallel between conductive regions $250R_M$ and $255R_M$.

The transistors T in the same transistor set can share (e.g., can be controlled by) the same gate. As shown in FIG. 2C, transistor set $T1_M$ can share gate $221_k$. Transistor sets $T2_M$, $T3_M$, $T4_M$, and $T5_M$ can share gates $221_2$, $221_3$, $221_4$, and $221_5$, respectively. Other transistor groups $240_0$ and $240_1$ (FIG. 3D and FIG. 3E, respectively, described below) can also have similar number of (e.g., five) transistor sets that share gates $221_k$, $221_2$, $221_3$, $221_4$, and $221_5$ with transistor sets $T1_M$, $T2_M$, $T3_M$, $T4_M$, and $T5_M$ of transistor groups $240_0$ of FIG. 3C.

As shown in FIG. 3D and FIG. 3E, each of transistor groups $240_0$ and $240_1$ can include transistors T and conductive joints 242 coupled between their respective access lines (e.g., global word lines) and control gates (e.g., local word lines) in ways similar to (or the same as) those of transistor group $240_M$. Thus, for simplicity, detailed descriptions of transistor groups $240_0$ and $240_1$ are omitted herein.

FIG. 3C, FIG. 3D, and FIG. 3E show an example where only one of conductive joints 242 contacts (e.g., is electrically in contact with) a respective control gate (one of control gates $250_0$ through $250_M$). However, at least one (e.g., one or two or more than two) of conductive joints 242 can contact a respective control gate.

FIG. 3C, FIG. 3D, and FIG. 3E show an example where only one of conductive joints 242 contacts (e.g., electrically in contact with) a respective access line (one of access lines $255_0$ through $255_M$). However, at least one (e.g., one or two or more than two) of conductive joints 242 can contact a respective access line.

FIG. 3C, FIG. 3D, and FIG. 3E show an example of eight parallel circuit paths (e.g., included in respective portions $240P1_M$ through $240P8_M$ in FIG. 3C) between conductive regions (e.g., conductive regions $250R_M$ and $255R_M$ in FIG. 3C) in a respective transistor groups $240_0$-$240_M$. However, driver circuit 240 may include fewer or more than eight parallel circuit paths. Including multiple parallel circuit paths (e.g., two or more) like the parallel circuit paths in respective portions $240P1_M$ through $240P8_M$ can improve drive capability of driver circuit 240 (e.g., to properly drive current to the control gates of block 291).

FIG. 3C, FIG. 3D, and FIG. 3E show an example of five series-connected transistors T in the X-direction between a respective access line (e.g., global word line) and a respective control gate (e.g., local word line). However, the number of such series-connected transistors T can be different from five. The number of such series-connected transistors T can be formed with a selected dimension (e.g., a predetermined length) such that driver circuit 240 can appropriately drive the control gates of memory device 200. Further, including separate gates (e.g., gates $221_1$, $221_2$, $221_3$, $221_4$, and $221_5$) for the series-connected transistors T allows driver circuit 240 to appropriately distribute (e.g., uniformly distribute) voltages from global word lines to series-connected transistors T. This can relax breakdown voltages and leakage current (as also described above with reference to FIG. 2F), resulting in safe operation and improved performance of driver circuit 240.

The driver gates (e.g., gates $221_1$, $221_2$, $221_3$, $221_4$, and $221_5$) of driver circuit 240 described above (and driver gates of other driver circuits described herein) can be selectively coupled to each other (e.g., shorted to each other). This can avoid connection crowding (e.g., by reducing routing connections) and can save room for other elements in memory device 200. For example, as shown in FIG. 3C, gates $221_1$, $221_2$, $221_3$, $221_4$, and $221_5$ are electrically separated from each other and have separate signals $G_1$, $G_2$, $G_3$, $G_4$, and $G_5$. However, in an alternative structure of driver circuit 240, adjacent gates among gates $221_1$, $221_2$, $221_3$, $221_4$, and $221_5$ can be coupled to each other (e.g., ganged together). As an example, gates $221_1$ and $221_2$ (FIG. 3C) can be coupled together, and gates $221_3$ and $221_4$ can be coupled together. Thus, in this example, gates $221_1$ and $221_2$ can be provided with the same signal (e.g., signal $G_1$ or $G_2$), and gates $221_3$ and $221_4$ can be provided with the same signal (e.g., signal $G_3$ or $G_4$). In this example, two adjacent gates are coupled together. However, more than two adjacent gates (e.g., two or more adjacent gates among gates $221_1$ through $G_j$ in FIG. 2A) can be coupled together.

FIG. 3F shows a portion (e.g., cross-section) along line 3F of FIG. 3C, FIG. 3D, and FIG. 3E parallel to the Y-direction. As shown in FIG. 3F, memory device 200 can include conductive materials $340_{SGS}$, $340_0$, $340_1$, $340_M$, and $340_{SGDi}$ that can form (e.g., can be materials included in) respective select gate (e.g., source select gate) 280 (FIG. 2A), control gates $250_0$ through $250_M$, and select gates (e.g., drain select gates in FIG. 2A) $280_0$ and $280_i$ (FIG. 2A). Conductive material $340_{SGDi}$ can form one of the drain select gates (e.g., select gate $280_i$ of FIG. 2A) of block 291. Conductive materials for other drain select gates of block 291 are not shown (e.g., hidden from the view of conductive material conductive material $340_{SGDi}$).

As shown in FIG. 3F, memory device 200 can include levels 362, 364, 366, 372, and 374 that are physical layers (e.g., portions) in the Z-direction of memory device 200. Conductive materials $340_{SGS}$, $340_0$, $340_1$, $340_M$, and $340_{SGDi}$ can be located (e.g., stacked) one level (e.g., one layer) over another in respective levels 362, 364, 366, 372, and 374 in the Z-direction. Conductive materials $340_{SGS}$, $340_0$, $340_1$, $340_M$, and $340_{SGDi}$ can also be called levels of conductive materials $340_{SGS}$, $340_0$, $340_1$, $340_M$, and $340_{SGDi}$.

As shown in FIG. 3F, conductive materials $340_{SGS}$, $340_0$, $340_1$, $340_M$, and $340_{SGDi}$ can interleave with dielectric materials 341 in the Z-direction. Conductive materials $340_{SGS}$, $340_0$, $340_1$, $340_M$, and $340_{SGDi}$ can include metal (e.g., tungsten, or other metal), other conductive materials, or a combination of conductive materials. Dielectric materials 341 can include silicon dioxide.

Signals SGS, $WL_0$, $WL_1$, $WL_M$, $SGD_0$, and $SGD_i$ in FIG. 3F associated with respective conductive materials in FIG. 3F are the same signals shown in FIG. 2A. Conductive material $\mathbf{340}_{SGS}$ can form select gate 280 (associated with signal SGS) of FIG. 2A. Conductive materials $\mathbf{340}_0$, $\mathbf{340}_1$, and $\mathbf{340}_M$ can form control gates $\mathbf{250}_0$, $\mathbf{250}_1$, and $\mathbf{250}_M$ (associated with signals $WL_0$, $WL_1$, and $WL_M$, respectively) of FIG. 2A. Conductive material $\mathbf{340}_{SGDi}$ (associated with signal $SGD_i$) can form select gate $\mathbf{281}_i$ of FIG. 2A.

FIG. 3F shows an example of memory device 200 including one level of conductive materials $\mathbf{340}_{SGS}$ that forms a select gate (e.g., source select gate associated with signal SGS). However, memory device 200 can include multiple levels (similar to level 362) of conductive materials (e.g., multiple levels of conductive material $\mathbf{340}_{SGS}$) located under (in the Z-direction) the level of conductive materials $\mathbf{340}_1$ (e.g., below level 364) to form multiple source select gates of memory device 200.

FIG. 3F shows an example of memory device 200 including one level (e.g., level 374) of multiple drain select gates $SGD_0$ through $SGD_i$ (on the same level, formed from conductive material SGD; and other conductive materials (not shown) like conductive material $SGD_i$). However, memory device 200 can include multiple levels (e.g., levels 374, 376, 378, and 380 in FIG. 3G, described below) in the Z-direction in which each of such multiple levels can include multiple drain select gates (e.g., four drain select gates in each of the multiple levels).

FIG. 3F also shows tiers in the Z-direction of memory device 200. A tier of memory device 200 can include a level of conductive material (e.g., conductive material $\mathbf{340}_1$) and an adjacent level of dielectric material 341 (e.g., dielectric material 341 between conductive materials $\mathbf{340}_0$ and $\mathbf{340}_1$). As shown in FIG. 3F, the tiers can be located (e.g., stacked) one over another in the Z-direction over substrate 399. Each tier can have respective memory cells 202 (which are located on the same level (same tier) with respect to the Z-direction). Each tier can have a respective control gate (e.g., a respective word line) for memory cells 202 of the respective tier. The control gate in a tier is formed by a respective level of conductive material among conductive materials $\mathbf{340}_0$, $\mathbf{340}_1$, and $\mathbf{340}_M$. FIG. 3F shows a few tiers of memory device 200 for simplicity. However, memory device 200 can include up to (or more than) one hundred tiers.

As shown in FIG. 3F, transistor groups $\mathbf{240}_0$-$\mathbf{240}_M$ of driver circuit 240 can be located in (e.g., embedded in) respective tiers (e.g., located on levels 364, 366, and 372, respectively) over substrate 399. Thus, driver circuit 240 can be called an in-tier driver circuit.

Substrate 399 can include a semiconductor (e.g., silicon) substrate. Substrate 399 can also include circuitry 395 located under other components (e.g., under memory cells 202 and source 298) of memory device 200 that are formed over substrate 399. Circuitry 395 can include circuit elements that can be coupled (e.g., through conductive paths 391) to other circuit elements outside substrate 399. As shown in FIG. 3F, circuitry 395 can include row access circuitry 308 (which can include a decoder) that can correspond to row access circuitry 108 of FIG. 1. Circuitry 395 can also include a voltage generator 320 and a voltage generator 355. Although not shown in FIG. 3F, circuitry 395 can also include other circuit elements, for example, buffers (e.g., page buffers), sense amplifiers, and other circuitry of memory device 200.

Voltage generator 320 can operate to generate voltages (e.g., bias voltages) that can be provided to signals $G_1$ through $G_j$ associated with gates $\mathbf{221}_1$ through $\mathbf{221}_j$ (e.g., gates $\mathbf{221}_1$ through $\mathbf{221}_5$ in FIG. 3C). For example, voltage generator 320 can generate voltages $V1_1$, $V1_2$, $V1_3$, $V1_4$, and $V1_5$ (not shown in FIG. 3F) that can be provided to driver gates of a selected block, as described above with reference to FIG. 2F. In another example, voltage generator 320 can generate voltages $V2_1$, $V2_2$, $V2_3$, $V2_4$, and $V2_5$ (not shown in FIG. 3F) that can be provided to driver gates of an unselected block, as described above with reference to FIG. 2F.

Voltage generator 355 can operate to generate voltages that can be provided to signals $GWL_0$ through $GWL_M$ associated with access lines $\mathbf{255}_1$ through $\mathbf{255}_M$ in FIG. 2A (e.g., access lines $\mathbf{255}_0$, $\mathbf{255}_1$, and $\mathbf{255}_M$ in FIG. 3C). Voltage generator 355 can include voltage pumps to generate relatively high voltages (e.g., voltages having values greater than the value of the supply voltage (e.g., Vcc) of memory device 200. The voltages generated by voltage generator 355 and applied to signals $GWL_1$ through $GWL_M$ can be provided (in the form of signals $WL_0$ through $WL_M$) to control gates $\mathbf{250}_1$ through $\mathbf{250}_M$ of a respective block (e.g., a selected block) by driver circuit 240 during an operation (e.g., read, write, and erase operation) of memory device 200.

As shown in FIG. 3F, memory device 200 can include an SGD (drain select drain) driver 381 that can operate to provide (e.g., drive) signals $SDG_0$-$SGD_i$ (schematically shown in FIG. 2A) to select gates $\mathbf{281}_0$-$\mathbf{281}_i$, respectively. SGD driver 381 can be separated from driver circuit 240. As described above, driver circuit 240 can be used to drive control gates (e.g., local word lines) $\mathbf{250}_0$-$\mathbf{250}_M$ (FIG. 2A) associated with signals $WL_0$-$WL_M$, respectively.

As shown in FIG. 3F, memory device 200 can include a region 390 where select gates $\mathbf{281}_0$-$\mathbf{281}_i$ can be separated (electrically isolated) from a conductive structure 250_SGD associated with respective signals $\mathbf{250\_SGD}_0$, $\mathbf{250\_SGD}_1$, $\mathbf{250\_SGD}_2$, and $\mathbf{250\_SGD}_3$. Conductive structure 250_SGD can be excluded from driver circuit 240. Conductive structure 250_SGD can be coupled to a driver separated from driver circuit 240 and SGD driver 381.

In FIG. 3F, SGD driver 381 can be coupled to select gates $\mathbf{281}_0$-$\mathbf{281}_i$ (only select gate associated with signal $SGD_i$ is shown in FIG. 3F) through conductive paths (e.g., conductive routings) 383. Conductive paths 383 can include conductive materials (e.g., metal or other conductive materials). For simplicity, FIG. 3F shows conductive paths 383 as a line. As shown in FIG. 3F, conductive paths 383 can include a portion (e.g., a vertical portion) that can extend in the Z-direction at region 390 and can go through (and electrically isolated from) other elements of memory device 200 at region 390. For example, conductive paths 383 can go through (and electrically isolated from) conductive materials $\mathbf{340}_{SGS}$, $\mathbf{340}_0$, $\mathbf{340}_1$, $\mathbf{340}_M$ of respective select gate (e.g., source select gate) 280 (FIG. 2A) and control gates $\mathbf{250}_0$ through $\mathbf{250}_M$. FIG. 3F shows conductive paths 383 located at region 390 as an example. However, conductive paths 383 can be located at a region different from region 390.

As shown in FIG. 3F, memory device 200 can include conductive paths (e.g., conductive routings) 391 that can include portions extending in the Z-direction (e.g., extending vertically). Conductive paths 391 can provide electrical connections between elements of memory device 200. For example, conductive paths 391 can be coupled to gates $\mathbf{221}_1$, $\mathbf{221}_2$, $\mathbf{221}_3$, $\mathbf{221}_4$, and $\mathbf{221}_5$ (associated with signals $G_1$ through $G_5$) and voltage generator 320 of circuitry 395 to provide electrical connections (e.g., in the form of signals $G_1$ through $G_5$) from voltage generator 320 to gates 221$_1$ through 221$_5$. In another example, conductive paths 391 can be coupled to access lines 255$_0$-255$_M$ (associated with signals $GWL_1$ through $GWL_5$) and voltage generator 355 of circuitry 395 to provide electrical connections (e.g., in the form of signals $GWL_1$ through $GWL_5$) from voltage generator 355 to access lines 255$_0$-255$_M$.

Source 298 can include a conductive structure to carry current. The conductive structure of source 298 can include a single level (single layer) of conductive material or multiple levels (layers) of conductive materials stacked one over another in the Z-direction. For example, the conductive structure of source 298 can include a level of polysilicon, a level of metal (e.g., tungsten), a level of tungsten silicide, a level of other conductive material, or a combination of multiple levels of these materials.

As shown in FIG. 3F, pillar 322 can include a structure 325 extending along the length (in the Z-direction) of pillar 322 and coupled to a respective data line (e.g., data line 270$_{N-1}$ or 270$_N$) and source 298. Structure 325 can include a conductive channel portion (e.g., pillar channel) that can be part of a conductive path between a respective data line (e.g., data line 270$_N$) and source 298 to carry current between a respective data line and source 298 during an operation (e.g., read, write, or erase) of memory device 200.

Structure 325 of pillar 322 can include multiple layers of different materials that can be part of a TANOS (TaN, $Al_2O_3$, $Si_3N_4$, $SiO_2$, Si) structure of pillar 322 or a structure similar to a TANOS structure. For example, structure (e.g., TANOS structure) 325 can include a dielectric portion (e.g., interpoly dielectric portion). The dielectric portion can include a charge blocking material or materials (e.g., a dielectric material including TaN and $Al_2O_3$) that are capable of blocking a tunneling of a charge. Structure (e.g., TANOS structure) 325 can include a charge storage portion. The charge storage portion can include a charge storage element (e.g., charge storage material or materials, e.g., $Si_3N_4$) that can provide a charge storage function (e.g., trap charge) to represent a value of information stored in a respective memory cell. Structure (e.g., TANOS structure) 325 can include another dielectric portion (where the charge storage portion can be between the dielectric portions) that can include a tunnel dielectric material or materials (e.g., $SiO_2$). The tunnel dielectric material (or materials) is capable of allowing tunneling of a charge (e.g., electrons). In an alternative structure of memory device 200, structure 325 of pillar 322 can include or can be part of a SONOS (Si, $SiO_2$, $Si_3N_4$, $SiO_2$, Si) structure. In another alternative structure of memory device 200, structure 325 of pillar 322 can include or can be part of a floating gate structure. For example, structure 325 can include a charge storage portion that can include polysilicon (or other material) that can be part of a floating gate of a respective memory cell 202.

Figure 3G:
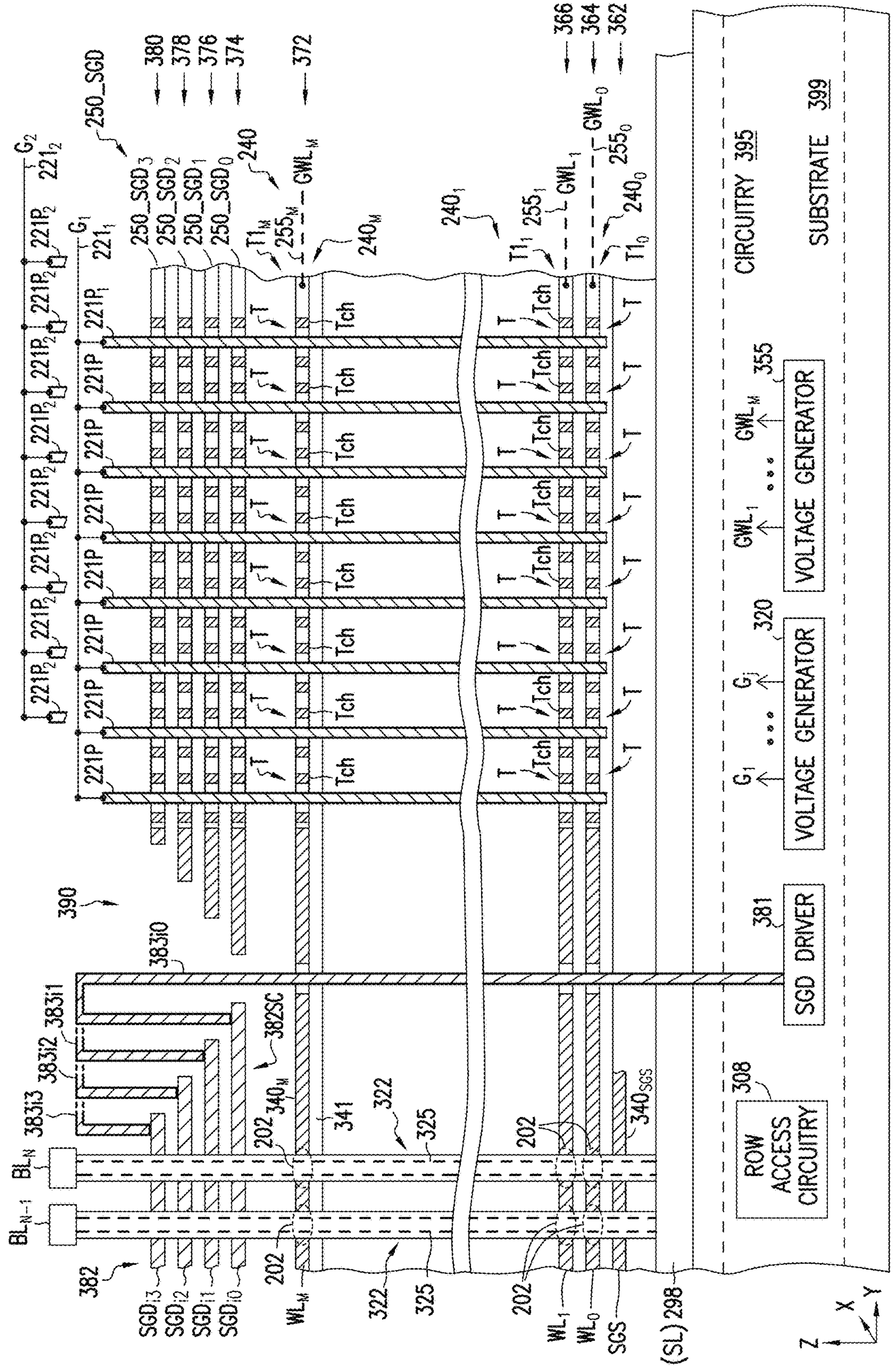
FIG. 3G shows an alternative structure of the memory device of FIG. 3F including multiple drain select gates located on different levels of the memory device, according to some embodiments described herein.
Figure 3H:
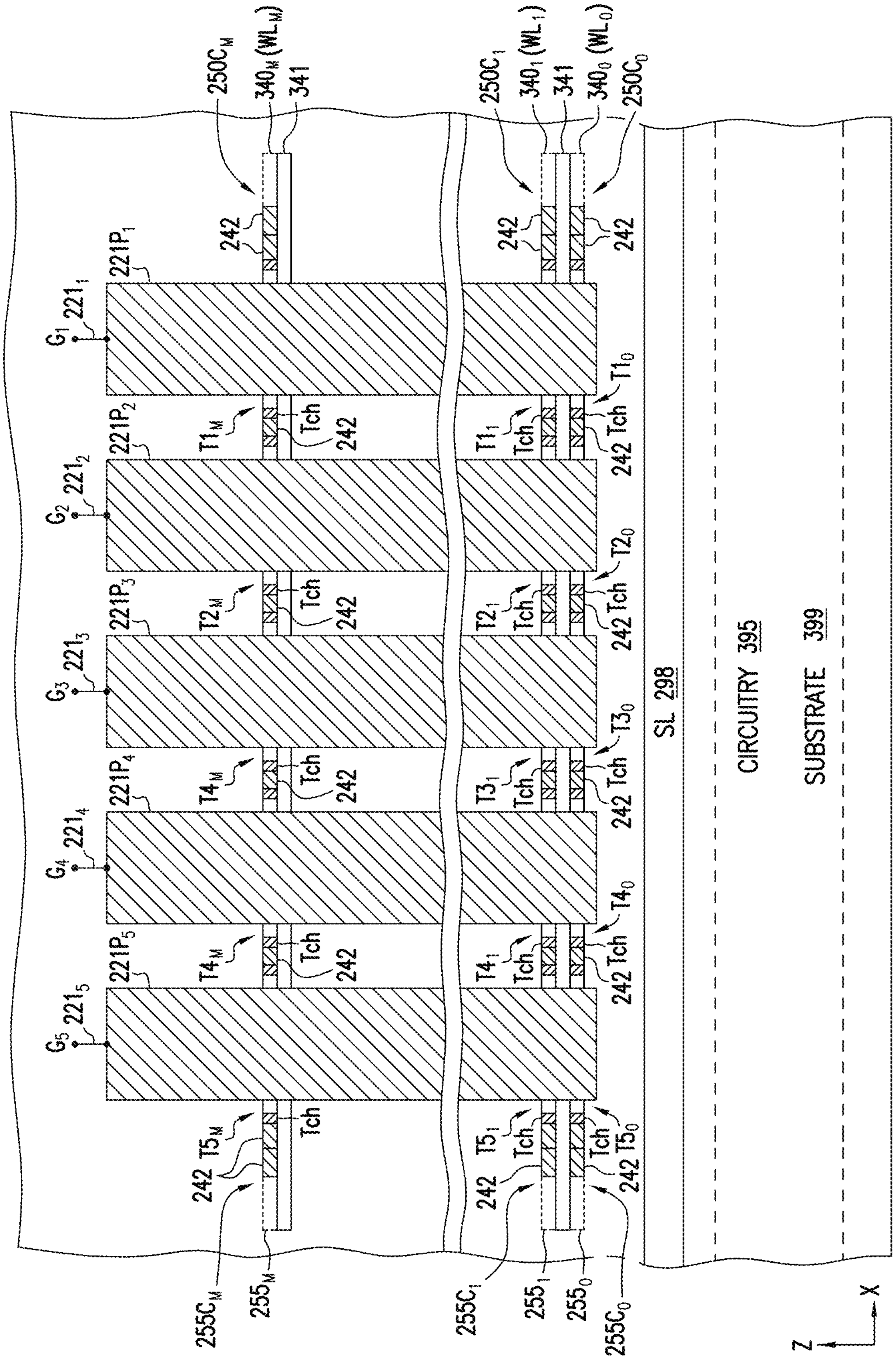
FIG. 3H shows a cross-section of the memory device of FIG. 3C parallel to a width (e.g., parallel to the X-direction) of a block of the memory device, according to some embodiments described herein.

FIG. 3G shows an alternative structure of the memory device of FIG. 3F including select gates (e.g., multiple drain select gates) 382 located on different levels 374, 376, 378, and 380 of memory device 200. As shown in FIG. 3G, select gates 382 are associated with respective signals $SGD_{i0}$, $SGD_{i1}$, $SGD_{i2}$, and $SGD_{i3}$ and can be located on levels 374, 376, 378, and 380, respectively. Select gates 382 can include respective portions that can formed a staircase (or a staircase-like) structure 382SC at region 390. Select gates 382 can be coupled to SGD driver 381 through respective conductive paths 383$_{i0}$, 383$_{i1}$, 383$_{i2}$, and 383$_{i3}$. Conductive paths 383$_{i0}$, 383$_{i1}$, 383$_{i2}$, and 383$_{i3}$ can be separated from each other.

As shown in FIG. 3G, memory device 200 can a conductive structure 250'$_{DWL}$. Conductive structure 250'$_{DWL}$ can be similar to conductive structure 250$_{DWL}$ of FIG. 3F. However, as shown in FIG. 3G, conductive structure 250'$_{DWL}$ can include multiple levels of conductive materials (on levels 374, 376, 378, and 380, respectively) that can form local word lines (e.g., dummy local word lines) of memory device 200. Conductive structure 250'$_{DWL}$ can be excluded from driver circuit 240. Conductive structure 250'$_{DWL}$ can be unconnected other elements of memory device 200. Alternatively, conductive structure 250'$_{DWL}$ can be coupled to a driver separated from driver circuit 240 and SGD driver 381.

FIG. 3H shows a portion (e.g., cross-section) along line 3H of FIG. 3C, FIG. 3D, and FIG. 3E. The following description refers to FIG. 3F and FIG. 3H (which shows another view of driver circuit 240) including part of driver circuit 240. As shown in FIG. 3F and FIG. 3H, memory device 200 can include gate pillars (e.g., vertical structures) 221P$_1$, 221P$_2$, 221P$_3$, 221$_4$, and 221P$_5$. Gate pillars 221P$_1$ are part of gate 221$_1$. Gate pillars 221P$_2$ are part of gate 221$_2$. Gate pillars 221P$_3$ are part of gate 221$_3$. Gate pillars 221P$_4$ are part of gate 221$_4$. Gate pillars 221P$_5$ are part of gate 221$_5$. Thus, signals $G_1$, $G_2$, $G_3$, $G_4$, and $G_5$ applied to gates 221$_1$, 221$_2$, 221$_3$, 221$_4$, and 221$_5$, respectively, also applied to gate pillars 221P$_1$, 221P$_2$, 221P$_3$, 221$_4$, and 221P$_5$, respectively.

As shown in FIG. 3F and FIG. 3H, each of gate pillars 221P$_1$-221P$_5$ can have a length in the Z-direction that extends through the tiers of memory device 200. Each of gate pillars 221P$_1$-221P$_5$ can include (e.g., can be formed from) a conductive material (e.g., metal). Gate pillars 221P$_1$-221P$_5$ are electrically separated (e.g., by a dielectric material, not labeled) from respective channel regions Tch of transistors T. Unlike pillars 322 of memory cell strings 230, the gate pillars (e.g., gate pillars 221P$_1$, 221P$_2$, 221P$_3$, 221$_4$, and 221P$_5$) of driver circuit 240 can be electrically separated from source 298.

Figure 10B:
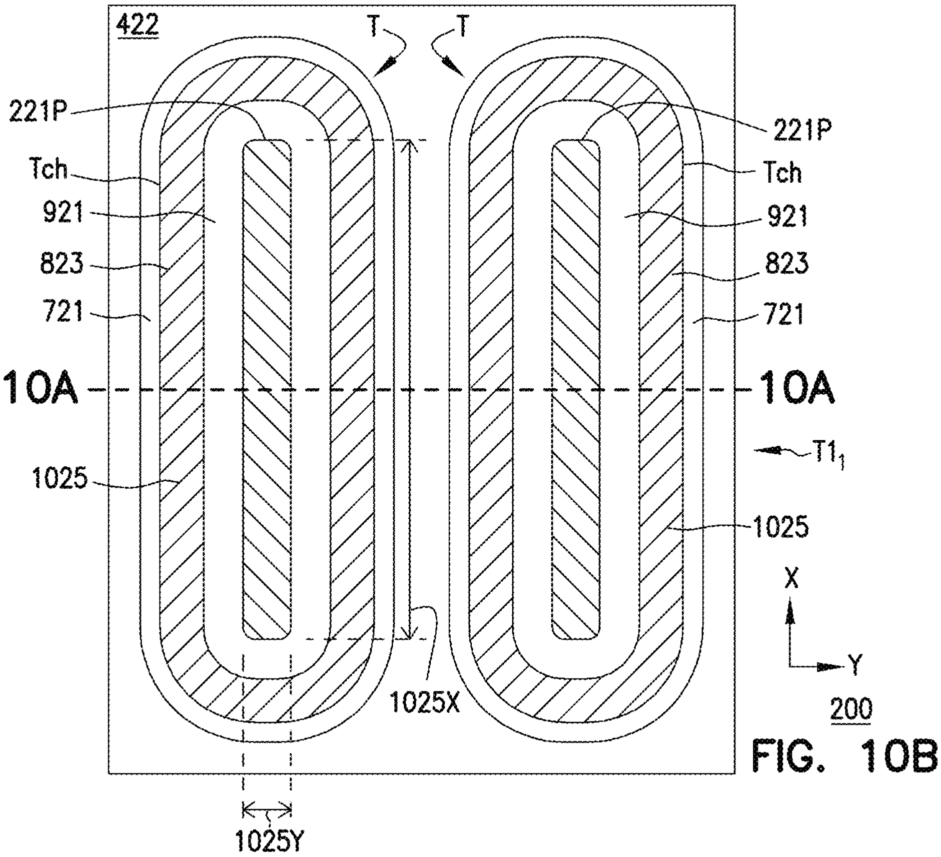

Each of gate pillars 221P$_1$-221P$_5$ can have a non-circular shape, such that a cross-section (parallel to the X-Y plan view) of each gate pillar can have a rectangular (or rectangular-like) shape, as shown in FIG. 10B. For example, each of gate pillars 221P$_1$-221P$_5$ can have dimensions 1025X and 1025Y (FIG. 10B) as described below with reference to FIG. 10A and FIG. 10B as part of the description for forming the structure of driver circuit 240 of memory device 200.

FIG. 4A through FIG. 22D show different views of structures during processes of forming memory device 200 including driver circuit 240 of FIG. 2 through FIG. 3H, according to some embodiments described herein. In FIG. 4A through FIG. 22D, a figure number associated with label "A" (e.g., FIG. 4A) shows a side view (e.g., a cross-section) at the location indicated by line A-A in a figure having the same number but associated with label "B" (e.g., FIG. 4B). A figure number associated with label "B" (e.g., FIG. 4B) shows a view (e.g., top view) at the location indicated by line B-B in a figure having the same number but associated with label "A" (e.g., FIG. A). In FIG. 4A through FIG. 22D, a subsequent figure number associated with label "A" (e.g., FIG. 5A) shows the same view as a preceding figure associated with label "A" (e.g., FIG. 4A). Similarly, a subsequent figure number associated with label "B" (e.g., FIG. 5B) shows the same view as a preceding figure number associated with label "B" (e.g., FIG. 4B).

Figure 4B:
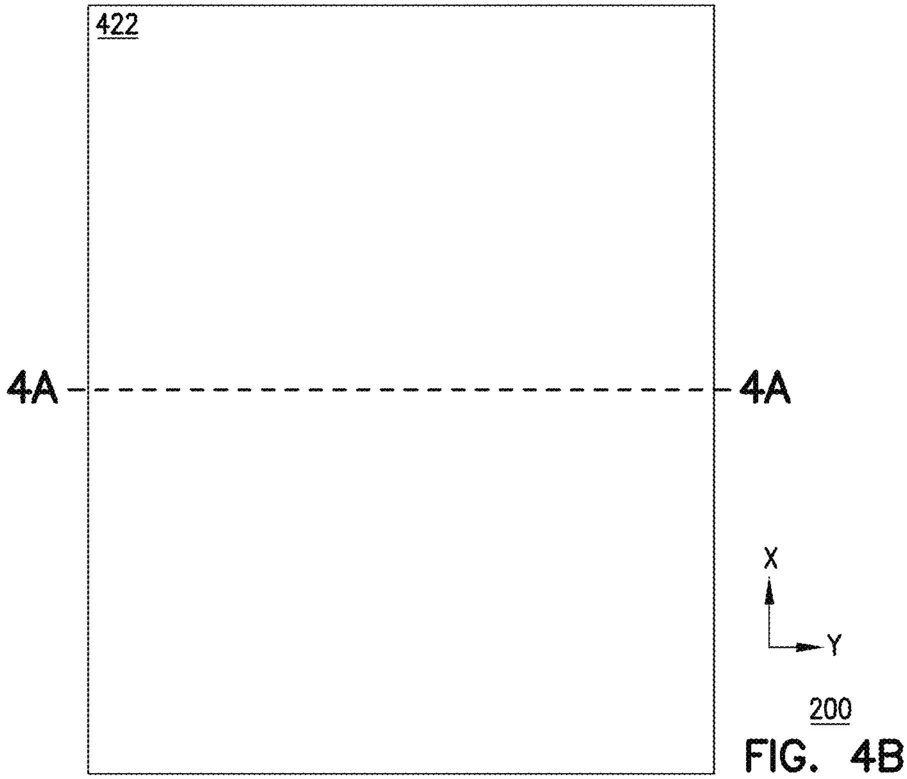
FIG. 4A through FIG. 22D show different views of structures during processes of forming the memory device of FIG. 2A through FIG. 3H, according to some embodiments described herein.
Figure 4A:
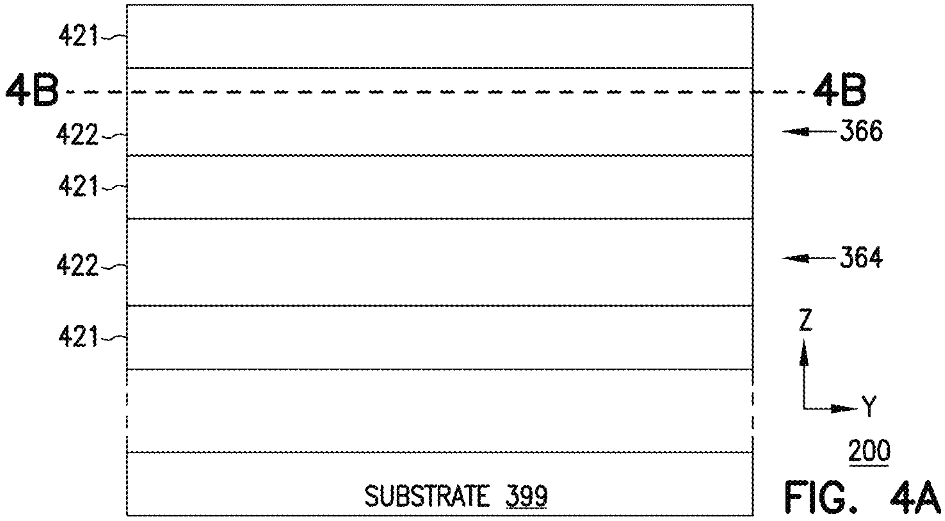

FIG. 4A and FIG. 4B show memory device 200 after dielectric materials 421 and dielectric materials 422 are formed. FIG. 4A shows a side view taken along lines 4A-4A of FIG. 4B. FIG. 4B shows a top view taken along line 4B-4B FIG. 4A. Line 4A-4A can correspond to a portion of line 3F in FIG. 3C, FIG. 3D, and FIG. 3E at the location of driver circuit 240 (e.g., which can correspond to driver circuit region 340 in FIG. 3A).

As shown in FIG. 4A, dielectric materials 421 are levels of dielectric material 421 and dielectric materials 422 are levels of dielectric material 422 interleaved with the levels of dielectric material 421. Dielectric materials 421 and dielectric materials 422 can be sequentially formed one material after another over substrate 399 in an interleaved fashion. Dielectric materials 421 can include silicon dioxide. Dielectric materials 422 can include silicon nitride. As shown in FIG. 4A, dielectric materials 421 and 422 can be formed, such that dielectric materials 421 can interleave with dielectric materials 422 on respective levels of memory device 200 in the Z-direction. For simplicity, only levels 364 and 366 are labeled in FIG. 4A. These levels correspond to the same levels 364 and 366 shown in FIG. 3F.

Thus, as shown in FIG. 4A, dielectric materials (e.g., silicon nitride) 422 are formed on respective levels 362 and 364. Dielectric materials (e.g., silicon oxide) 421 are formed on respective levels (not labeled) that are interleaved with levels 362 and 364. The processes associated with FIG. 4A and FIG. 4B also form additional levels of interleaved dielectric materials above level 366 like dielectric materials 421 and 422. For simplicity, FIG. 4A and FIG. 4B omit such additional levels of interleaved dielectric materials.

In FIG. 4A, dielectric materials 421 can correspond to dielectric materials 341 of FIG. 3C. For example, dielectric material 421 between levels 364 and 366 in FIG. 4A can correspond to dielectric material 341 between levels 364 and 366 in FIG. 3C. The levels of dielectric materials 421 shown in FIG. 4A can be formed to electrically separate respective control gates (e.g., control gates associated signals $WL_0$-$WL_M$ in FIG. 3C) of memory device 200 from each other in the Z-direction. For example, the level dielectric material 421 between levels 364 and 366 in FIG. 4A can be formed to electrically separate a control gate on level 364 (e.g., the control gate associated with signal $WL_0$ in FIG. 3F) from the control gate on level 366 (e.g., the control gate associated with signal $WL_1$ in FIG. 3F).

Figure 5B:
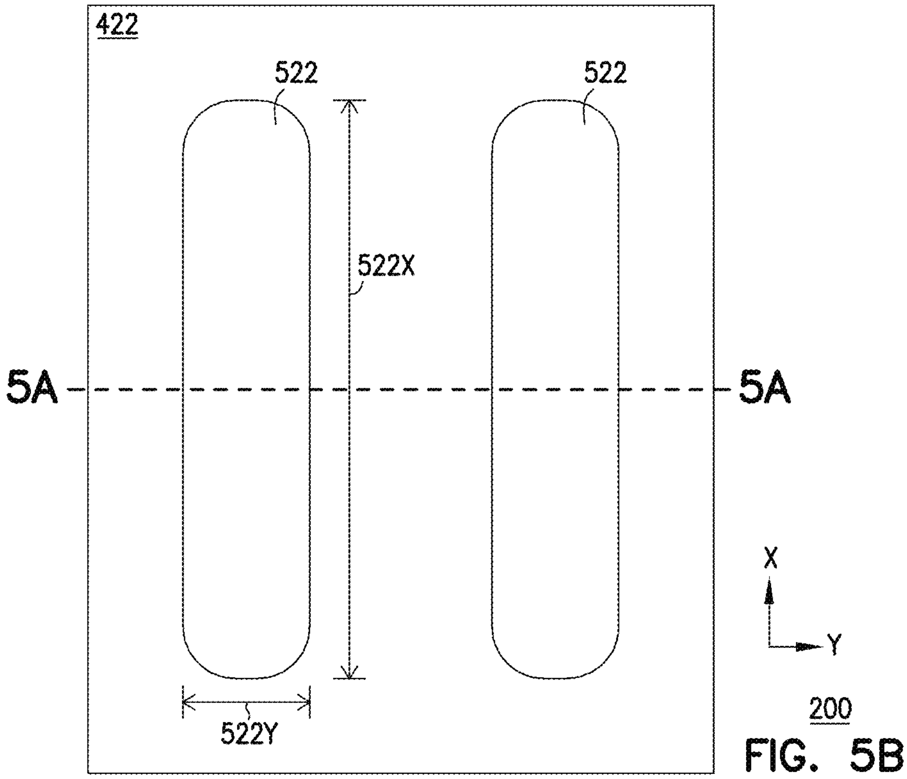
Figure 5A:
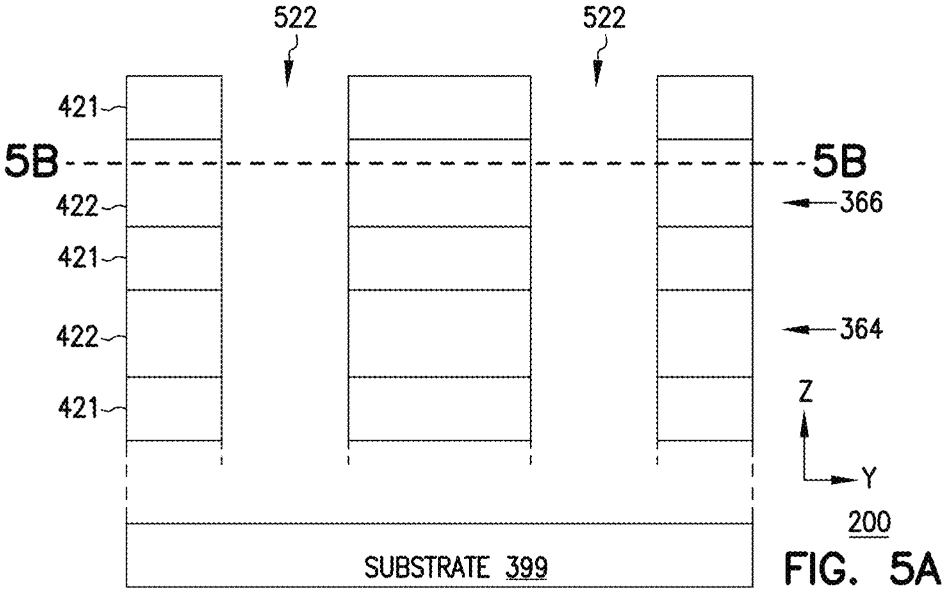

FIG. 5A and FIG. 5B show memory device 200 such that openings 522 are formed. Forming openings (e.g., slits) 522 can include removing (e.g., etching) a portion of dielectric materials 421 and 422 at the location of openings 522. As shown in FIG. 5A, each opening 522 can have a depth in the Z-direction. Each of dielectric materials 421 and 422 can have respective portions exposed at openings 522.

As shown in FIG. 5B, each opening 522 can have a boundary (e.g., perimeter with respect to a top view) that may not be a circular boundary. For example, as shown in FIG. 5B, each opening 522 can have a boundary that has rectangular shape (or rectangular-like shape) with respect to a top view (e.g., a view parallel to the X-Y plane view FIG. 5B).

As shown in FIG. 5B, each opening 522 from a top view can have a side (e.g., a length) 522X in the X-direction that is greater than a side (e.g., width) 522Y in the Y-direction. For example, the relationship between sides 522X and 522Y can be expressed as 522X=k*522Y (k times 522Y) where multiplier k is a number greater than 1. For example, k can be 2 or greater.

In subsequent processes, many transistors T of different transistors T from different tiers of memory device 200 will be formed (formed one over another in the Z-direction) at the location of each opening 522. FIG. 5A and FIG. 5B show only two openings 522 for simplicity. However, the processes associated with FIG. 5A and FIG. 5B can form numerous openings like openings 522. The number of openings 522 can be based on (e.g., equal to) the number of transistors T in one transistor group of driver circuit 240 (transistor group $240_M$ in one tier of memory device 200, as shown in FIG. 3C).

Figure 6B:
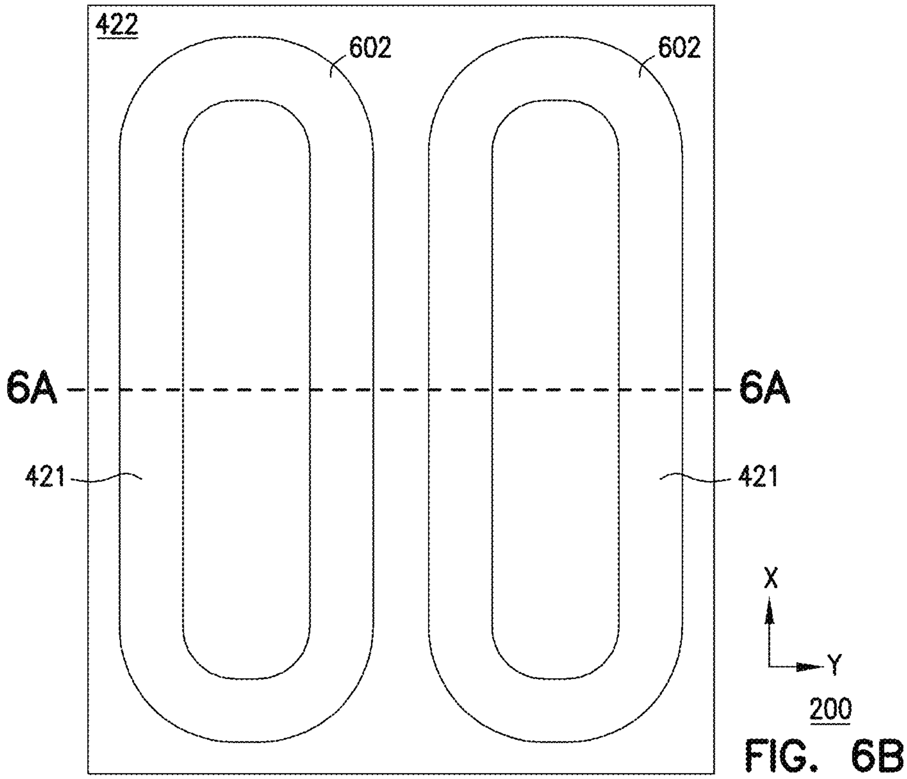
Figure 6A:
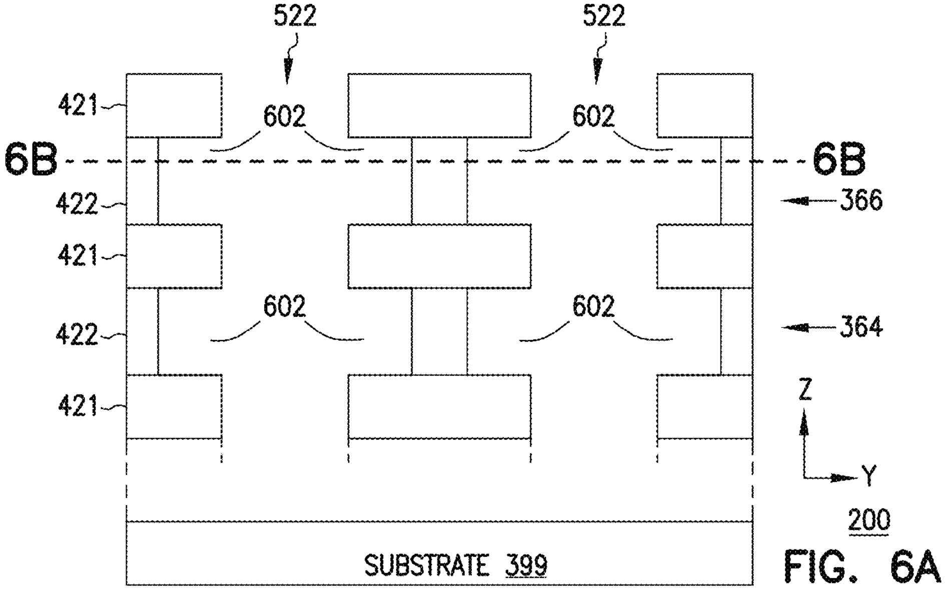

FIG. 6A and FIG. 6B show memory device 200 after recesses 602 are formed in dielectric materials 422. Forming recesses 602 can include removing (e.g., etching) respective portions of dielectric materials 422 that are exposed at openings 522 to form recesses 602.

Figure 7B:
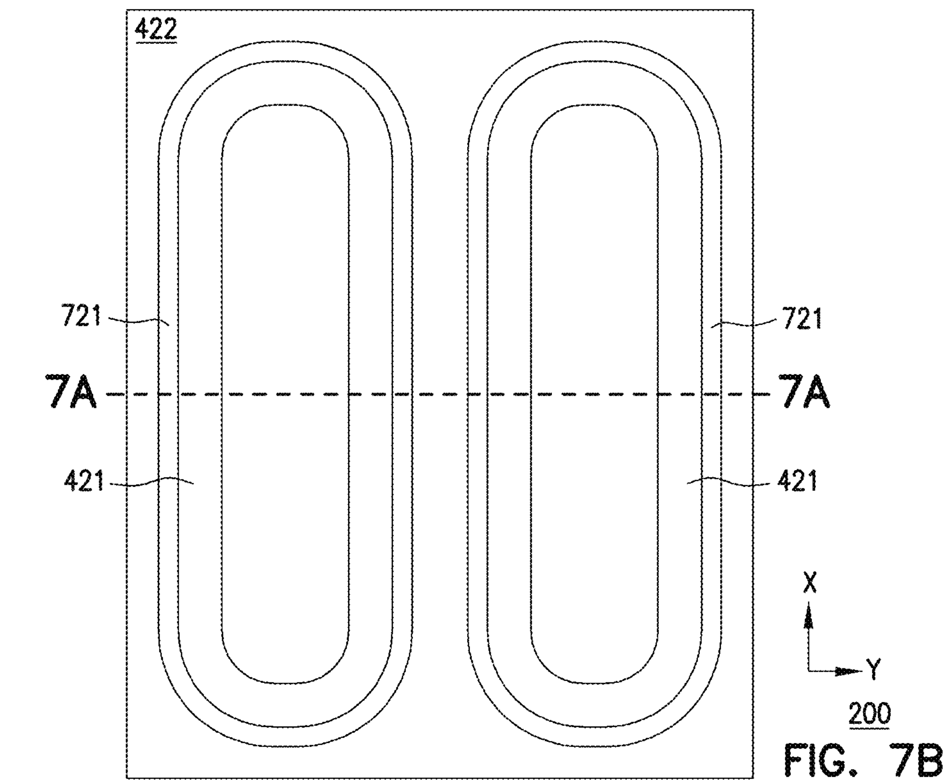
Figure 7A:
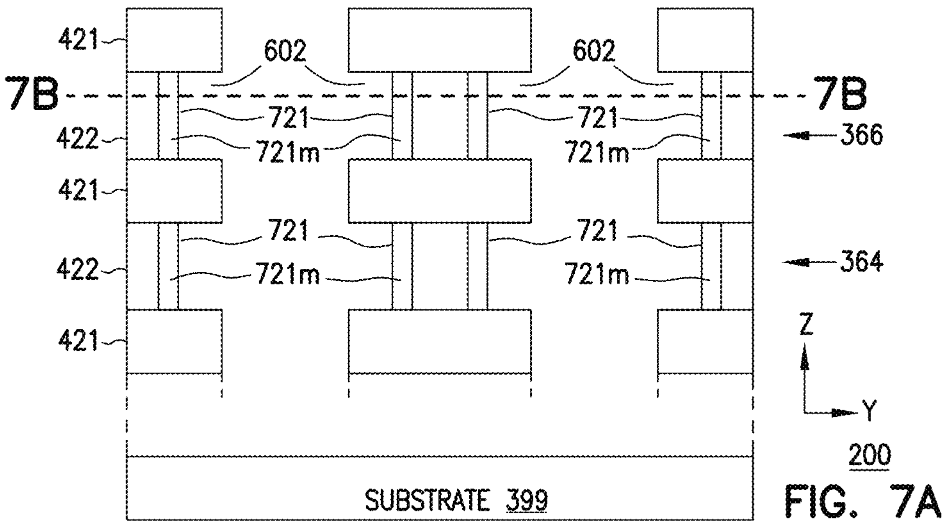

FIG. 7A and FIG. 7B show memory device 200 after dielectric liners 721 are formed in respective recesses 602. Forming dielectric liners 721 can include forming a dielectric material 721*m* on sidewalls of recesses 602. Dielectric material 721*m* can be different from dielectric material (e.g., silicon nitride) 422. For example, dielectric material 721*m* can include silicon dioxide or other dielectric material. Each dielectric liner 721 in a respective recess 602 can include a relatively thin layer of dielectric material 721*m* formed on a sidewall of recesses 602. Dielectric liners 721 are formed to separate channel regions Tch of respective transistors T (that will be subsequently formed) from dielectric materials 422 on respective levels (e.g., levels 364 and 366) of memory device 200.

Figure 8B:
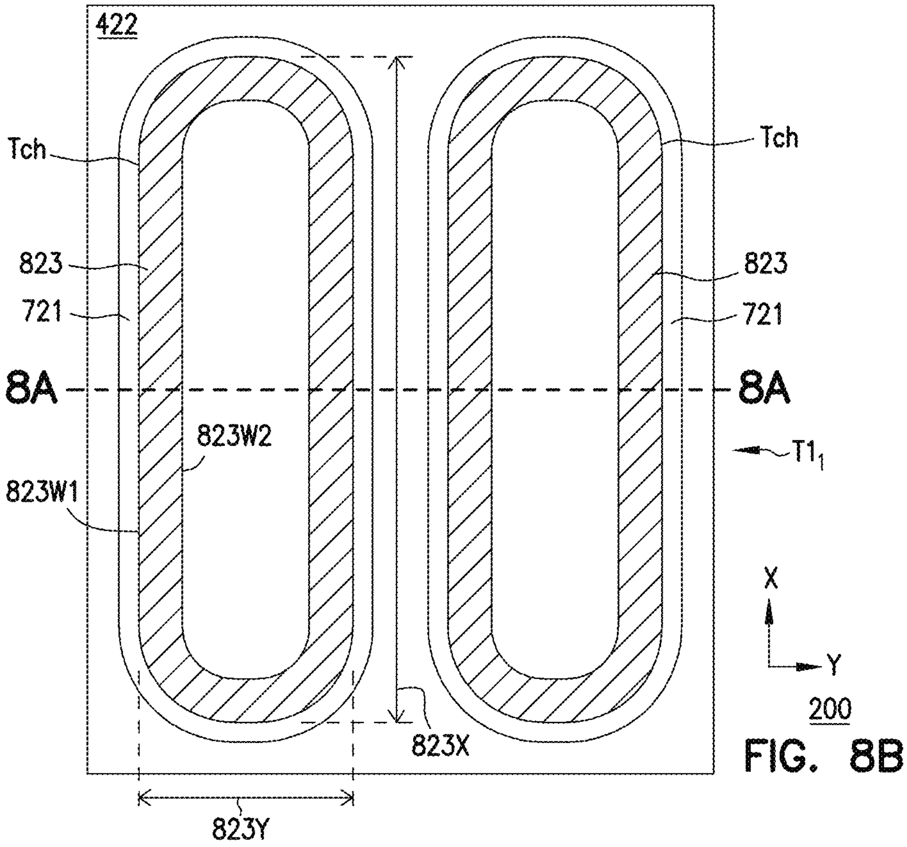
Figure 8A:
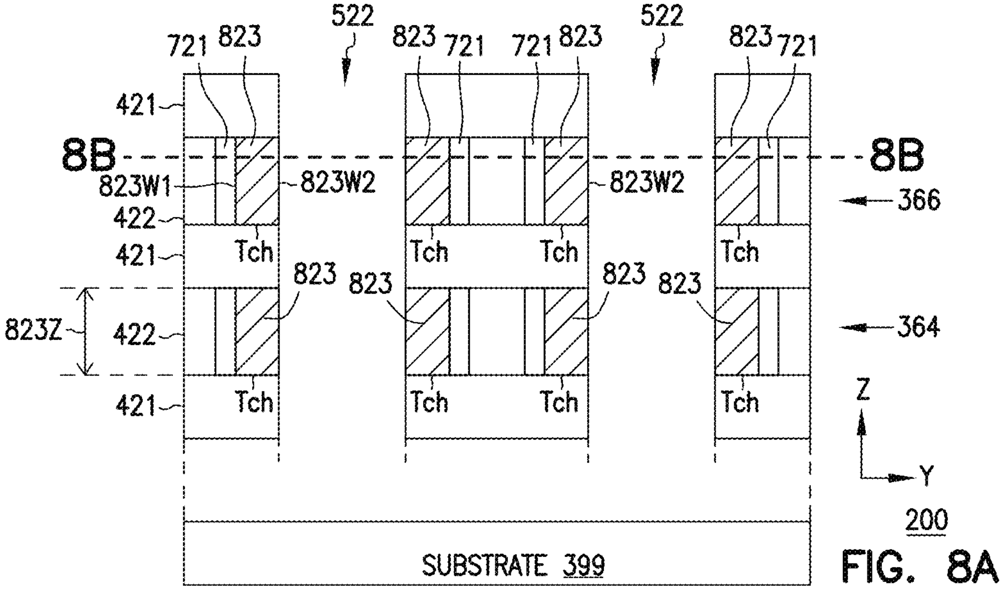

FIG. 8A and FIG. 8B show memory device 200 after channel regions Tch are formed. Forming channel regions Tch can include forming a material 823 in recesses 602 (labeled in FIG. 6A and FIG. 6B). Thus, each channel region Tch of a respective transistor T includes part of material 823. Material 823 can carry electrical current during operation of memory device 200. Material 823 can include semiconductor materials. An example of material 823 includes polysilicon. Other materials (e.g., other semiconductor materials or conductive materials) can be used for material 823.

As shown in FIG. 8A, channels Tch can stack one over another in the Z-direction (e.g., stacked vertically). Each channel region Tch can have a thickness 823Z in the Z-direction. The dimension (e.g., nanometer units) of thickness 823Z can be based on (e.g., equal to) the distance (shortest distance) between opposing edges of materials 421 that are adjacent channel region Tch (e.g., edges adjacent top and bottom in the Z-direction of channel region Tch). Thus, thickness 823Z can also be the same (or substantially the same) as the thickness (in the Z-direction) of a control gate (e.g., local word line) located on the same tier as channel region Tch.

As shown in FIG. 8B, each channel region Tch can have a sidewall (e.g., outer sidewall or outer edge) 823W1 and a sidewall (e.g., inner sidewall or inner edge) 823W2 with respect to a top view (e.g., cross-section parallel to the X-Y plan view FIG. 5B). Sidewalls 823W1 and 823W2 can have shapes like the shape of openings 522 in FIG. 5B. Thus, as shown in FIG. 8B, each channel region Tch from a top view can have a side (e.g., a length) 823X in the X-direction that is greater than a side (e.g., width) 823Y in the Y-direction. For example, the relationship between sides 823X and 823Y (e.g., dimension of side 823X relative to side 823Y) can be expressed as 823X=L*823Y (L times 823Y) where multiplier L is a number greater than 1. For example, L can be 2 or greater.

FIG. 8A shows that material 823 of channel regions Tch may fill (may completely fill) recesses 602. However, recesses 602, material 823, or both, may be formed such that material 823 may not fill (e.g., may not completely fill) recesses 602.

Figure 8C:
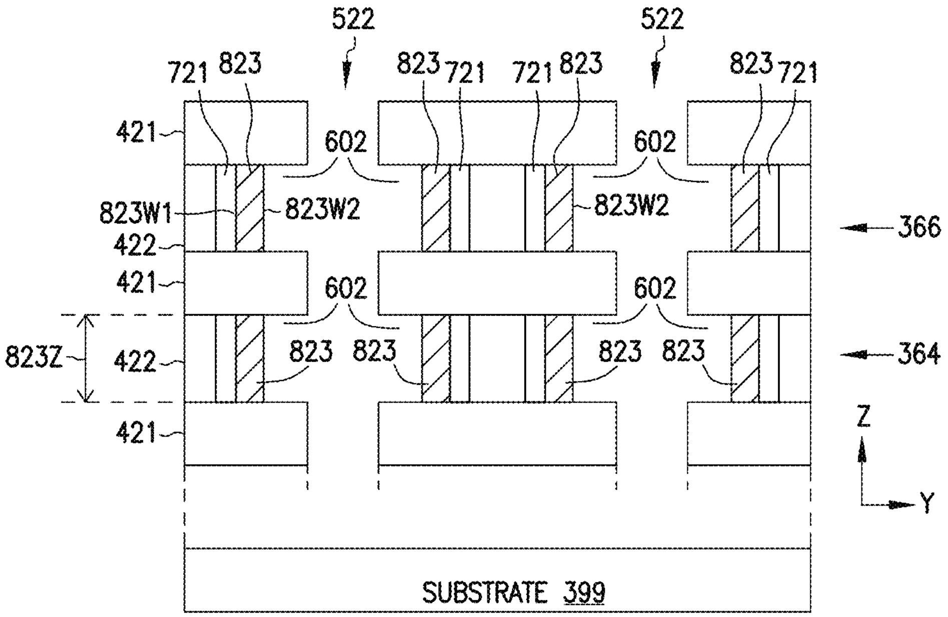

FIG. 8C shows memory device 200 in which alternative processes can be performed to form material 823 of channel regions Tch in recesses 602, such that material 823 may not fill (e.g., may not completely fill) recesses 602. As shown in FIG. 8C, each of recesses 602 can have a space (unoccupied room) after material 823 is formed. An additional material (e.g., dielectric material 921 in FIG. 9C) may be formed in such a space in a respective recess 602 in subsequent processes (associated with FIG. 9C). Thus, in the alternative processes of FIG. 8C, recesses 602 may be formed deep enough (e.g., laterally in the X-Y directions) to accommodate both material 823 (FIG. 8C) of channel regions Tch and an additional material (e.g., dielectric material 921 in FIG. 9C) in recesses 602.

Figure 9B:
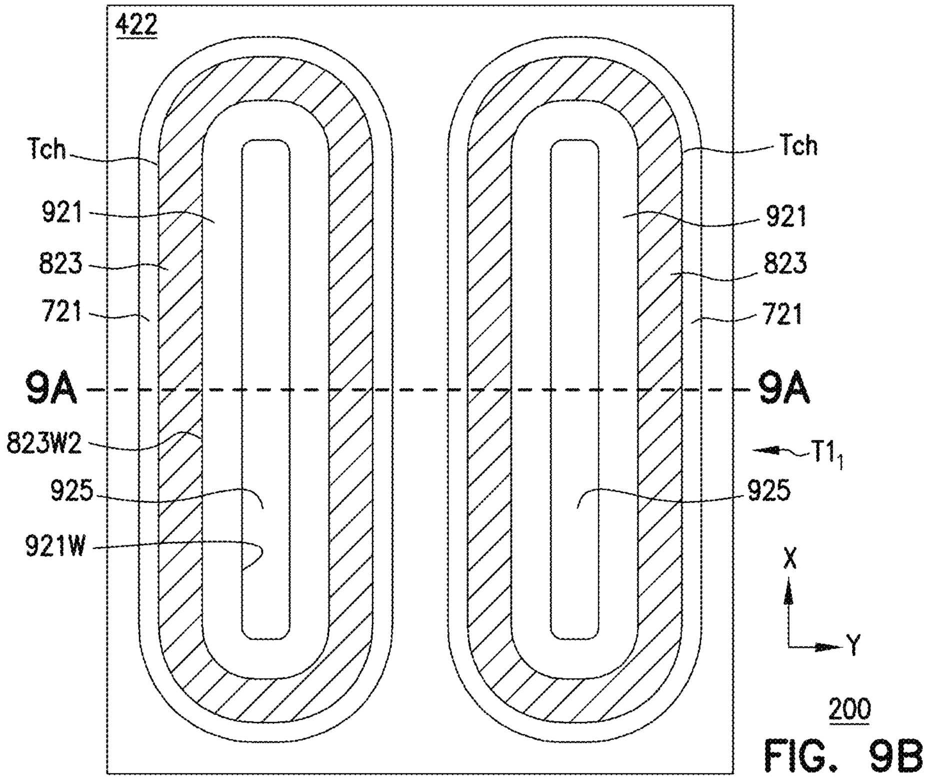
Figure 9A:
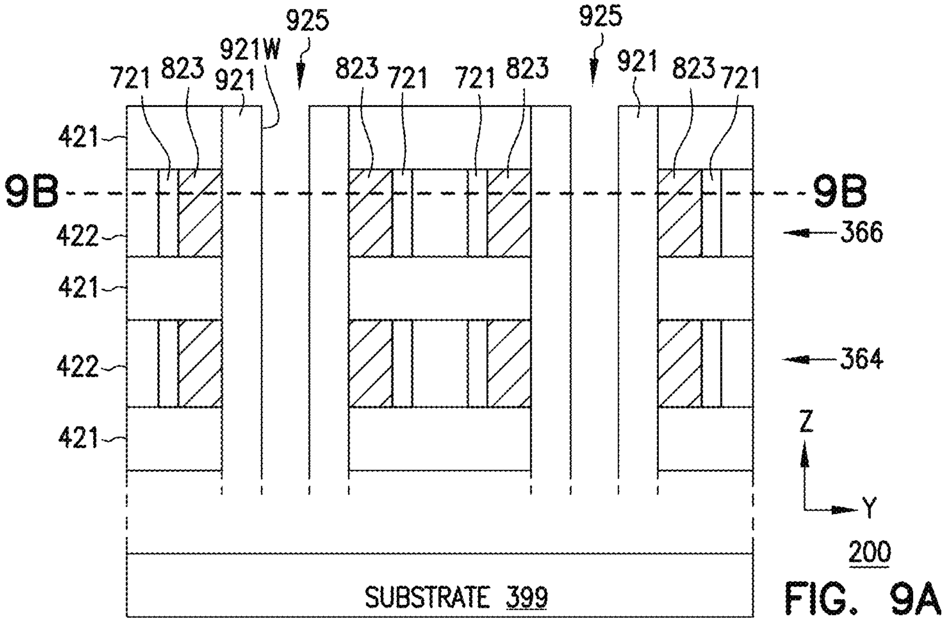

Forming each channel region Tch having the structure as shown in FIG. 8A, FIG. 8B, FIG. 8C allows driver circuit 240 to achieve a capability to appropriately drive current on control gates control gates $\mathbf{250}_0$ through $\mathbf{250}_M$ FIG. 9A and FIG. 9B continue the processes associated with FIG. 8A and FIG. 8B. FIG. 9A and FIG. 9B show memory device 200 after dielectric material 921 is formed. Dielectric material 921 can form part of (e.g., be included in) gate dielectric structure (e.g., gate oxide) of respective transistors T of driver circuit 240. As shown in FIG. 9B dielectric material 921 can be formed such that it can be conformal to sidewall 823W2 of respective channel regions Tch. Forming dielectric material 921 can include forming (e.g., depositing) a dielectric material in openings 502 (labeled in FIG. 8A), such that the dielectric material can be formed on sidewalls 823W2 of respective channel regions Tch and on respective dielectric material 421.

Dielectric material 921 can include silicon dioxide, a high-k dielectric material, a combination of silicon dioxide and other dielectric materials (e.g., a high-k dielectric material), or a combination of high-k dielectric materials. A high-k dielectric material is dielectric material that has a dielectric constant greater than the dielectric constant of silicon dioxide. An example, a high-k dielectric includes aluminum oxide (AlOx), hafnium oxide (HfOx), Zirconium oxide (ZrOx), and other high-k dielectric materials. Thus, examples of dielectric material 921 include silicon dioxide, aluminum oxide, a dielectric material having a dielectric constant greater than the dielectric constant of aluminum oxide, other high-k materials, or a combination of different (e.g., different layers of) dielectric materials.

The processes associated with FIG. 9A and FIG. 9B can also include forming openings 925 in dielectric material 921 (at the locations of openings 502), such that dielectric material 921 can have a sidewall 921W exposed at openings 925.

FIG. 9A shows that dielectric material 921 (e.g., gate oxide) may be formed outside recesses 602 (labeled in FIG. 6A). However, at least a portion of dielectric material 921 (e.g., only part of dielectric material 921 or the entire dielectric material 921) may be formed in (formed inside) recesses 602 adjacent material 823 of channel regions Tch.

Figure 9C:
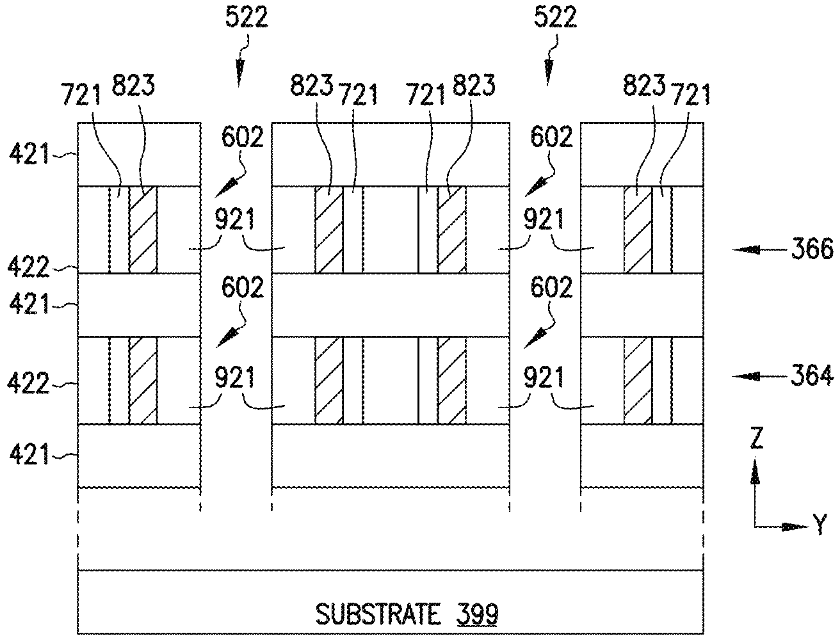

FIG. 9C shows memory device 200 in which alternative processes can be performed to form dielectric material 921 in recesses 602 adjacent material 823 of channel regions Tch in recesses 602. The alternative processes associated with FIG. 9C to form dielectric material 921 can be performed after the processes associated with FIG. 8C are performed. Thus, as shown in FIG. 8C and FIG. 9C, dielectric material 921 can be formed in the space in recesses 606 in FIG. 8C adjacent material 823 that was formed in recesses 602 in FIG. 8C.

Figure 10A:
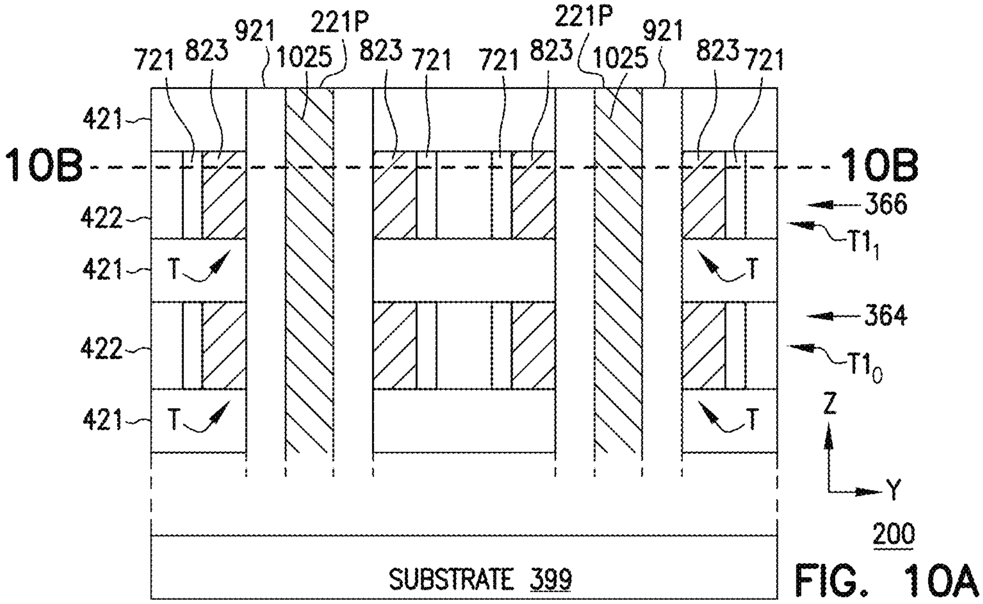

FIG. 10A and FIG. 10B continue the processes associated with FIG. 9A and FIG. 9B. FIG. 10A and FIG. 10B show memory device 200 after gate pillars 221P are formed. Gate pillars 221P can correspond to two adjacent gate pillars $\mathbf{221}P_1$, or two adjacent gate pillars $\mathbf{221}P_2$, or two adjacent gate pillars $\mathbf{221}P_3$, or two adjacent gate pillars $\mathbf{221}P_4$, or two of gate pillars $\mathbf{221}P_5$ (e.g., FIG. 3F).

Forming gate pillars 221P can include forming (e.g., depositing) conductive material 1025 in openings 925 (labeled in FIG. 9A). Conductive material 1025 can include metal (e.g., tungsten) or other conductive materials. As shown in FIG. 10A, conductive material 1025 of each gate pillar 221P is electrically separated from channel regions Tch of respective transistors T. Conductive material 1025 of each gate pillar 221P can extend (e.g., extend vertically in the Z-direction) through different tiers (e.g., through levels 364 and 366) of memory device 200. Each gate pillar 221P can extend through channel regions Tch of respective transistors T, such that each gate pillar 221P can include respective portions (on respective tiers) surrounded by channel regions Tch of respective transistors T of different tiers of memory device 200.

As shown in FIG. 10B in a top view, each gate pillar 221P can have a dimension (e.g., side) 1025X in the X-direction that is greater than a dimension (e.g., side) side 1025Y in the Y-direction. For example, the relationship between dimensions 1025X and 1025Y can be expressed as 1025X=P*1025Y (P times 1025Y) where multiplier P is a number greater than 1. For example, P can be 2 or greater.

FIG. 10A shows four transistors T (two on the left side of FIG. 10A and two on the right side of FIG. 10A). Each gate pillar 221P (which is formed from conductive material 1025) can be shared by respective transistors T of respective transistor sets (e.g., transistor sets $T\mathbf{1}_0$ and $T\mathbf{1}_i$) on different tiers (e.g., tiers on levels 364 and 366) of memory device 200. For example, two transistors T on the left side of FIG. 10A (e.g., one transistor T from each of transistor sets $T\mathbf{1}_0$ and $T\mathbf{1}_1$) can share gate pillar 221P on the left side of FIG. 10A (e.g., one transistor T from each of transistor sets $T\mathbf{1}_0$ and $T\mathbf{1}_1$). Two transistors T on the right side of FIG. 10A (e.g., one transistor T from each of transistor sets $T\mathbf{1}_0$ and $T\mathbf{1}_1$) can share gate pillar 221P on the right side of FIG. 10A (e.g., one transistor T from each of transistor sets $T\mathbf{1}_0$ and $T\mathbf{1}_1$).

Figure 10C:
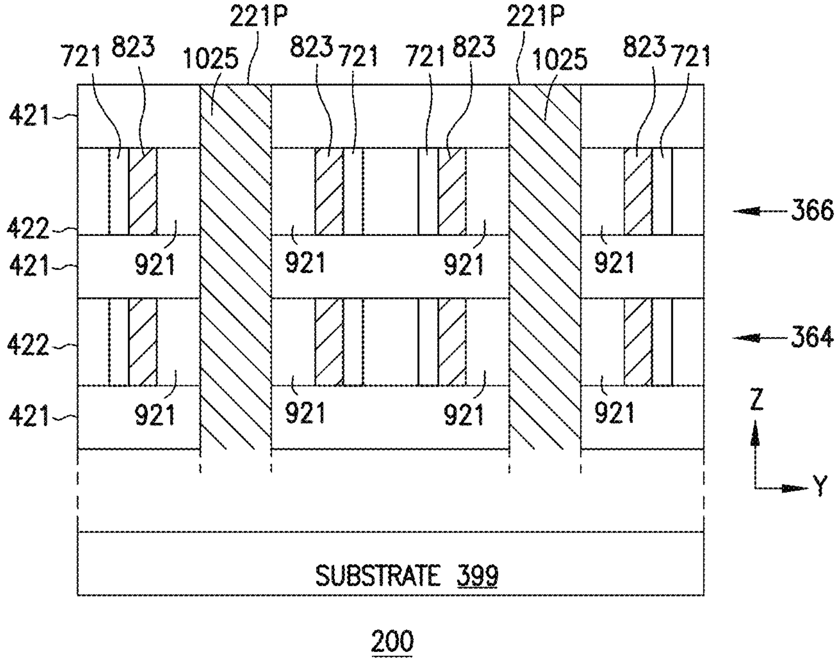

FIG. 10C shows memory device 200 in which alternative processes can be performed to form conductive material 1025 of each gate pillar 221P. Conductive material 1025 may be adjacent (e.g., contact) dielectric material 921 at respective portions (e.g., not at the entire length) of conductive material 1025. In comparison with FIG. 10A, conductive material 1025 may be adjacent (e.g., contact) dielectric material 921 along most of the length (in the Z-direction) of conductive material 1025. The alternative processes associated with FIG. 10C to form conductive material 1025 can be performed after the processes associated with FIG. 9C are performed.

Figure 11B:
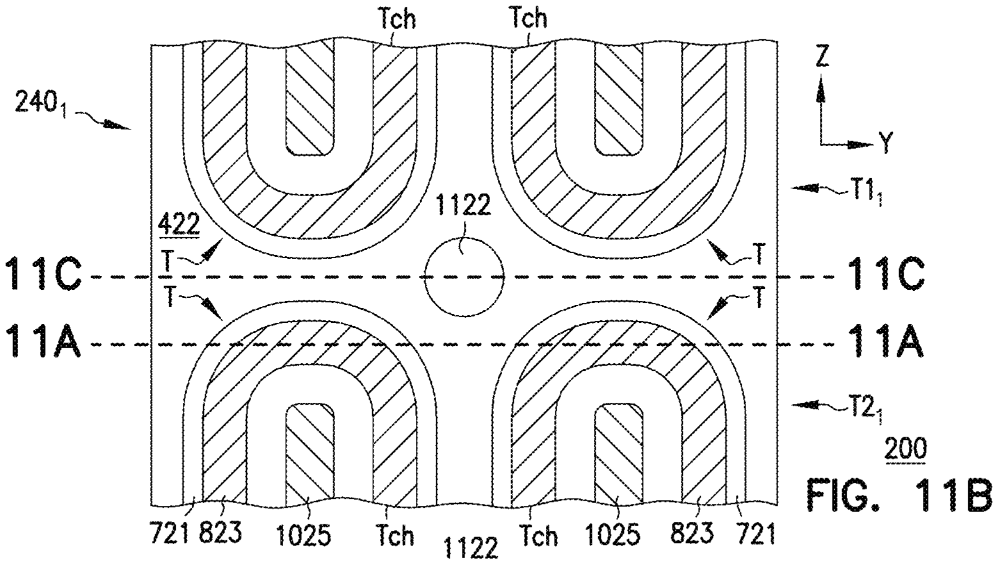
Figure 11C:
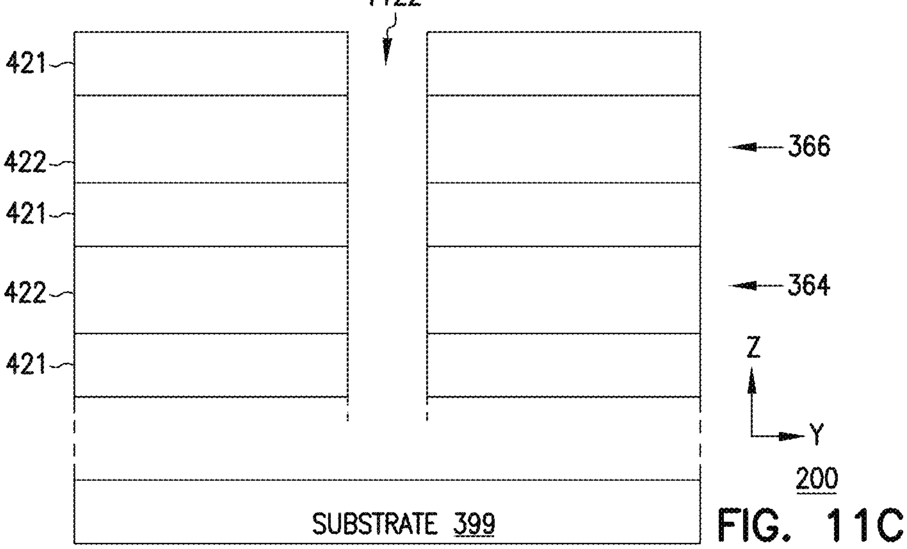
Figure 11A:
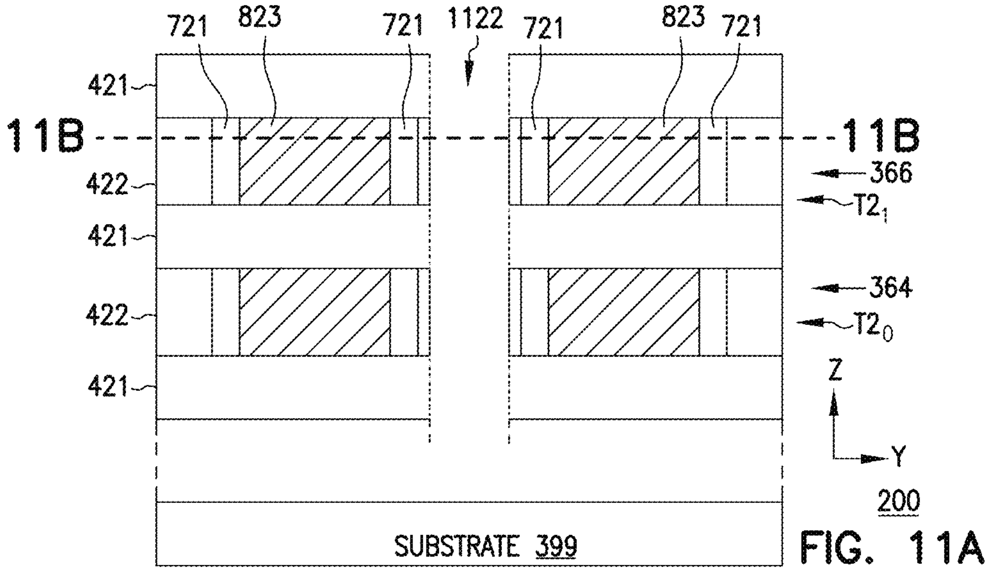

FIG. 11A, FIG. 11B, and FIG. 11C show memory device 200 after an opening 1122 is formed. FIG. 11B and FIG. 11C show different side views (e.g., different cross-sections) taken along lines 11A-11A and 11C-11C, respectively, of FIG. 11B. Opening 1122 can be a hole formed in dielectric materials 421 and 422. As shown in FIG. 11B, opening 1122 can be formed at a location between four channel regions Tch of four respective transistors T of two different transistor sets (e.g., transistor sets $T\mathbf{1}_1$ and $T\mathbf{2}_1$ in FIG. 11B) of each of the transistor groups (only a portion of transistor group $\mathbf{240}_1$ is shown in FIG. 11B). FIG. 11A, FIG. 11B, and FIG. 11C show one opening 1122 for simplicity. However, the processes associated with FIG. 11A, FIG. 11B, and FIG. 11C include forming many other openings like opening 1122 in which conductive joints 242 will be formed at respective locations of the other openings.

Forming opening (e.g., hole) 1122 can include removing (e.g., etching) a portion of dielectric materials 421 and 422 at the location of opening 1122. As shown in FIG. 11C, each opening 1122 can have a depth in the Z-direction (FIG. 11A) and a boundary (e.g., perimeter with respect to a top view) that can have a circular shape. Opening 1122 (and other openings like opening 1122) can be formed concurrently (e.g., simultaneously, in the same process step) with openings (e.g., slits) 522 of FIG. 5A and FIG. 5B. Alternatively, opening 1122 (and other openings like opening 1122) and openings 522 can be formed at different times (e.g., in different process steps). For example, opening 1122 (and other openings like opening 1122) can be formed before or after openings 522 are formed.

Figure 12B:
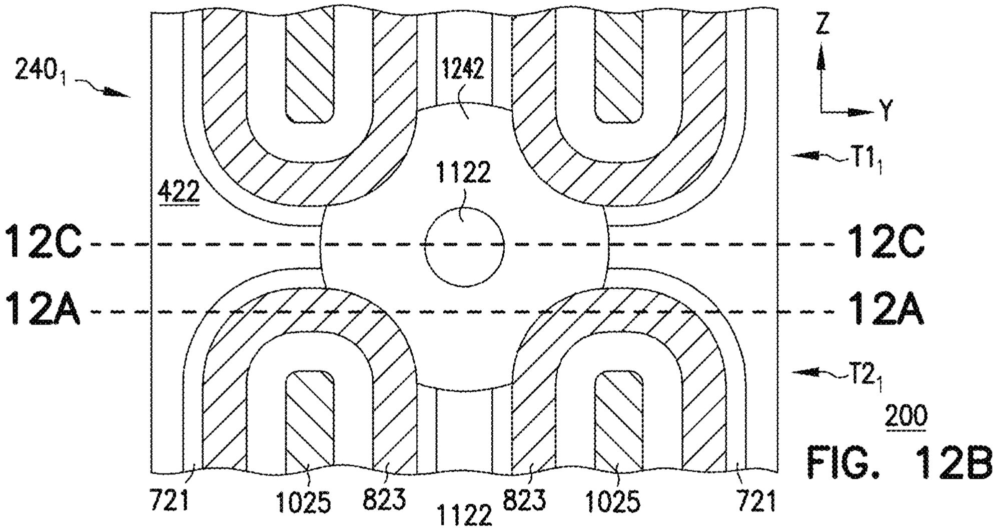
Figure 12C:
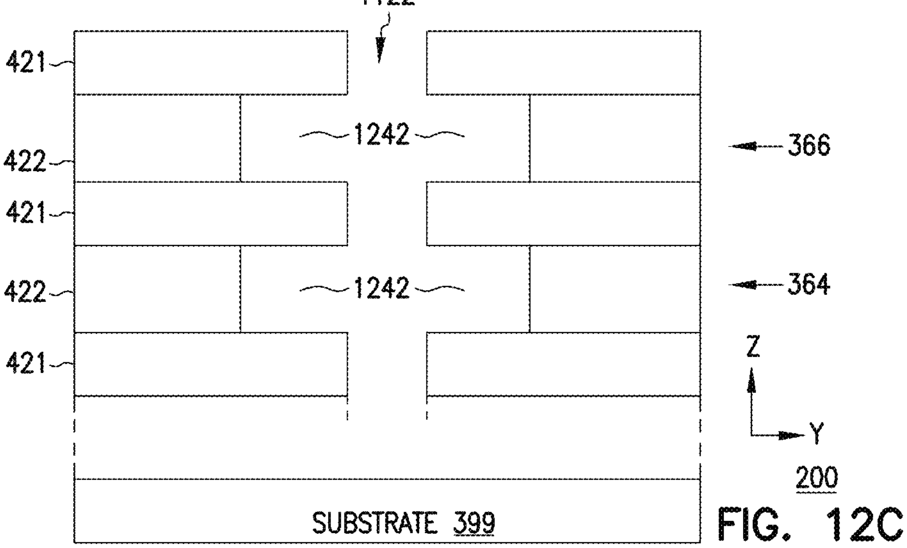
Figure 12A:
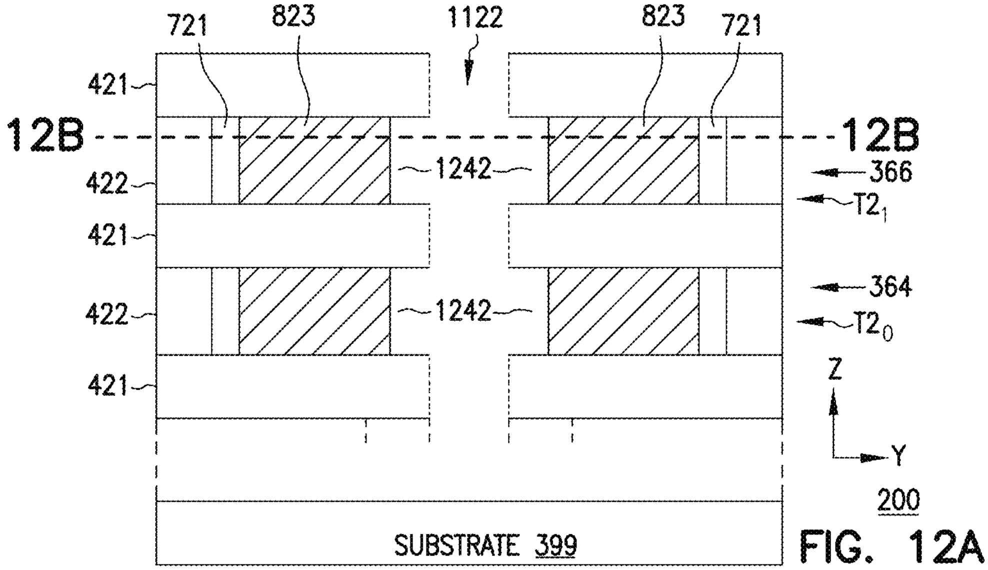

FIG. 12A, FIG. 12B, and FIG. 12C show memory device 200 after recesses 1242 are formed in conductive materials 823 through recess 1242. Forming recesses 1242 can include removing (e.g., etching) respective portions of conductive materials 823 (channel regions Tch) at the locations of recesses 1242. As shown in FIG. 12C, the remaining portion of material 823 (channel regions Tch) of four adjacent transistors T (FIG. 12B) on the same tier (e.g., level 366) of memory device 200 is exposed at opening 1122.

Figure 13B:
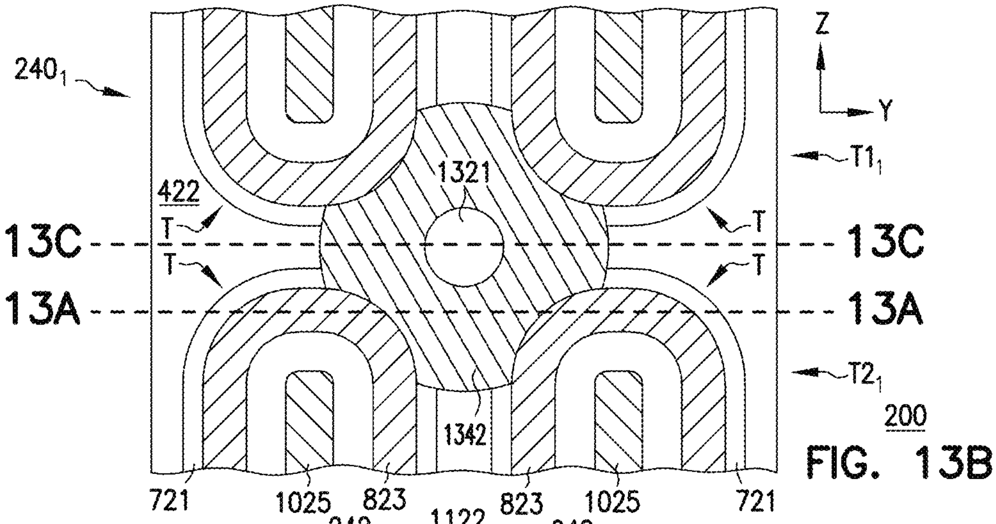
Figure 13C:
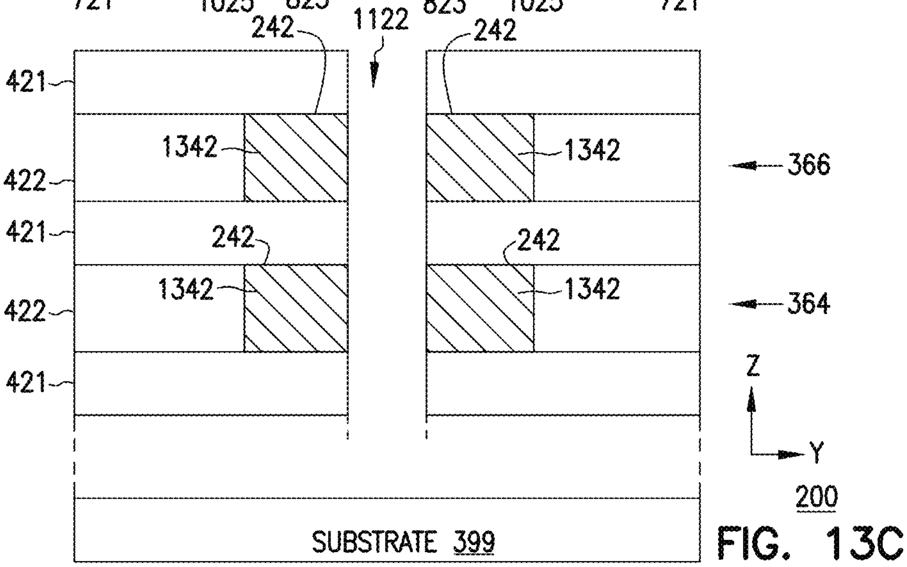
Figure 13A:
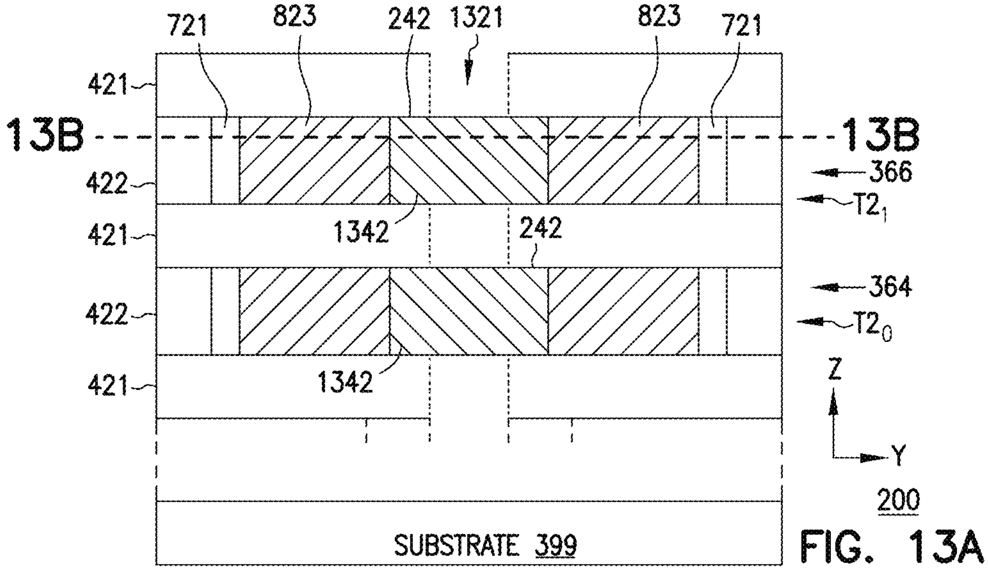

FIG. 13A, FIG. 13B, and FIG. 13C show memory device 200 after a conductive joint 242 is formed in recesses 1242 (labeled in FIG. 12A and FIG. 12B). As shown FIG. 13A and FIG. 13B, conductive joint 242 and other conductive joints 242 (not shown) in a respective tier of memory device 200 can be formed in respective regions (e.g., locations) between adjacent channel regions Tch in dielectric material 422 of a respective tier that are different from the regions in dielectric material 422 where channel regions Tch are formed.

Forming conductive joint 242 can include forming (e.g., depositing) a conductive material 1342 in recesses 1242. The material of conductive joint 242 can be the same or can be different from the material of channel region Tch. An example of material 1342 includes polysilicon. Other materials (e.g., conductive materials) can be used. As shown in FIG. 13A and FIG. 13B, conductive material 1342 of conductive joint 242 can contact (can be electrically in contact with) material 823 of a number (e.g., four) of adjacent channel regions Tch of respective transistors T. The processes associated with FIG. 13A, FIG. 13B, and FIG. 13C can also including forming an opening 1321 in conductive material 1342.

Figure 14B:
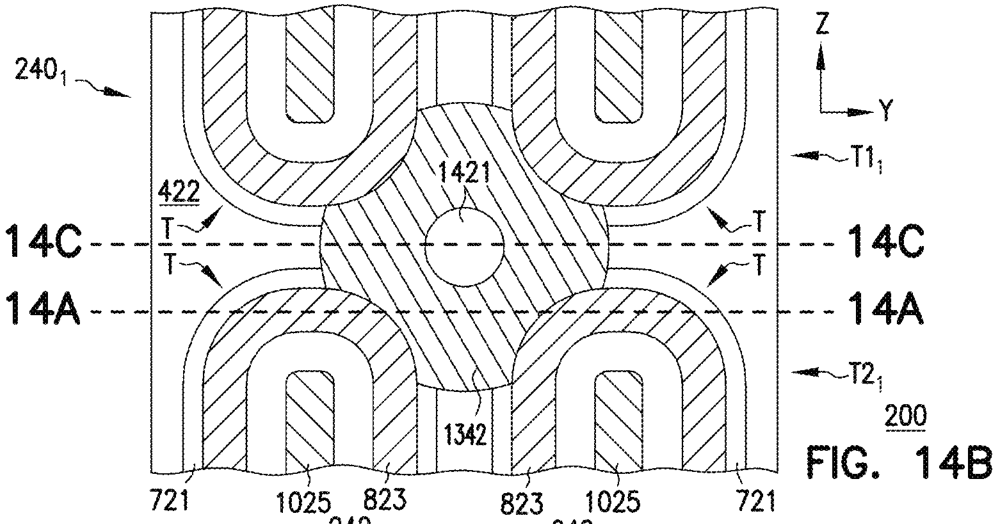
Figure 14C:
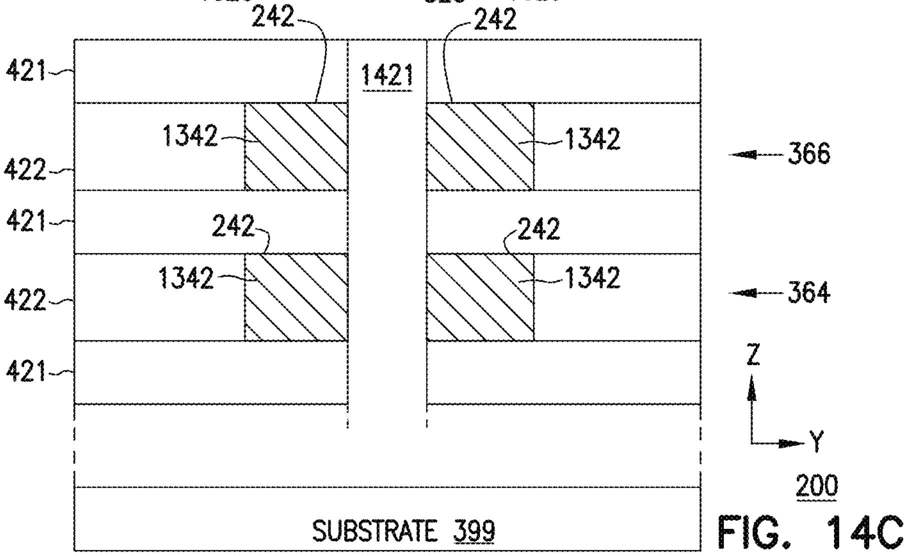
Figure 14A:
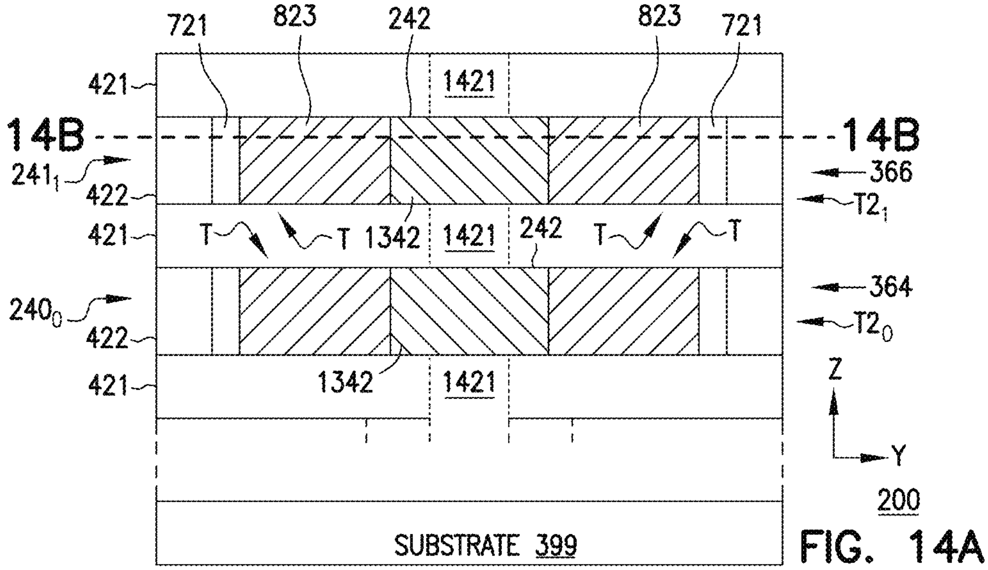

FIG. 14A, FIG. 14B, and FIG. 14C show memory device 200 after a dielectric material (e.g., silicon dioxide) 1421 is formed (e.g., filled) in opening 1321.

Thus, the processes described above with reference to FIG. 4A through FIG. 14B form transistors T and conductive joints 242 of the transistor groups of driver circuit 240 on respective tiers of memory device 200. For example, as shown in FIG. 14A, transistors T and conductive joints 242 of respective transistor groups 240$_0$ and 240$_1$ are formed on respective tiers on respective level 364 and 366.

FIG. 15A and FIG. 15B through FIG. 18A and FIG. 18B show processes of forming conductive regions (e.g., conductive regions 250R$_0$, 250R$_1$, and 250R$_M$ in FIG. 3C, FIG. 3D, and FIG. 3E, respectively) to electrically couple respective transistor groups (e.g., transistor group 240$_M$, 240$_1$, and 240$_0$ in FIG. 3C, FIG. 3D, and FIG. 3E, respectively) to respective control gates (e.g., control gate 250$_M$, 250$_1$, and 250$_0$ in FIG. 3C, FIG. 3D, and FIG. 3E, respectively) of memory device 200.

Figures 15A, 15B:
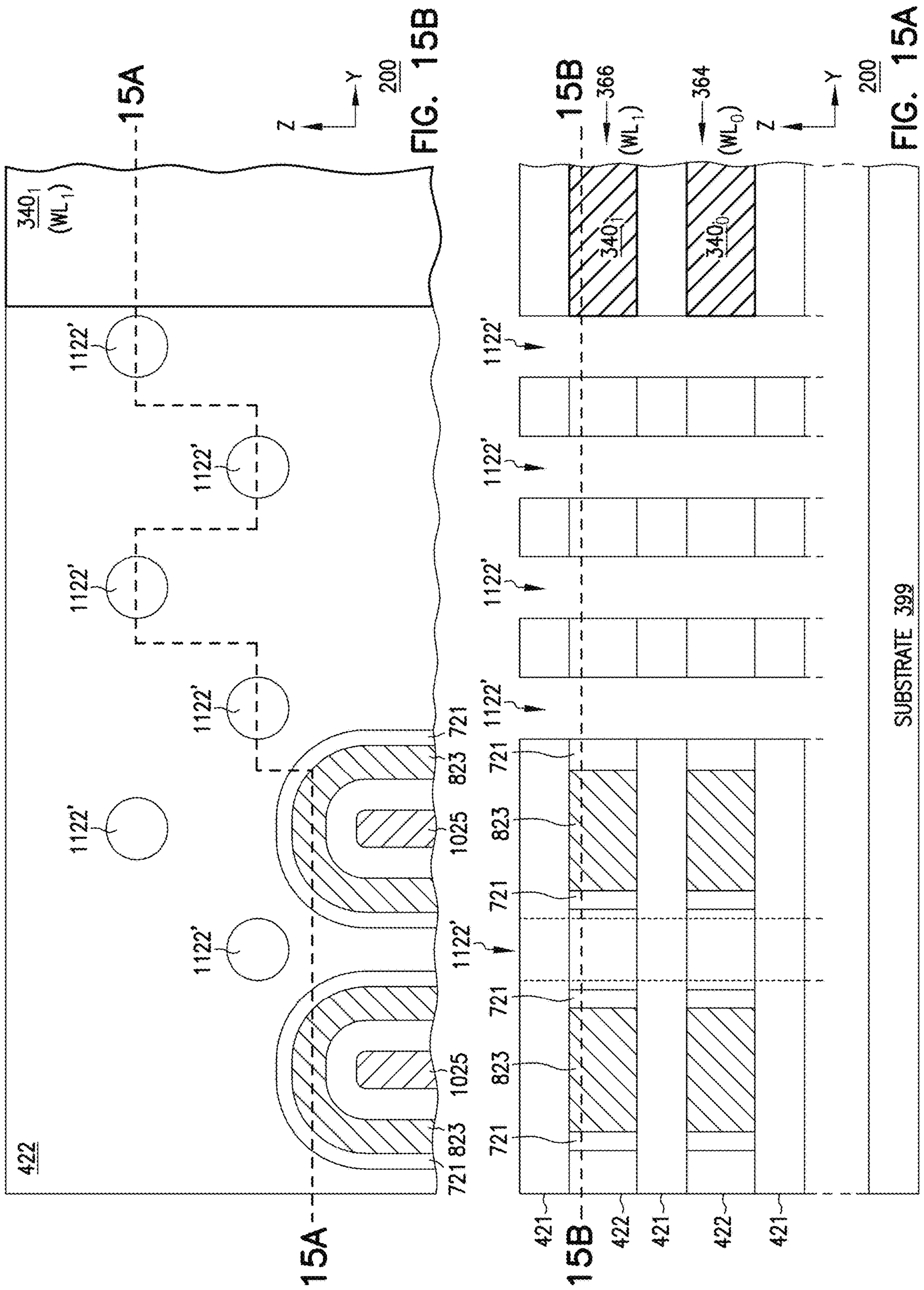

FIG. 15A and FIG. 15B show memory device 200 after openings (e.g., holes) 1122' are formed. Forming openings 1122' can be similar to (or the same as) forming opening 1122 of FIG. 11. Opening 1122' and opening 1122 (FIG. 11A and FIG. 11B) can be formed concurrently (e.g., simultaneously, in the same process step), or alternatively formed at different times (e.g., in different process steps).

Opening 1122' can be formed concurrently (e.g., simultaneously, in the same process step) with openings (e.g., slits) 522 of FIG. 5A and FIG. 5B. Alternatively, opening 1122' and openings 522 can be formed at different times (e.g., in different process steps). For example, opening 1122' can be formed before or after openings 522 are formed.

Figure 16B:
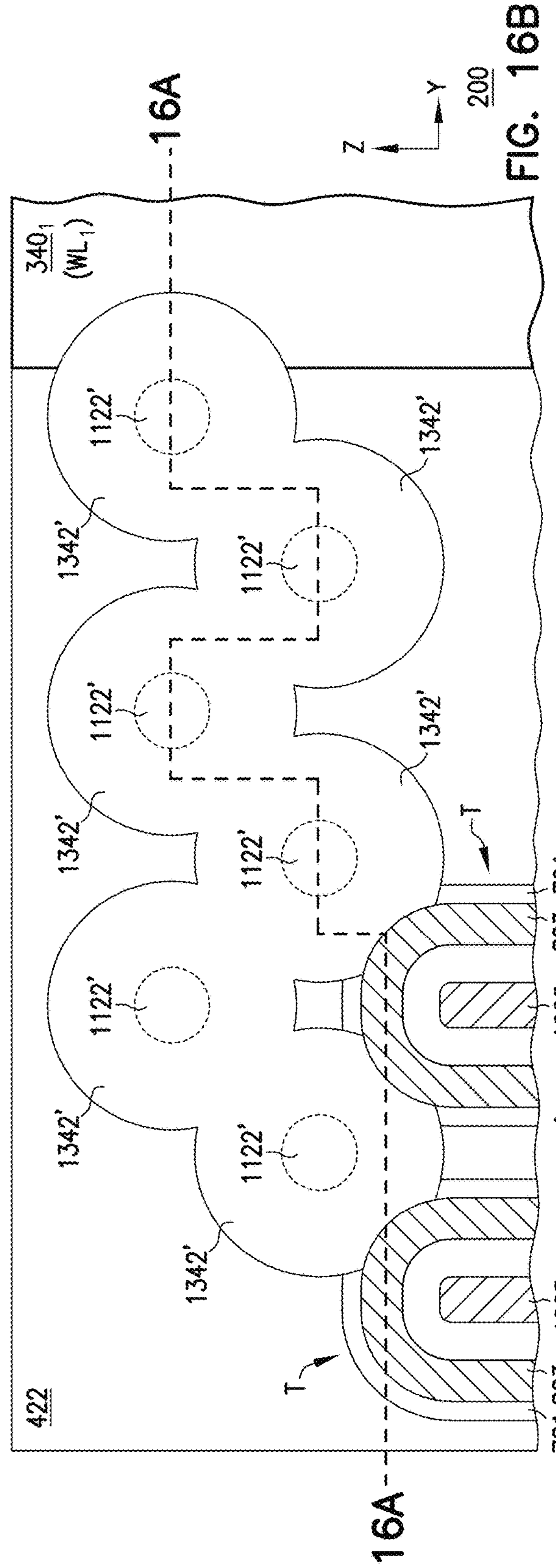
Figure 16A:
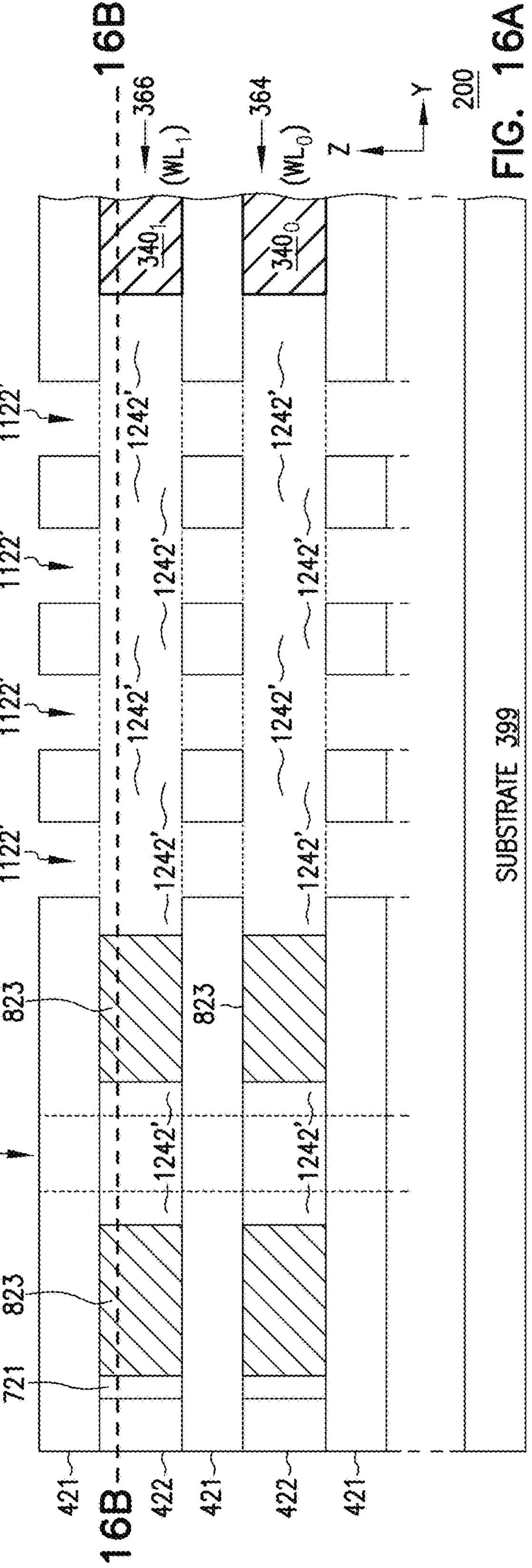

FIG. 16A and FIG. 16B show memory device 200 after recesses 1242' are formed in conductive materials 823 through openings 1122'. Forming recesses 1242' can include removing (e.g., etching) respective portions of conductive materials 823 at the locations of recesses 1242'. As shown in FIG. 16B, material 823 (channel regions Tch) of some (e.g., two) of transistors T can be exposed at some (e.g., two) of recesses 1242' on respective tier (e.g., levels 364 and 366) of memory device 200.

Figure 17B:
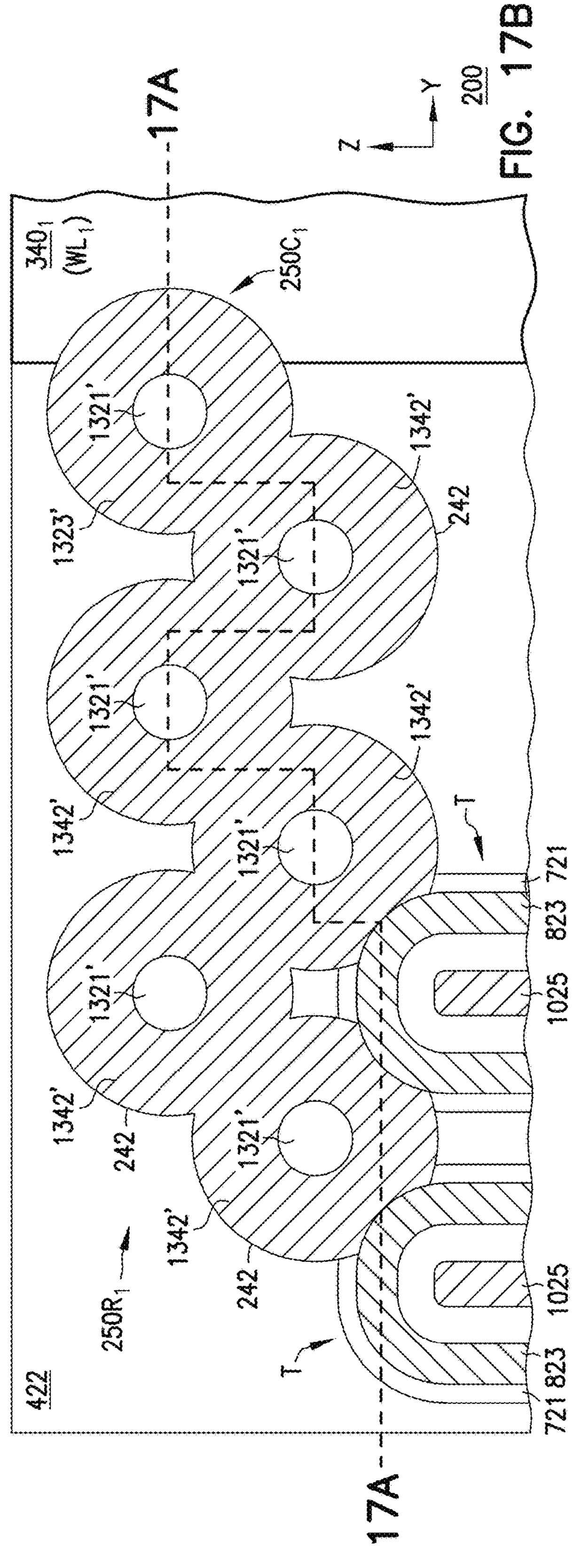
Figure 17A:
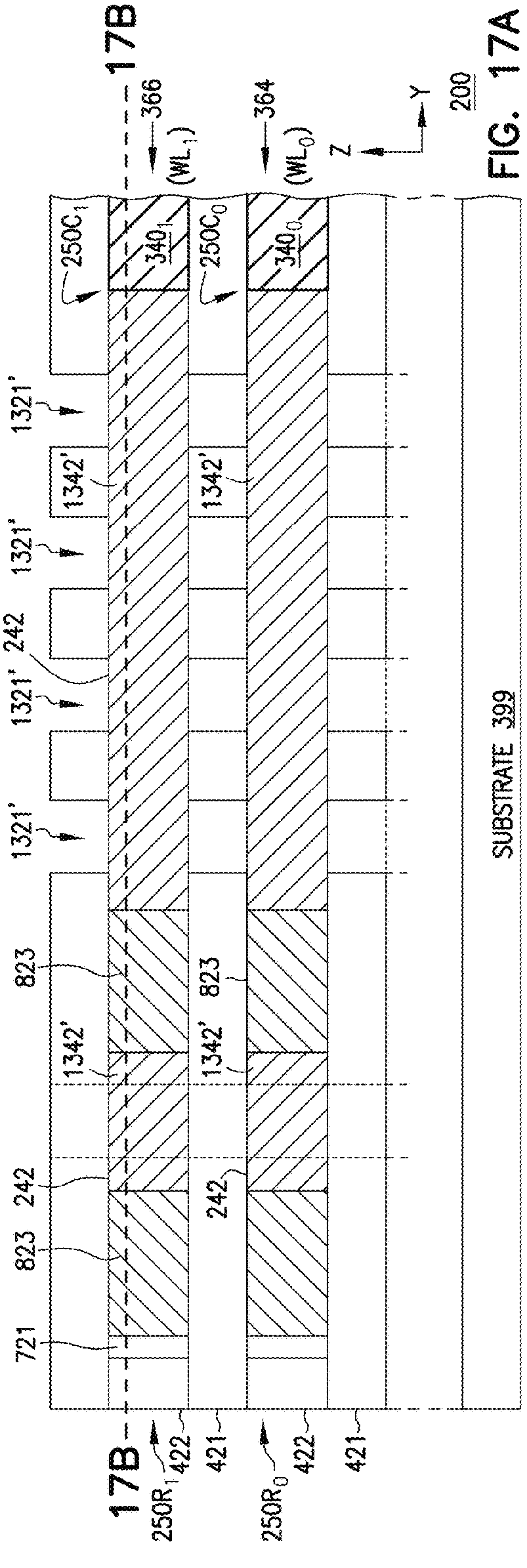

FIG. 17A and FIG. 17B show memory device 200 after conductive regions 250R$_1$ and 250R$_0$ are formed. Other conductive regions (e.g., conductive region 250R$_M$, not shown) are also formed concurrently with conductive regions 250R$_1$ and 250R$_0$. As shown in FIG. 17A and FIG. 17B, forming conductive regions 250R$_1$ and 250R$_0$ can include forming conductive joints 242 in recesses 1242' (labeled in FIG. 16A and FIG. 16B). Forming conductive joints 242 can include forming (e.g., depositing) a conductive material 1342' in recesses 1242'. Conductive material 1342' can be similar to or the same as conductive material 1342 of FIG. 13. As shown in FIG. 17A and FIG. 17B, on level 366, conductive material 1342' of conductive regions 250R$_1$ can contact both material 823 (channel regions Tch of respective transistors T) and conductive material 340$_1$ (at contact location 250C$_1$) of the control gate associated with signal $WL_1$. Similarly, on level 364, conductive material 1342' of conductive regions 250R$_0$ can contact both material 823 (channel regions Tch of respective transistors T) and conductive material 340$_0$ (at contact region 250C$_0$) of the control gate associated with signal $WL_0$.

The processes associated with FIG. 17A and FIG. 17B can also include forming an opening 1321' in conductive material 1342'.

Figure 18B:
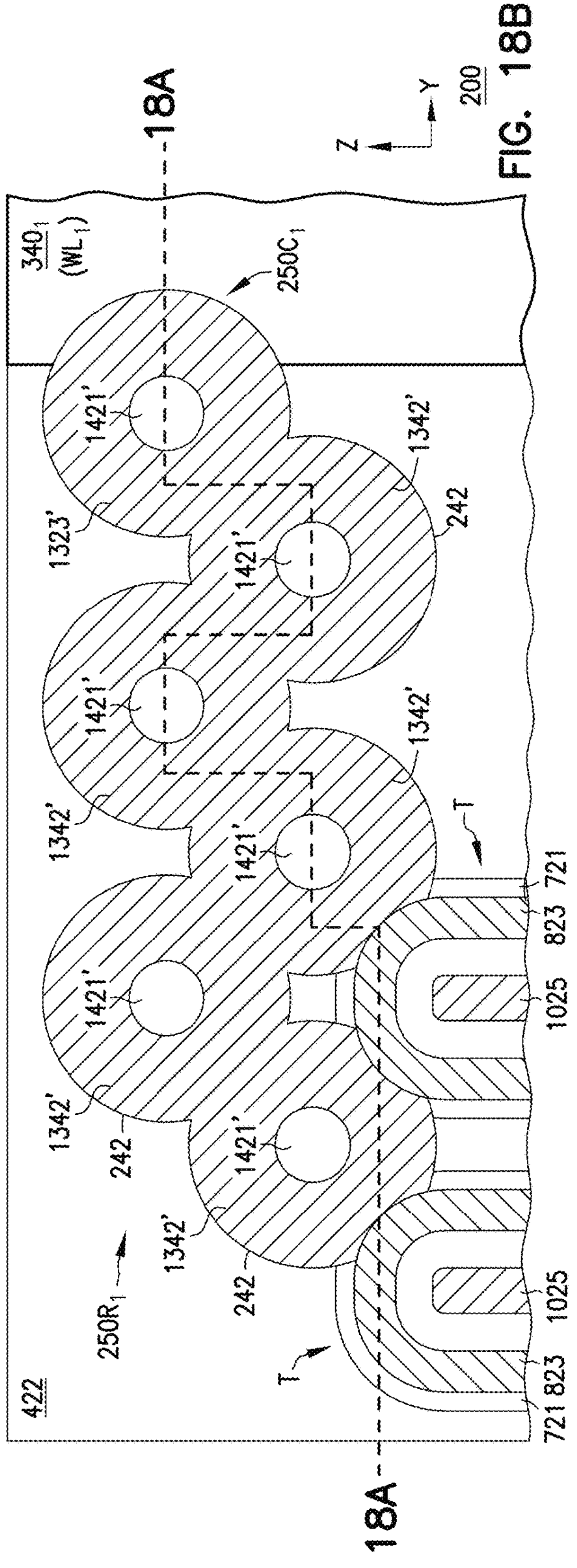
Figure 18A:
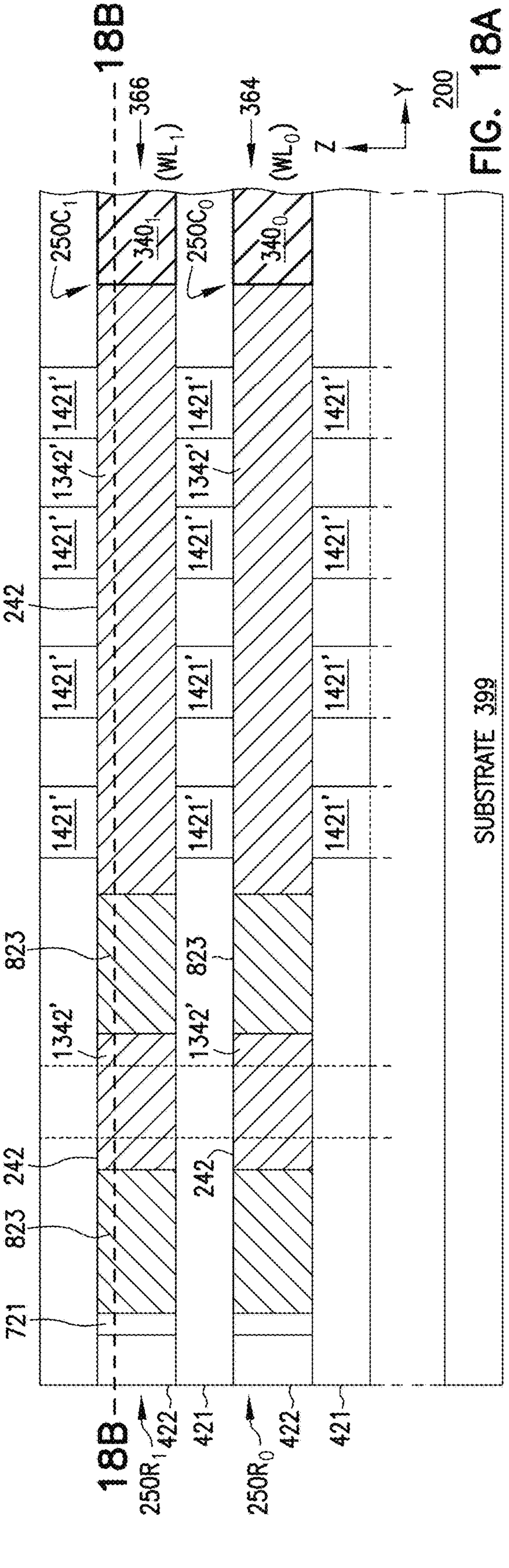

FIG. 18A and FIG. 18B show memory device 200 after a dielectric material 1421' (e.g., silicon dioxide) is formed (e.g., filled) in opening 1321'.

FIG. 19A and FIG. 19B through FIG. 22A and FIG. 22B show processes of forming conductive regions (e.g., conductive regions 255R$_0$, 255R$_1$, and 255R$_M$ in FIG. 3C, FIG. 3D, and FIG. 3E, respectively) to electrically couple respective transistor groups (e.g., transistor group 240$_M$, 240$_1$, and 240$_0$ in FIG. 3C, FIG. 3D, and FIG. 3E, respectively) to respective control gates (e.g., control gate 250$_M$, 250$_1$, and 250$_0$ in FIG. 3C, FIG. 3D, and FIG. 3E, respectively) of memory device 200.

The processes associated with FIG. 19A through FIG. 22B can be performed concurrently with the processes associated with FIG. 15A and FIG. 18B or alternatively performed before or after the processes associated with FIG. 15A and FIG. 18B.

Figures 19A, 19B:
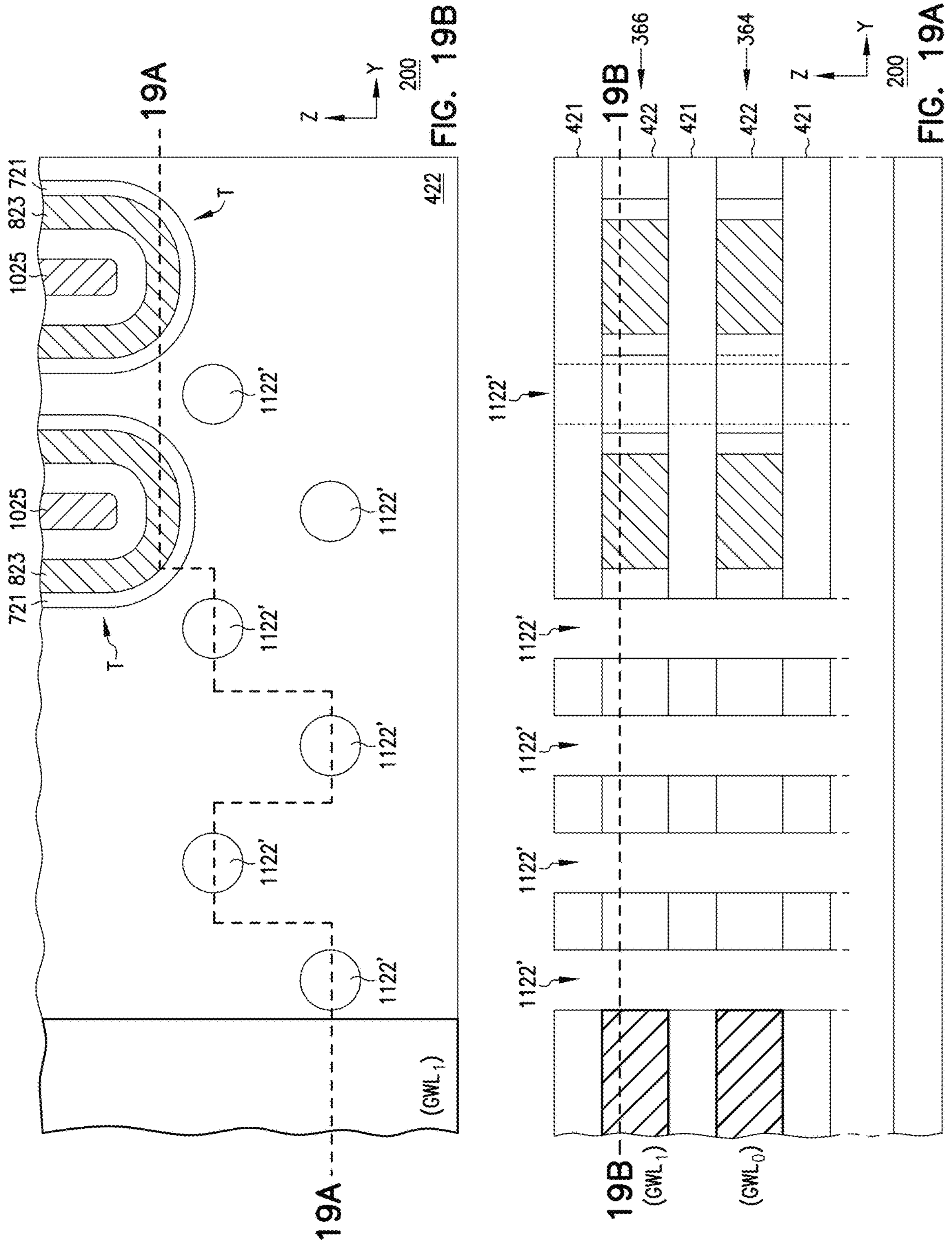

FIG. 19A and FIG. 19B show memory device 200 after openings (e.g., holes) 1122' are formed. Forming openings 1122' can be similar to (or the same as) forming opening 1122 of FIG. 11A and FIG. 11B, and FIG. 15A and FIG. 15B. Opening 1122' of FIG. 19A and opening 1122 (FIG. 11A and FIG. 11B) can be formed concurrently (e.g., simultaneously, in the same process step), or alternatively formed at different times (e.g., in different process steps).

Opening 1122' of FIG. 19A can be formed concurrently (e.g., simultaneously, in the same process step) with openings (e.g., slits) 522 of FIG. 5A and FIG. 5B. Alternatively, opening 1122' of FIG. 19A and openings 522 can be formed at different times (e.g., in different process steps). For example, opening 1122' of FIG. 19A can be formed before or after openings 522 are formed.

Figure 20B:
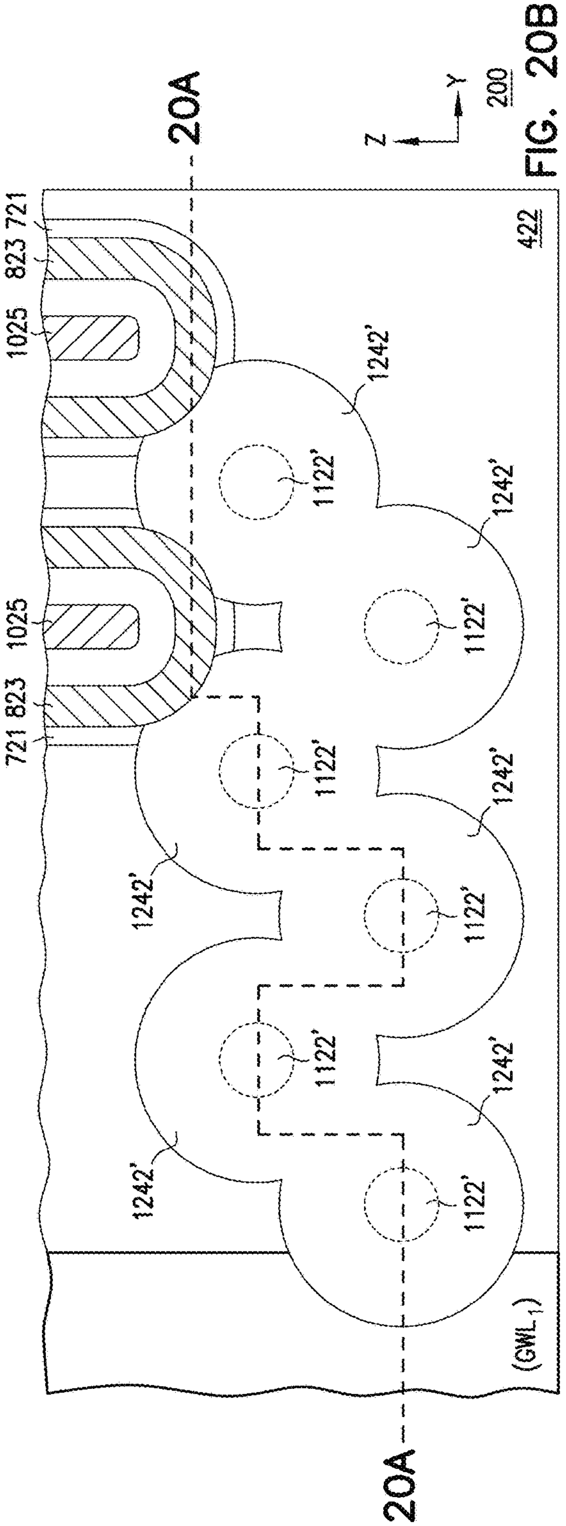
Figure 20A:
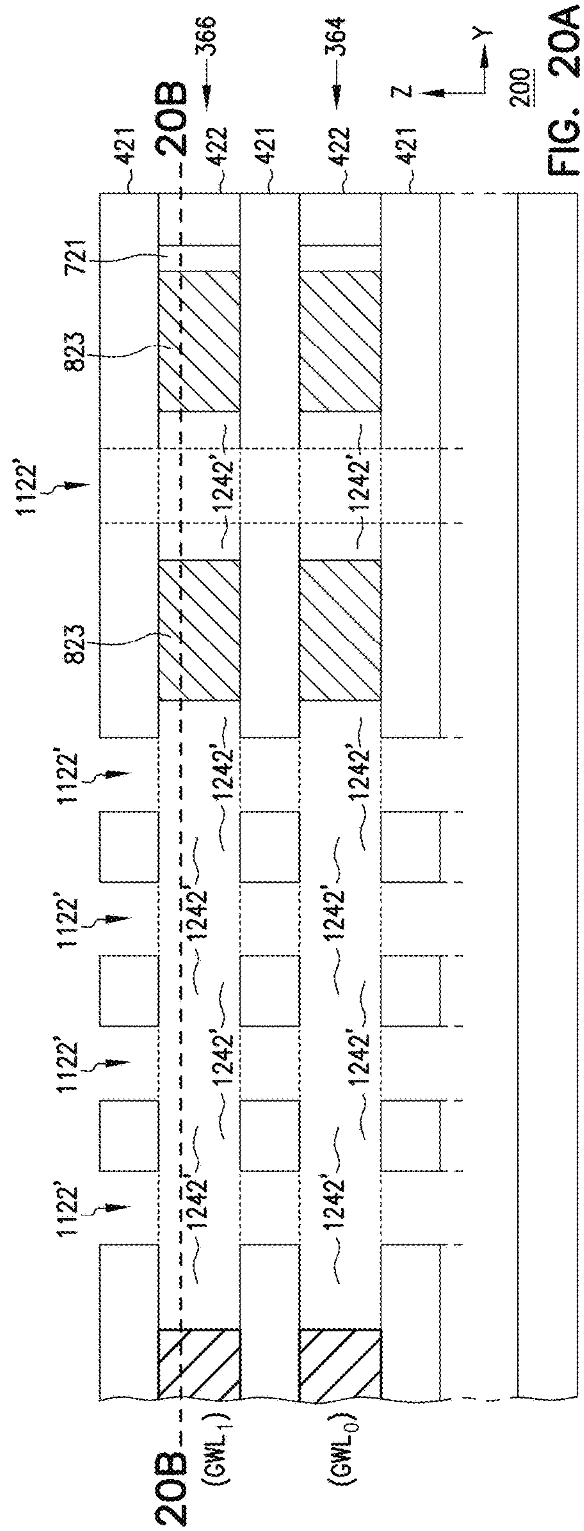

FIG. 20A and FIG. 20B show memory device 200 after recesses 1242' are formed in conductive materials 823 through openings 1122'. Forming recesses 1242' can be similar to (or the same as) forming recesses 1242' of FIG. 12A and FIG. 12B, and FIG. 16A and FIG. 16B. As shown in FIG. 20B, material 823 (channel regions Tch) of some (e.g., two) of transistors T can be exposed at some (e.g., two) of recesses 1242' on respective tier (e.g., levels 364 and 366) of memory device 200.

Figure 21B:
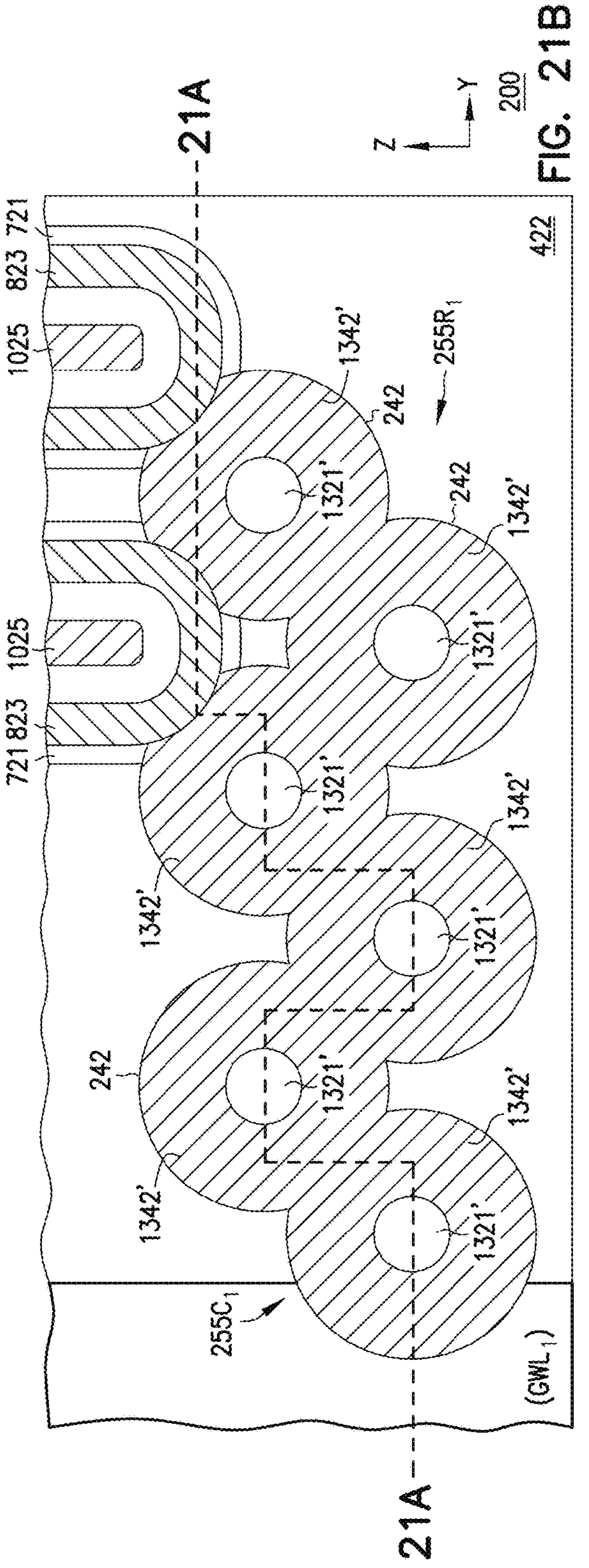
Figure 21A:
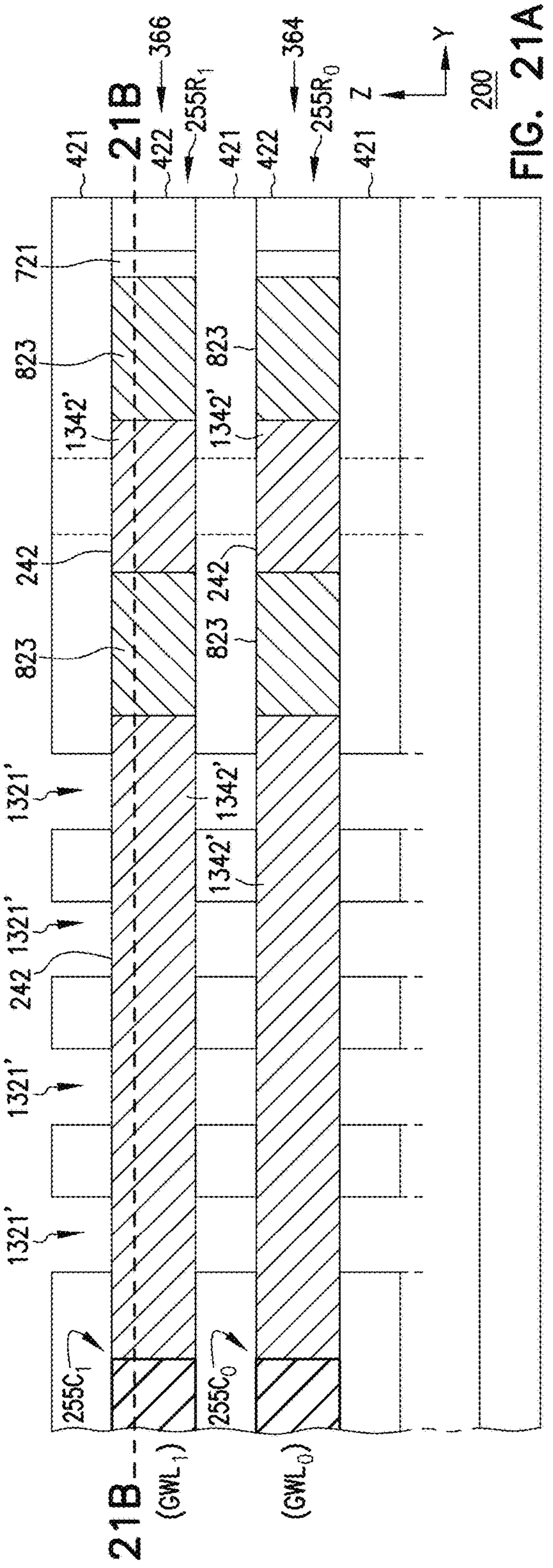

FIG. 21A and FIG. 21B show memory device 200 after conductive regions 255$R_1$ and 255$R_0$ are formed. Other conductive regions (e.g., conductive region 255$R_M$, not shown) are also formed concurrently with conductive regions 255$R_1$ and 255$R_0$. As shown in FIG. 21A and FIG. 21B, forming conductive regions 255$R_1$ and 255$R_0$ can include forming conductive joint 242 in recesses 1242' (labeled in FIG. 20A and FIG. 20B). Forming conductive joints 242 in FIG. 21A and FIG. 21B can be similar to (or the same as) forming conductive joints 242 of FIG. 13A and FIG. 13B, and FIG. 17A and FIG. 17B.

As shown in FIG. 21A and FIG. 21B, conductive material 1342' of conductive regions 250$R_1$ can contact both material 823 (channel regions Tch of respective transistors T) and conductive material 340$_1$ (at contact location 255$C_1$) of the control gate associated with signal $WL_1$. Similarly, on level 364, conductive material 1342' of conductive regions 255$R_0$ can contact both material 823 (channel regions Tch of respective transistors T) and conductive material 340$_0$ (at contact location 255$C_0$) of the control gate associated with signal $WL_0$.

The processes associated with FIG. 21A and FIG. 21B can also including forming an opening 1321' in conductive material 1342'.

Figure 22B:
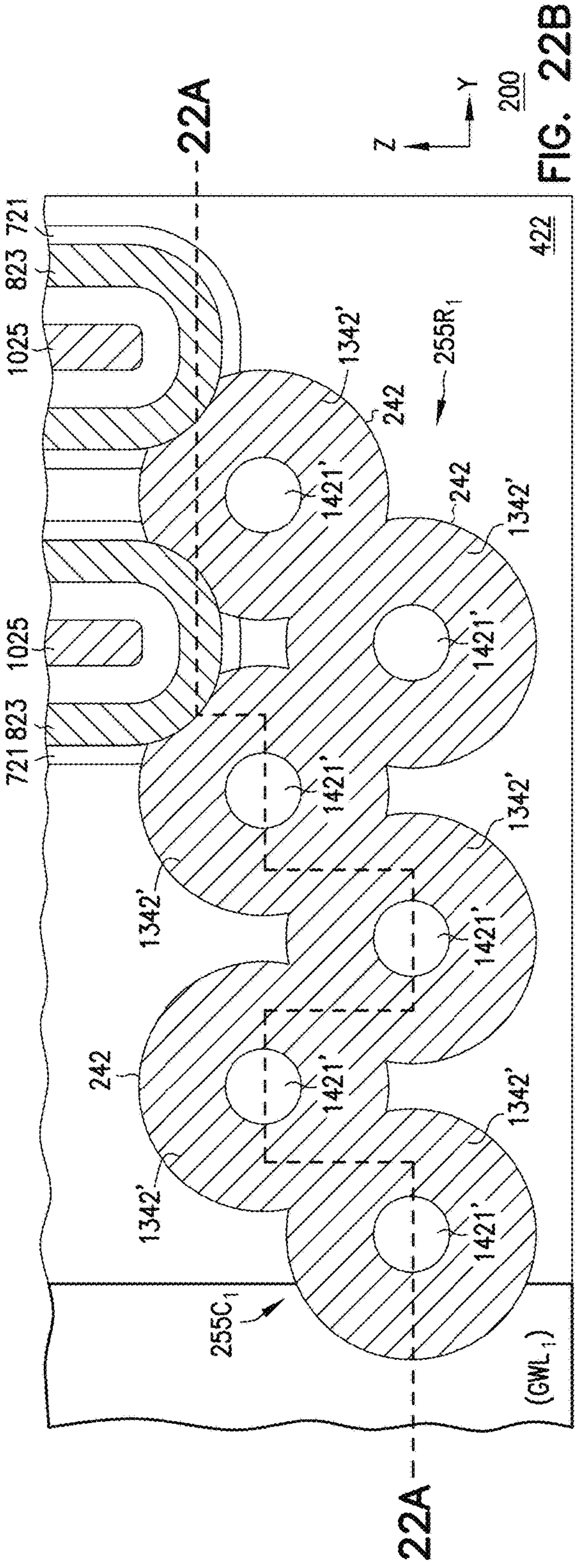
Figure 22A:
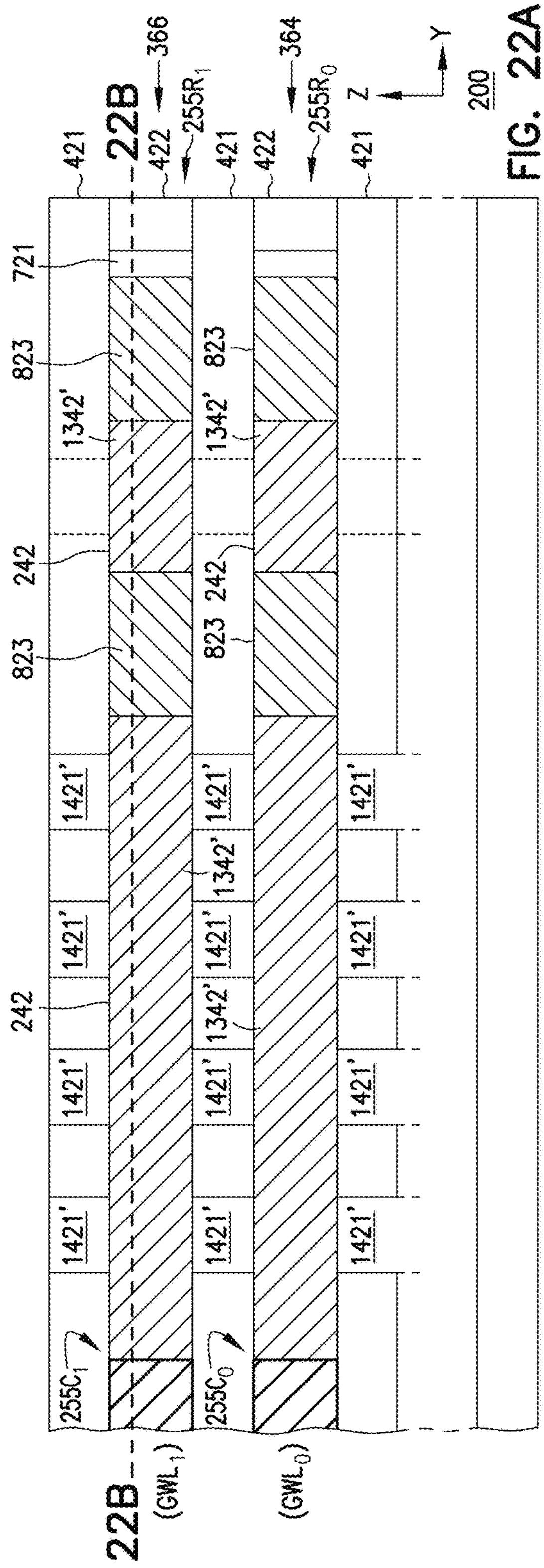

FIG. 22A and FIG. 22B show memory device 200 after a dielectric material 1421' (e.g., silicon dioxide) is formed (e.g., filled) in opening 1321'.

Some of the processes described above with reference to FIG. 4A through FIG. 22B may be performed in an order different from the order described above. One skilled in the art would readily recognizes that the processes of forming memory device 200 as described above with reference to FIG. 4A through FIG. 22B can include additional processes to complete memory device 200.

Figure 22C:
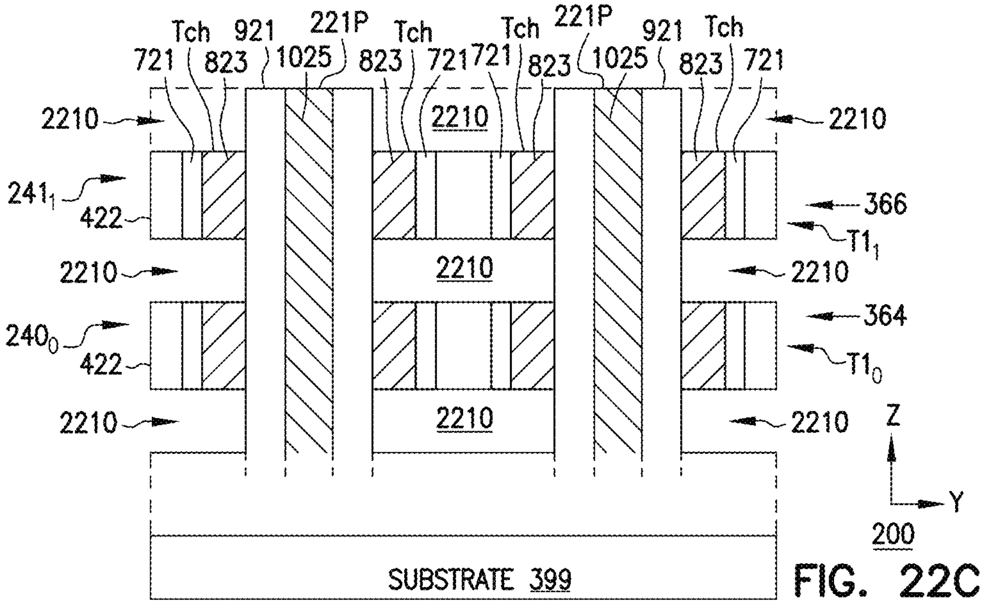

FIG. 22C shows memory device 200 including voids 2210 between adjacent tiers of memory device 200. Voids 2210 are empty spaces that can include air gaps. As described above with reference to FIG. 4A through FIG. 22B, dielectric materials 421 (e.g., FIG. 14A and FIG. 22A) are formed in driver circuit region 340 (FIG. 3A) between respective transistor groups (e.g., between tiers of transistor groups 240$_0$ through 240$_M$) of driver circuit 240. However, in an alternative structure of driver circuit 240 (and other driver circuits described herein) as shown in FIG. 22C, dielectric material 421 between tiers of transistor groups 240$_0$ through 240$_M$ can be omitted (e.g., removed), such that dielectric materials 421 are not included in the structure (e.g., the final structure) of driver circuit 240.

As shown in FIG. 22C, voids 2210 (instead of dielectric materials) can be formed at the locations of dielectric materials 421 (e.g., FIG. 14A). Thus, in the alternative structure shown in FIG. 22C, driver circuit 240 can include voids (e.g., air gaps) 2210 between adjacent tiers of the transistor groups of driver circuit 240. As an example, in FIG. 22C, a void 2210 can be formed between adjacent tiers in levels 364 and 366 where transistor group 240$_0$ and transistor group 240$_1$, respectively, are included in the adjacent tiers. In an example process, forming voids 2210 of memory device 200 in FIG. 22C can include removing dielectric materials 421 (e.g., in FIG. 14A, FIG. 18A, and FIG. 22A) to form voids 2210 at the locations where dielectric materials 421 were removed. Voids 2210 remain in the final structure of memory device 200.

Figure 22D:
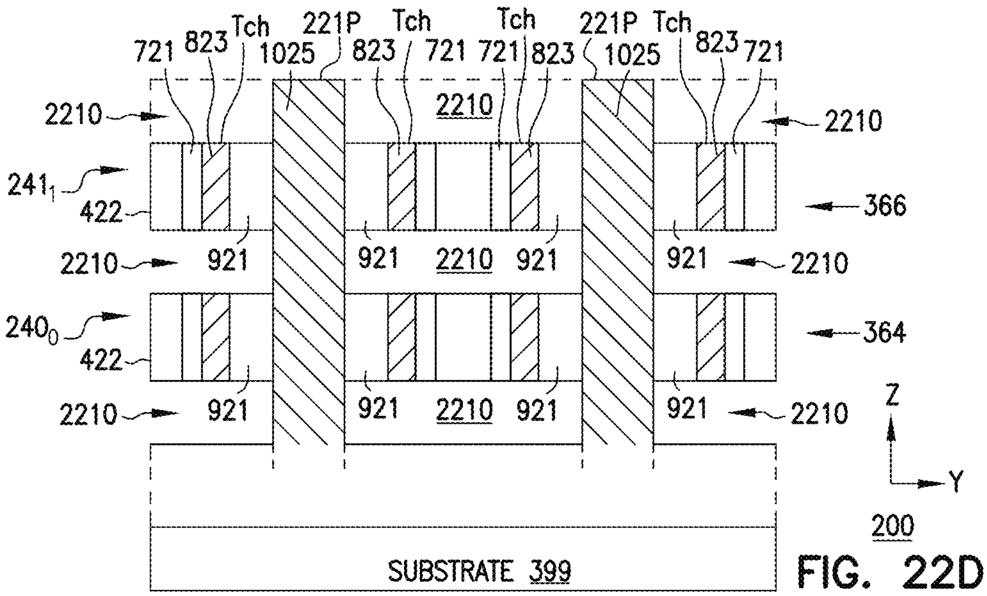

FIG. 22D shows a view of an alternative structure of memory device 200 including voids 2210 between adjacent tiers of memory device 200. Memory device 200 in FIG. 22D can be an alternative structure of memory device 200 of FIG. 10C. As shown in FIG. 10C, memory device 200 includes dielectric material 421 between adjacent tiers. In FIG. 22D, memory device 200 includes voids (e.g., air gaps) 2210 between adjacent tiers (instead of dielectric material 421). As an example, in FIG. 22D, a void 2210 can be formed between adjacent tiers in levels 364 and 366 where transistor group 240$_0$ and transistor group 240$_1$, respectively, are included in the adjacent tiers.

Including voids 2210 between adjacent tiers of the transistor groups of driver circuit, as described herein, can improve (e.g., strengthen) the gate-to-channel coupling more than adjacent channel-to-channel coupling.

In the description above with reference to FIG. 4A through FIG. 22D, driver circuit 240 includes one transistor group in a tier on one level (e.g., level 372 in FIG. 3F) of memory device 200. However, in other examples, driver circuit 240 can include multiple transistor groups in a tier.

Figure 23:
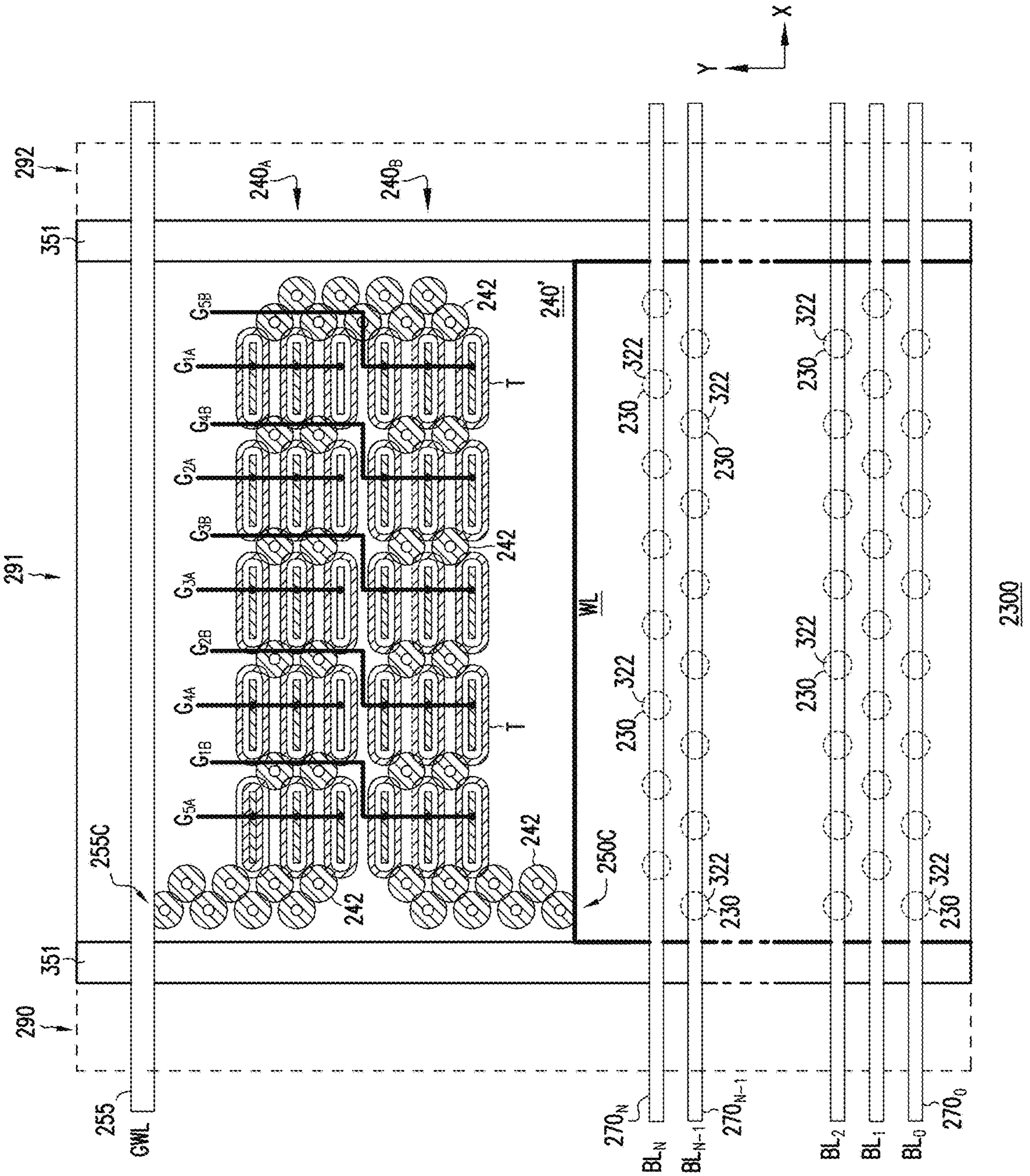
FIG. 23 shows a memory device having a driver circuit that includes two series-connected transistor groups on the same tier of the memory device, according to some embodiments described herein.

FIG. 23 shows memory device 2300 including a driver circuit 240' that can include two transistor groups 240$_A$ and 240$_B$ on the same tier, according to some embodiments described herein. FIG. 23 shows a top view of elements of one tier on one level of memory device 2300 (e.g., similar to level 372 of memory device 200 in FIG. 3C). Other tiers of memory device 2300 have similar elements (e.g., two transistor groups on each tier). As shown in FIG. 23, memory device 2300 can include elements and labels that are similar to (or the same as) those of memory device 200 (FIG. 2A through FIG. 22D). For simplicity, descriptions of such elements are not repeated.

As shown in FIG. 23, each of transistor groups 240$_A$ and 240$_B$ can include transistors T and conductive joints 242. Transistor groups 240$_A$ and 240$_B$ can be coupled in series with each other between access line (e.g., global access line) 255 associated with signal GWL and control gate (e.g., local word line) associated with signal WL. Current can flow from access line 255 (e.g., from contact location 255C) through transistor groups 240$_A$ then through transistor groups 240$_B$ before reaching the control gate associated with signal WL at contact location 250C.

Driver circuit 240' can include gates (e.g., five gates) associated with signals $G_{1A}$, $G_{2A}$, $G_{3A}$, $G_{4A}$, and $G_{5A}$ for transistor groups 240$_A$, and different gates (e.g., another five gates) associated with signals $G_{1B}$, $G_{2B}$, $G_{3B}$, $G_{4B}$, and $G_{5B}$ for transistor group $240_B$. Signals $G_{1A}$, $G_{2A}$, $G_{3A}$, $G_{4A}$, and $G_{5A}$ are different from signals $G_{1B}$, $G_{2B}$, $G_{3B}$, $G_{4B}$, and $G_{5B}$.

Figure 24:
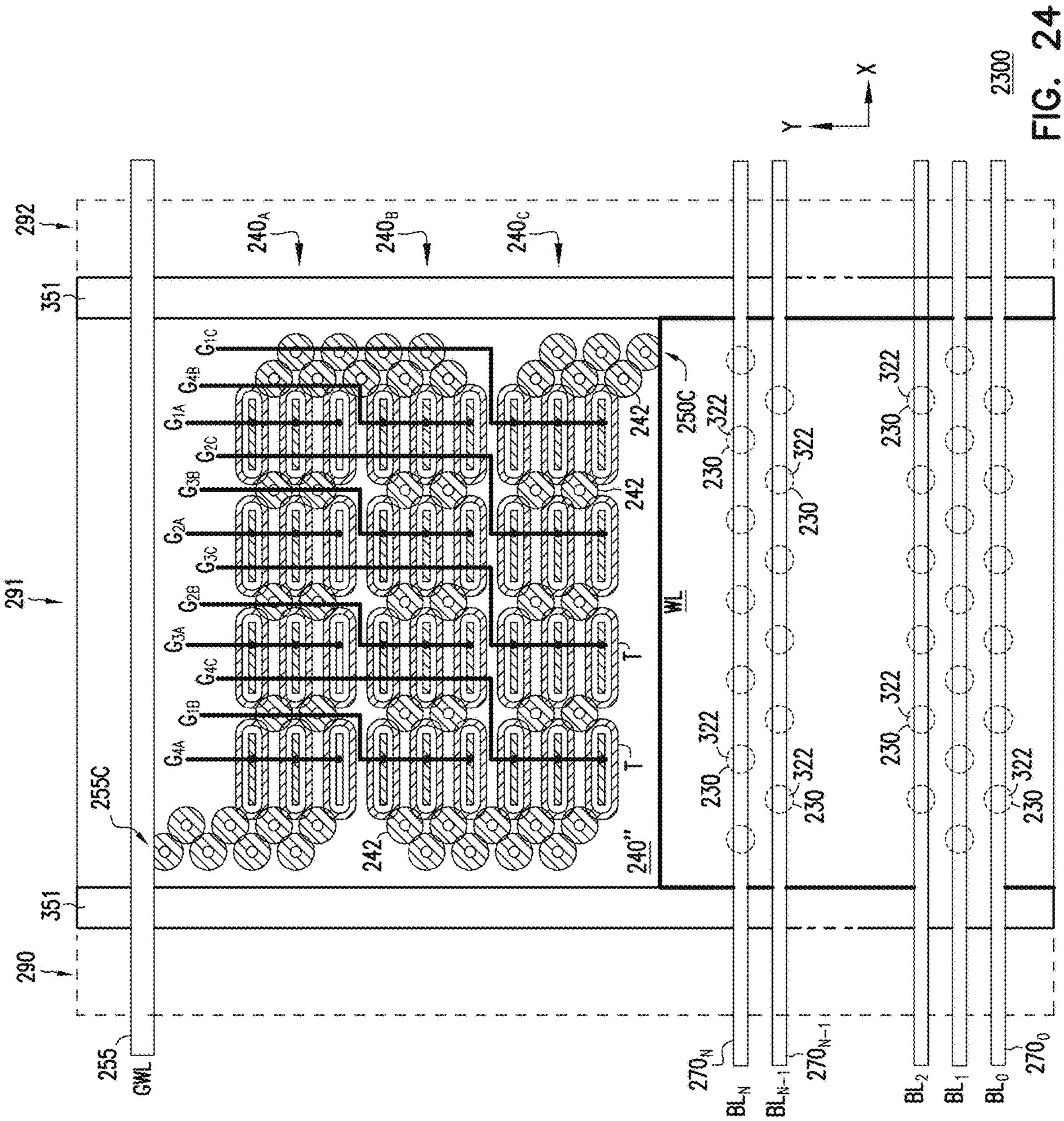
FIG. 24 shows a memory device having a driver circuit that includes three series-connected transistor groups on the same tier of the memory device, according to some embodiments described herein.

FIG. 24 shows memory device $240_0$ including a driver circuit 240" including three transistor groups $240_A$, $240_B$, and $240_C$ on the same tier, according to some embodiments described herein. FIG. 24 shows a top view of elements of one tier on one level of memory device 2400 (e.g., similar to level 372 of memory device 200 in FIG. 3C). Other tiers of memory device 2400 have similar elements. As shown in FIG. 24, memory device 2400 can include elements and labels that are similar to (or the same as) those of memory device 200 (FIG. 2A through FIG. 22D). For simplicity, descriptions of such elements are not repeated.

As shown in FIG. 24, each of transistor groups $240_A$, $240_B$, and $240_C$ can include transistors T and conductive joints 242. Transistor groups $240_A$, $240_B$, and $240_C$ can be coupled in series with each other between access line (e.g., global access line) 255 associated with signal GWL and control gate (e.g., local word line) associated with signal WL. Thus, current can flow from access line 255 (e.g., from contact location 255C) through transistor groups $240_A$, transistor groups $240_B$, then through transistor groups $240_C$ before reaching the control gate associated with signal WL at contact location 250C.

Driver circuit 240" can include gates (e.g., four gates) associated with signals $G_{1A}$, $G_{2A}$, $G_{3A}$, and $G_{4A}$ for transistor groups $240_A$, gates (e.g., another four gates) associated with signals $G_{1B}$, $G_{2B}$, $G_{3B}$ and $G_{4B}$ for transistor group $240_B$, and gates (e.g., another four gates) associated with signals $G_{1C}$ $G_{2C}$, $G_{3C}$, and $G_{4C}$ for transistor group $240_C$. The signals associated with the gates for a transistor group are different from the signals associated the gates for another transistor group.

Figure 25:
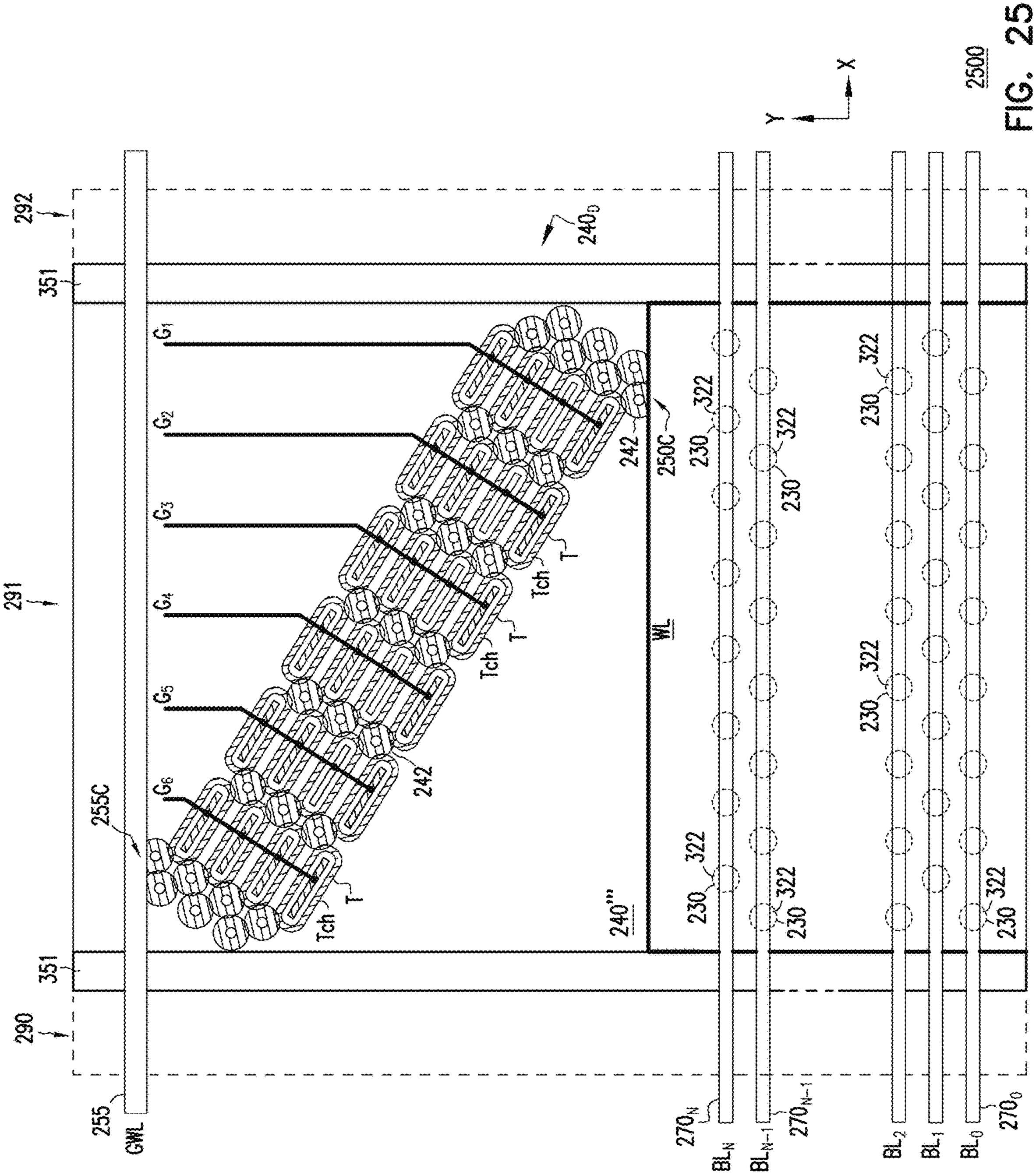
FIG. 25 shows a memory device having a driver circuit that includes transistors connected in a diagonal direction, according to some embodiments described herein.

FIG. 25 shows memory device 2500 including a driver circuit 240"' having transistors T coupled in series in a diagonal direction with respect to the X-direction (e.g., direction of the width of the block of memory device 2500), according to some embodiments described herein. FIG. 25 shows a top view of elements of one tier on one level of memory device 2500 (e.g., similar to level 372 of memory device 200 in FIG. 3C). Other tiers of memory device 2500 have similar elements. As shown in FIG. 25, memory device 2500 can include elements and labels that are similar to (or the same as) those of memory device 200 (FIG. 2A through FIG. 22D). For simplicity, descriptions of such elements are not repeated.

As shown in FIG. 25, transistors T and conductive joints 242 are included in a transistor group $240_D$ on one tier of memory device 2500. Transistor group $240_D$ is similar to one of transistor groups (e.g., transistor group $240_M$ in FIG. 3C) of driver circuit 240 except for the orientations (e.g., diagonal direction) of transistors T of transistor group $240_0$. As shown in FIG. 3C, each channel region Tch can have its length (labeled as 823X in FIG. 8B) in parallel to the width (in the X direction) of block 291. In FIG. 25, each channel region Tch can have its length not in parallel to the width of block 291 but at an angle relative to the width (e.g., to the edge in the X-direction) of the control gate (associated with signal WL). Thus, as shown in FIG. 25, transistors T can form a circuit path (e.g., current path) between the control gate and access line 255 through channel regions Tch of transistors T. Since channel regions Tch of transistors T are orientated in a diagonal direction with respect to the width direction of block 291, the circuit path channel regions Tch of transistors T is also extending in a diagonal direction with respect to the width direction of block 291.

The gates associated with signals $G_1$, $G_2$, $G_3$, $G_4$, and $G_5$ in FIG. 25 can be applied with voltages similar to those of FIG. 2F.

Driver circuits 240', 240", and 240'" (FIG. 23, FIG. 24, and FIG. 25, respectively) can have improvements and benefits similar to those of driver circuit 240 (FIG. 2A through FIG. 22D). Besides driver circuit 240, driver circuits 240', 240", and 240'" allow additional options for a driver circuit such as driver circuits 240', 240", or 240'" to be included in memory device (e.g., memory device 2300, 2400, or 2500) based on the dimension of the blocks of the memory device. For example, as described above, the circuit path between an access line (e.g., global word line) and a control gate (e.g., a local word line) through transistors T of driver circuit 240 can be formed with a selected dimension (e.g., a predetermined length) to allow driver circuit 240 to appropriately drive the control gate of memory device 200. In comparison with memory device 200, if a width (in the X-direction) of the block of a memory device (e.g., device 2300, 2400, or 2500) is relatively less than the width of the block of memory device 200, then the memory device may include driver circuit 240', 240", or 240'" instead of driver circuit 240. This allows driver circuit 240', 240", or 240'" to maintain the effective dimension (e.g., effective length) of the circuit path between an access line and a control gate (through transistors T of driver circuit 240', 240", or 240'") to be similar to (or the same as) that of driver circuit 240. This enables the operation (e.g., the capability to drive current) of driver circuit 240', 240", or 240'" to be similar to or the same as that of driver circuit 240.

FIG. 26 and FIG. 27 show different example voltages that can be applied to signals on respective driver gates of memory device 2300 (FIG. 23) and memory device 2400 (FIG. 24), respectively. Memory device 2300 (FIG. 23) can include a voltage generator like voltage generator 320 of FIG. 3F to generate the voltages shown in FIG. 26. Memory device 2400 (FIG. 24) can include a voltage generator like voltage generator 320 of FIG. 3F to generate the voltages shown in FIG. 27.

As shown in FIG. 26, in a selected block, signals $G_{1A}$, $G_{2A}$, $G_{3A}$, $G_{4A}$, and $G_{5A}$ can be applied with voltages $V3_{1A}$, $V3_{2A}$, $V3_{3A}$, $V3_{4A}$, and $V3_{5A}$, respectively. Signals $G_{1B}$, $G_{2B}$, $G_{3B}$, $G_{4B}$, and $G_{5B}$ can be applied with voltages $V3_{1B}$, $V3_{2B}$, $V3_{3B}$, $V3_{4B}$, and $V3_{5B}$, respectively. Voltages $V3_{1A}$, $V3_{2A}$, $V3_{3A}$, $V3_{4A}$, and $V3_{5A}$ and voltages $V3_{1B}$, $V3_{2B}$, $V3_{3B}$, $V3_{4B}$, and $V3_{5B}$ can have the same value. For example, $V3_{1A}=V3_{2A}=V3_{3A}=V3_{4A}=V3_{5A}=V3_{1B}=V3_{2B}=V3_{3B}=V3_{4B}=$ and $V3_{5B}$.

In an unselected block, signals $G_{1A}$, $G_{2A}$, $G_{3A}$, $G_{4A}$, and $G_{5A}$ can be applied with voltages $V4_{1A}$, $V4_{2A}$, $V4_{3A}$, $V4_{4A}$, and $V4_{5A}$, respectively. Signals $G_{1B}$, $G_{2B}$, $G_{3B}$, $G_{4B}$, and $G_{5B}$ can be applied with voltages $V4_{1B}$, $V4_{2B}$, $V4_{3B}$, $V4_{4B}$, and $V4_{5B}$, respectively. Voltages $V4_{1A}$, $V4_{2A}$, $V4_{3A}$, $V4_{4A}$, and $V4_{5A}$ and voltages $V4_{1B}$, $V4_{2B}$, $V4_{3B}$, $V4_{4B}$, and $V4_{5B}$ can have different values among each other. The driver circuit of memory device 2300 can be configured to provide a graded biasing technique, such that the values of the voltages shown in FIG. 26 can be graded (e.g., gradually change from one voltage to the next). For example, $V4_{5A}>V4_{4A}>V4_{3A}>V4_{2A}>V4_{1A}>V4_{5B}>V4_{4B}>V4_{3B}>V4_{2B}>V4_{1B}$.

As shown in FIG. 27, in a selected block, signals $G_{1A}$, $G_{2A}$, $G_{3A}$, and $G_{4A}$ can be applied with voltages $V5_{1A}$, $V5_{2A}$, $V5_{3A}$, and $V5_{4A}$, respectively. Signals $G_{1B}$, $G_{2B}$, $G_{3B}$, and $G_{4B}$ can be applied with voltages $V5_{1B}$, $V5_{2B}$, $V5_{3B}$, and $V5_{4B}$, respectively. Signals $G_{1C}$ $G_{2C}$, $G_{3C}$, and $G_{4C}$ can be applied with voltages $V5_{1C}$, $V5_{2C}$, $V5_{3C}$, and $V5_{4C}$, respectively. Voltages $V5_{1A}$, $V5_{2A}$, $V5_{3A}$, and $V5_{4A}$, voltages $V5_{1B}$, $V5_{2B}$, $V5_{3B}$, and $V5_{4B}$, and voltages $V5_{1C}$, $V5_{2C}$, $V5_{3C}$, and $V5_{4C}$ can have the same value. For example, $V5_{1A}=V5_{2A}=V5_{3A}=V5_{4A}=V5_{1B}=V5_{2B}=V5_{3B}=V5_{4B}=V5_{1C}=V5_{2C}=V5_{3C}=V5_{4C}$.

In an unselected block, signals $G_{1A}$, $G_{2A}$, $G_{3A}$, and $G_{4A}$ can be applied with voltages $V6_{1A}$, $V6_{2A}$, $V6_{3A}$, and $V6_{4A}$, respectively. Signals $G_{1B}$, $G_{2B}$, $G_{3B}$, and $G_{4B}$ can be applied with voltages $V6_{1B}$, $V6_{2B}$, $V6_{3B}$, and $V6_{4B}$, respectively. Signals $G_{1C}$, $G_{2C}$, $G_{3C}$, and $G_{4C}$ can be applied with voltages $V6_{1C}$, $V6_{2C}$, $V6_{3C}$, and $V6_{4C}$, respectively. Voltages $V5_{1A}$, $V5_{2A}$, $V5_{3A}$, and $V5_{4A}$, voltages $V5_{1B}$, $V5_{2B}$, $V5_{3B}$, and $V5_{4B}$, and voltages $V5_{1C}$, $V5_{2C}$, $V5_{3C}$, and $V5_{4C}$ can have different values among each other. The driver circuit of memory device 2400 can be configured to provide a graded biasing technique, such that the values of the voltages shown in FIG. 27 can be graded (e.g., gradually change from one voltage to the next). For example, $V4_{4A}>V4_{3A}>V4_{2A}>V4_{1A}>V4_{4B}>V4_{3B}>V4_{2B}>V4_{1B}>V4_{4C}>V4_{3C}>V4_{2C}>V4_{1C}$).

Figure 28:
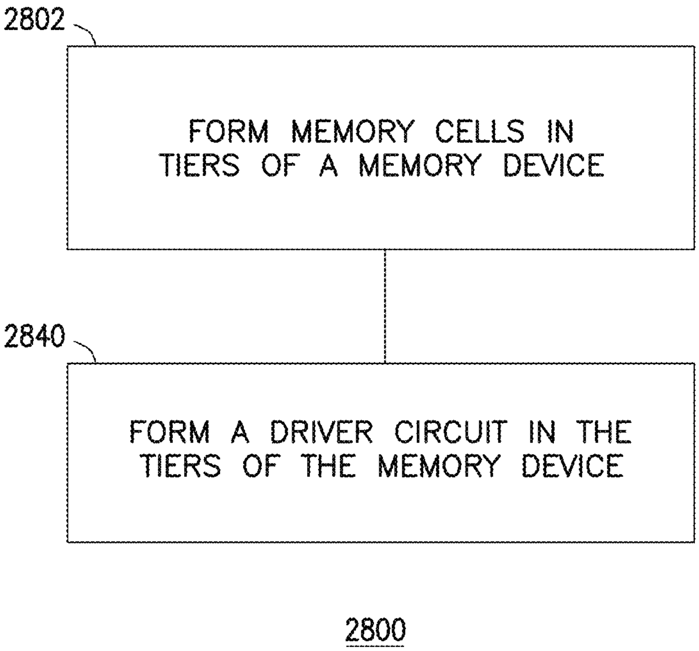
FIG. 28 is a flow chart showing a method of forming a memory device, according to some embodiments described herein.

FIG. 28 is a flow chart showing a method 2800 of forming a memory device, according to some embodiments described herein. Method 2800 includes the processes of forming memory device 200 described above with reference to FIG. 4A through FIG. 22D. Method 2800 also includes additional processes of forming memory device 200 as described below.

As shown in FIG. 28, method 2800 can include processes 2802 that can include forming memory cells 202 (FIG. 3F) in tiers (e.g., tiers associated with levels 364 and 366 in FIG. 3F) of memory device 200. Memory cells 202 can be formed at memory cell region 302 (FIG. 3A). Forming memory cells 202 can include forming memory cell pillars 322 (FIG. 3F) for memory cells 202. Memory cell pillars 322 can be formed at memory cell region 302 (FIG. 3A).

Method 2800 can include processes 2840 that can include forming driver circuit 240 in the tiers of memory device 200. Driver circuit 240 can be formed at driver circuit region 340 (FIG. 3A). Part of processes 2840 include the processes described above with reference to FIG. 4A through FIG. 22D for forming driver circuit 240. Thus, such processes of forming driver circuit 240 are not repeated.

FIG. 4A through FIG. 22B show dielectric materials 421 and 422. Dielectric materials 421 and 422 formed in the process associated with FIG. 4A and FIG. 4B can be formed (e.g., formed at the same time) in both memory cell region 302 (FIG. 3A) and driver circuit region 340 (FIG. 3A).

In FIG. 28, forming memory cell pillars 322 in processes 2802 can include forming openings (e.g., holes) through dielectric materials 421 and 422 at memory cell region 302 (FIG. 3A).

Some portions (e.g., process steps) of processes 2802 and 2840 of method 2800 (including the processes described above with reference to FIG. 4A through FIG. 22B) can be performed concurrently (e.g., simultaneously, in the same process step) or alternatively performed at different times (e.g., in different process steps). For example, openings 522 in FIG. 5A can be formed concurrently (e.g., simultaneously, in the same process step) with the openings for memory cell pillars in process 2802 of FIG. 28. Alternatively, openings 522 in FIG. 5A and the openings for memory cell pillars in process 2802 of FIG. 28 can be formed at different times (e.g., in different process steps). For example, openings 522 of FIG. 5A can be formed after or alternatively before the openings for memory cell pillars in process 2802 of FIG. 28 are formed.

In another example, opening 1122 (and other openings like opening 1122) in FIG. 11A can be formed concurrently (e.g., simultaneously, in the same process step) with the openings for memory cell pillars in process 2802 of FIG. 28. Alternatively, opening 1122 (and other openings like opening 1122) in FIG. 11A and the openings for memory cell pillars in process 2802 of FIG. 28 can be formed at different times (e.g., in different process steps). For example, openings 1122 (and other openings like opening 1122) in FIG. 11A can be formed after or alternatively before the openings for memory cell pillars in process 2802 of FIG. 28 are formed.

In another example, openings 1122' in FIG. 15A and FIG. 19A can be formed concurrently (e.g., simultaneously, in the same process step) with the openings for memory cell pillars in process 2802 of FIG. 28. Alternatively, openings 1122' in FIG. 15A and FIG. 19A and the openings for memory cell pillars in process 2802 of FIG. 28 can be formed at different times (e.g., in different process steps). For example, openings 1122' in FIG. 15A and FIG. 19A can be formed after or alternatively before the openings for memory cell pillars in process 2802 of FIG. 28 are formed.

The illustrations of apparatuses (e.g., memory devices 100, 200, 2300, 2400, and 2500 including the driver circuits described above) and methods (e.g., methods of forming memory devices 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 2300, 2400, and 2500) or a system (e.g., an electronic item that can include any of memory devices 100, 200, and 200').

Any of the components described above with reference to FIG. 1 through FIG. 28 can be implemented in a number of ways, including simulation via software. Thus, apparatuses (e.g., memory devices 100, 200, 2300, 2400, and 2500), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 2300, 2400, and 2500) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 28 include apparatuses and methods of forming the apparatuses. One of such apparatuses includes tiers located one over another, each of the tiers including memory cells and a control gate for the memory cells, each of the tiers including first transistors connected in series between the control gate in a respective tier and a conductive line, and second transistors connected in series between the control gate in the respective tier and the conductive line, the second transistors connected in parallel with the first transistors between the control gate and the conductive line, conductive joints coupled to channel regions of the first and second transistors, and gates for the first transistors and second transistors, each of the gates shared by one of the first transistors and one of the second transistors. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

tiers located one over another, each of the tiers including memory cells and a control gate for the memory cells, each of the tiers including:

first transistors connected in series between the control gate in a respective tier and a conductive line; and second transistors connected in series between the control gate in the respective tier and the conductive line, the second transistors connected in parallel with the first transistors between the control gate and the conductive line; and conductive joints coupled to channel regions of the first and second transistors; and gates for the first transistors and second transistors, each of the gates shared by one of the first transistors and one of the second transistors.

2. The apparatus of claim 1, wherein the gates include respective pillars extending from one tier to another.

3. The apparatus of claim 2, wherein the pillars include first pillars and second pillars, and wherein:

the first pillars include respective portions surrounded by channel regions of respective transistors of the first transistors; and the second pillars include respective portions surrounded by channel regions of respective transistors of the second transistors.

4. The apparatus of claim 3, wherein each of the tiers includes a dielectric material, and the channel regions are formed in recesses of the dielectric material.

5. An apparatus comprising:

a first level including first memory cells, a first control gate for the first memory cells, and a first dielectric material;

a second level including second memory cells, a second control gate for the second memory cells, and a second dielectric material;

a first transistor including a first channel region located on the first level and separated from the first dielectric material by a first dielectric liner, the first transistor coupled between a first conductive region and a second conductive region, the first conductive region located on the first level and coupled to the first control gate;

a second transistor including a second channel region located on the second level and separated from the second dielectric material by a second dielectric liner, the second transistor coupled between a third conductive region and a fourth conductive region, the third conductive region located on the second level and coupled to the second control gate; and a gate shared by the first and second transistors.

6. The apparatus of claim 5, wherein the gate includes a pillar going through the first and second channel regions and separated from the first and second channel regions by a third dielectric material.

7. The apparatus of claim 5, further comprising;

a third transistor including a third channel region located on the first level and coupled in series with the first transistor between the first and second conductive regions; and a fourth transistor including a fourth channel region located on the second level and coupled in series with the second transistor between the third and fourth conductive regions.

8. The apparatus of claim 7, further comprising;

a first conductive joint located on the first level between the first and third channel regions and coupled to the first and third channel regions; and a second conductive joint located on the second level between the second and fourth channel regions and coupled to the second and fourth channel regions.

9. The apparatus of claim 5, wherein each of the first and second channel regions includes a first side having a greater dimension than a second side.

10. The apparatus of claim 5, further comprising;

a third transistor located on the first level and coupled in parallel with the first transistor between the first and second conductive regions; and a fourth transistor located on the second level and coupled in parallel with the second transistor between the third and fourth conductive regions.

11. The apparatus of claim 5, further comprising;

a third transistor including a third channel region located on the first level and coupled in series with the first transistor between the first and second conductive regions;

a fourth transistor including a fourth channel region located on the first level;

a fifth transistor including a fifth channel region located on the first level and coupled in series with the fourth transistor between the first and second conductive regions; and a first conductive joint located on the first level and coupled to the first, third, fourth, and fifth channel regions.

12. The apparatus of claim 5, wherein:

the first and second memory cells are included in a memory cell block among memory cell blocks of the apparatus, the memory cell block including a width in a direction from one memory cell block to another memory cell block; and each of the first and second channel regions includes a length in a direction parallel to the width of the memory cell block.

13. The apparatus of claim 5, wherein:

the first and second memory cells are included in a memory cell block among memory cell blocks of the apparatus, the memory cell block including a width in a direction from one memory cell block to another memory cell block; and each of the first and second channel regions includes a length in a direction diagonal to the width of the memory cell block.

14. An apparatus comprising:

a first level including first memory cells, a first control gate for the first memory cells, and a first dielectric material;

a second level including second memory cells, a second control gate for the second memory cells, and a second dielectric material;

first regions formed in the first level, each of the first regions including a first material separated from the first dielectric material by a first dielectric liner, the first material of each of the first regions surrounding a first conductive material and separated from the first conductive material by a first additional dielectric material;

first additional regions formed in the first level, each of the first additional regions including a first additional material contacting the first material of adjacent regions among the first regions, the first additional material of at least one of the first additional regions contacting the first control gate;

second regions formed in the second level, each of the second regions including a second material separated from the second dielectric material by a second dielectric liner, the second material of each of the second regions surrounding a second conductive material and separated from the second conductive material by a second additional dielectric material; and second additional regions formed in the second level, each of the second additional regions including a second additional material contacting the second material of adjacent regions among the second regions, the second additional material of at least one of the second additional regions contacting the second control gate.

15. The apparatus of claim 14, wherein the first conductive material and the second conductive material are part of a pillar extending in a direction from the first level to the second level.

16. The apparatus of claim 14, wherein the first material and the second material include polysilicon.

17. The apparatus of claim 14, wherein the first additional material and the second additional material include polysilicon.

18. The apparatus of claim 14, wherein the first dielectric material and the second dielectric material include silicon nitride.

19. The apparatus of claim 14, wherein the first dielectric liner and the second dielectric liner include silicon dioxide.

20. The apparatus of claim 14, wherein the first additional dielectric material and the second additional dielectric material include silicon dioxide.

21. The apparatus of claim 14, wherein the first additional dielectric material and the second additional dielectric material include aluminum oxide.

22. The apparatus of claim 14, wherein a level between the first level and the second level includes a dielectric material.

23. The apparatus of claim 14, wherein a level between the first level and the second level includes a void.

24. An apparatus comprising:

first memory cells located on a first tier among tiers of a memory device;

a first word line for the first memory cells, the first word line located on the first tier;

second memory cells located on a second tier among the tiers of the memory device;

a second word line for the second memory cells, the second word line located on the second tier;

a word line driver including:

first transistors located on the first tier, a first portion of the first transistors including transistors coupled in series with each other and coupled to the first word line, a second portion of the first transistors including transistors coupled in series with each other and coupled to the first word line, the transistors of the first portion of the first transistors and the transistors of the second portion of the first transistors coupled in parallel with each other;

second transistors located on the second tier, a first portion of the second transistors including transistors coupled in series with each other and coupled to the second word line, a second portion of the second transistors including transistors coupled in series with each other and coupled to the second word line, the transistors of the first portion of the second transistors and the transistors of the second portion of the second transistors coupled in parallel with each other; and gates for the first transistors and the second transistors, each of the gates shared by a transistor of the first portion of the first transistors, a transistor of the second portion of the first transistors, a transistor of the first portion of the second transistors, and a transistor of the second portion of the second transistors.

25. The apparatus of claim 24, wherein:

the transistors of the first portion of the first transistors and the transistors of the second portion of the first transistors are coupled between a first conductive region and a second conductive region;

the first conductive region is coupled to the first word line; and the second conductive region is coupled to a conductive line.

26. The apparatus of claim 24, wherein:

the transistors of the first portion of the first transistors and the transistors of the second portion of the first transistors are coupled between a first conductive region and a second conductive region, and the first conductive region is coupled to the first word line;

the first conductive region is coupled to the word line; and a third portion of the first transistors include transistors coupled in series with each other and coupled between a second conductive region and a third conductive region.

27. The apparatus of claim 26, wherein the third conductive region is coupled to a global word line.

28. The apparatus of claim 24, further comprising a voltage to generate voltages for the gates, where the voltages have different values.

29. A method comprising:

forming first transistors on a first tier of a memory device, the first tier including a first material for a first control gate for first memory cells on the first tier, wherein forming the first transistors includes forming first liners in respective first recesses in a first dielectric material in the first tier, and forming first channel regions of the first transistors in the first recesses and separated from the first dielectric material by respective first liners in the first recesses;

forming second transistors on a second tier of a memory device, the second tier including a second material for a second control gate for second memory cells on the second tier, wherein forming the second transistors includes forming second liners in respective second recesses in a second dielectric material in the second tier, and forming second channel regions of the second transistors in the second recesses and separated from the second dielectric material by respective second liners in the second recesses;

forming first conductive joints contacting adjacent channel regions of the first channel regions;

forming second conductive joints contacting adjacent channel regions of the second channel regions; and forming gates for the first transistors and the second transistors, wherein the gates extend through respective first channel regions and respective second channel regions.

30. The method of claim 29, further comprising:

forming levels of first dielectric material and levels of second dielectric material interleaved with the levels of first dielectric material, wherein the first dielectric material in the first tier is included in one of the levels of first dielectric material, and the second dielectric material in the second tier is included in one of the levels of second dielectric material;

forming openings through the levels of first dielectric material and levels of second dielectric material; and removing portions of the levels of second dielectric material exposed at the openings to form the first recesses and the second recesses.

31. The method of claim 30, further comprising:

forming additional openings through the levels of first dielectric material and levels of second dielectric material at locations between the first channel regions and between the second channel regions;

removing portions of the levels of second dielectric material exposed at the additional openings to form the additional recesses in the levels of second dielectric material; and forming the first and second conductive joints in the additional recesses.

32. The method of claim 31, wherein the additional openings are formed concurrently with the openings.

33. The method of claim 31, wherein the openings and the additional openings are formed at different times.

34. The method of claim 30, further comprising:

forming additional openings through the levels of first dielectric material and levels of second dielectric material; and forming memory cell pillars in the additional openings, wherein the openings are formed concurrently with the additional openings.

35. The method of claim 30, further comprising:

forming first additional openings through the levels of first dielectric material and the levels of second dielectric material at locations between the first channel regions and between the second channel regions;

removing portions of the levels of second dielectric material exposed at the additional openings to form the additional recesses in the levels of second dielectric material;

forming the first and second conductive joints in the additional recesses, forming second additional openings through the levels of first dielectric material and levels of second dielectric material; and forming memory cell pillars in the second additional openings, wherein the openings and the first additional openings are formed concurrently with the second additional openings.

* * * * *